(12) United States Patent
Koyama et al.

(10) Patent No.: US 6,753,854 B1
(45) Date of Patent: Jun. 22, 2004

(54) DISPLAY DEVICE

(75) Inventors: Jun Koyama, Kanagawa (JP); Keisuke Hayashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/558,054

(22) Filed: Apr. 26, 2000

(30) Foreign Application Priority Data

Apr. 28, 1999 (JP) .......................................... 11-121146

(51) Int. Cl.$^7$ .............................................. G09G 5/00
(52) U.S. Cl. .......................... 345/204; 345/87; 345/88; 345/89; 345/90; 345/92; 345/106; 345/205; 345/600; 345/690
(58) Field of Search ............................. 345/87, 88, 89, 345/90, 92, 160, 204, 205, 600, 690

(56) References Cited

U.S. PATENT DOCUMENTS

| | | | | |
|---|---|---|---|---|
| 3,675,232 A | * | 7/1972 | Strout ........................ | 345/531 |
| 3,792,919 A | | 2/1974 | Holmes et al. ............... | 352/72 |
| 5,122,784 A | * | 6/1992 | Canova ....................... | 345/605 |
| 5,122,792 A | * | 6/1992 | Stewart ....................... | 345/213 |
| 5,247,190 A | | 9/1993 | Friend et al. ................. | 257/40 |
| 5,272,471 A | * | 12/1993 | Asada et al. ................ | 345/605 |
| 5,337,171 A | | 8/1994 | Mase et al. ................... | 349/74 |
| 5,363,118 A | | 11/1994 | Okumura ..................... | 345/95 |
| 5,399,502 A | | 3/1995 | Friend et al. ................. | 437/1 |
| 5,414,442 A | | 5/1995 | Yamazaki et al. | |
| 5,455,489 A | | 10/1995 | Bhargava ................. | 315/169.4 |
| 5,583,530 A | | 12/1996 | Mano et al. ................... | 345/89 |
| 5,594,569 A | | 1/1997 | Konuma et al. ............ | 349/122 |
| 5,610,741 A | | 3/1997 | Kimura ..................... | 349/113 |
| 5,643,826 A | | 7/1997 | Ohtani et al. ................ | 437/88 |
| 5,648,277 A | | 7/1997 | Zhang et al. ................ | 437/21 |
| 5,673,061 A | | 9/1997 | Okada et al. ................ | 345/89 |

(List continued on next page.)

FOREIGN PATENT DOCUMENTS

| | | |
|---|---|---|
| JP | 7-130652 | 5/1995 |
| JP | 10-092576 | 4/1998 |
| JP | 140-312173 | 11/1998 |
| WO | WO 90/13148 | 11/1990 |

OTHER PUBLICATIONS

English abstract re Japanese Patent Application No. JP 10–214060, published Aug. 11, 1998.
English abstract re Japanese Patent Application No. JP 10–232649, published Set. 2, 1998.

(List continued on next page.)

*Primary Examiner*—Bipin Shalwala
*Assistant Examiner*—Vincent E. Kovalick
(74) *Attorney, Agent, or Firm*—Cook, Alex, McFarron, Manzo, Cummings & Mehler, Ltd.

(57) ABSTRACT

A liquid crystal display device having a digital driver is provided, which can realize higher definition and more gradations. A liquid crystal display device having a pixel region in which a plural number of pixel TFTs are arranged in a matrix shape, a source driver and a gate driver for driving the plural number of TFTs, and a circuit for converting externally inputted m-bit digital video data into $2^{m-n}$ pieces of n-bit digital video data (where m and n are both positive integers greater than or equal to 2, and m>n), and for supplying the n-bit digital video data to the source driver, is provided. The liquid crystal display device is characterized in that the $2^{m-n}$ pieces of n-bit digital data is outputted randomly, and in that a one-frame image is formed by displaying $2^{m-n}$ subframes formed by the n-bit digital data.

36 Claims, 41 Drawing Sheets

U.S. PATENT DOCUMENTS

| | | | |
|---|---|---|---|
| 5,677,704 A | 10/1997 | Kusano et al. | 345/89 |
| 5,712,651 A | 1/1998 | Tomiyasu | 345/88 |
| 5,724,058 A * | 3/1998 | Choi et al. | 345/690 |
| 5,761,485 A | 6/1998 | Munyan | 395/500 |
| 5,784,040 A | 7/1998 | Kobayashi et al. | 345/89 |
| 5,784,073 A | 7/1998 | Yamazaki et al. | |
| 5,835,139 A | 11/1998 | Yun et al. | 349/58 |
| 5,892,496 A * | 4/1999 | Wakeland | 345/690 |
| 5,893,798 A | 4/1999 | Stambolic et al. | 463/46 |
| 5,923,962 A | 7/1999 | Ohtani et al. | 438/150 |
| 5,956,105 A | 9/1999 | Yamazaki et al. | |
| 5,959,603 A | 9/1999 | Ito et al. | 345/100 |
| 5,990,629 A | 11/1999 | Yamada et al. | 315/169.3 |
| 6,020,869 A | 2/2000 | Sasaki et al. | 345/89 |
| 6,028,588 A | 2/2000 | Yoon | 345/153 |
| 6,067,066 A | 5/2000 | Kubota et al. | 345/98 |
| 6,069,609 A | 5/2000 | Ishida et al. | 345/147 |
| 6,072,454 A | 6/2000 | Nakai et al. | 345/97 |
| 6,085,112 A | 7/2000 | Kleinschmidt et al. | 455/556 |
| 6,094,243 A | 7/2000 | Yasunishi | 349/33 |
| 6,127,991 A | 10/2000 | Uehara et al. | 345/60 |
| 6,160,533 A | 12/2000 | Tamai et al. | 345/89 |
| 6,165,824 A | 12/2000 | Takano et al. | 438/160 |
| 6,167,208 A | 12/2000 | Sato | 396/532 |
| 6,184,874 B1 * | 2/2001 | Smith et al. | 315/169.3 |
| 6,215,466 B1 | 4/2001 | Yamazaki et al. | |
| 6,229,583 B1 | 5/2001 | Yasunishi | 349/33 |
| 6,232,941 B1 | 5/2001 | Ode et al. | 345/95 |
| 6,239,781 B1 | 5/2001 | Fujisawa | 345/147 |
| 6,245,256 B1 | 6/2001 | Wu et al. | 252/299.6 |
| 6,245,257 B1 | 6/2001 | Sakai et al. | 252/299.6 |
| 6,292,168 B1 * | 9/2001 | Venable et al. | 345/605 |
| 6,320,565 B1 | 11/2001 | Albu et al. | 345/98 |
| 6,323,871 B1 | 11/2001 | Fujiyoshi et al. | 345/598 |
| 6,326,941 B1 | 12/2001 | Yamazaki et al. | |
| 6,335,716 B1 | 1/2002 | Yamazaki et al. | 345/92 |
| 6,335,717 B2 | 1/2002 | Hasegawa et al. | 345/97 |
| 6,353,435 B2 | 3/2002 | Kudo et al. | 345/204 |
| 6,452,583 B1 | 9/2002 | Takeuchi et al. | 345/108 |
| 6,459,416 B1 | 10/2002 | Sasaki et al. | 345/89 |
| 6,462,728 B1 | 10/2002 | Janssen et al. | 345/100 |
| 2002/0047852 A1 | 4/2002 | Inukai et al. | 345/629 |

OTHER PUBLICATIONS

Full English translation re Japanese Patent Application No. JP 10–312173, published Nov. 24, 1998.

Inui, S. et al, "Thresholdless Antiferroelectricity in Liquid Crystals and its Application to Displays," *J. Mater. Chem.*, vol. 6, No. 4, pp. 671–673, 1996.

Yoshida, T. et al, "A Full–Color Thresholdless Antiferroelectric LCD Exhibiting Wide Viewing Angle with Fast Response Time," SID 97 Digest, pp. 841–844, 1997.

Furue, H. et al, "Characteristics and Driving Scheme of Polymer–Stabilized Monostable FLCD Exhibiting Fast Response Time and High Contrast Ratio with Gray–Scale Capability," SID 98 Digest, pp. 782–785, 1998.

Schenk, H. et al, "Polymers for Light Emitting Diocdes," Eurodisplay '99, Proceedings of the 19th International Display Research Conference, Berlin, Germany, Sep. 6–9, 1999, pp. 33–37.

US patent application No. 10/208,554 (pending) to Kimura including specification, claims, abstract, and drawings.

* cited by examiner

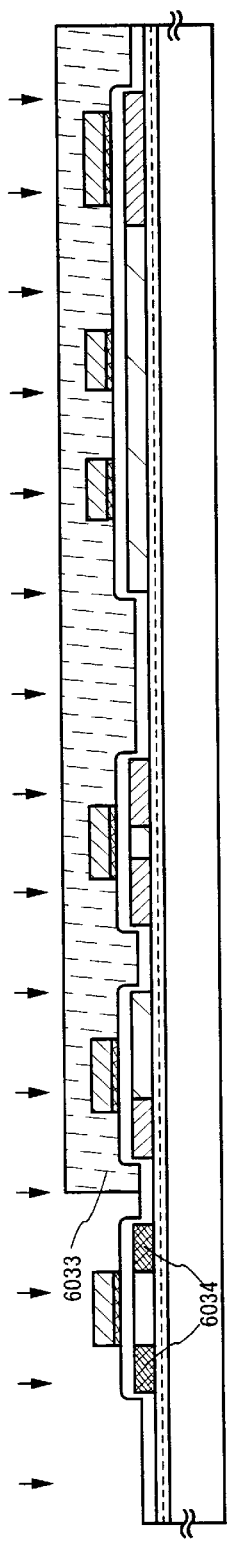
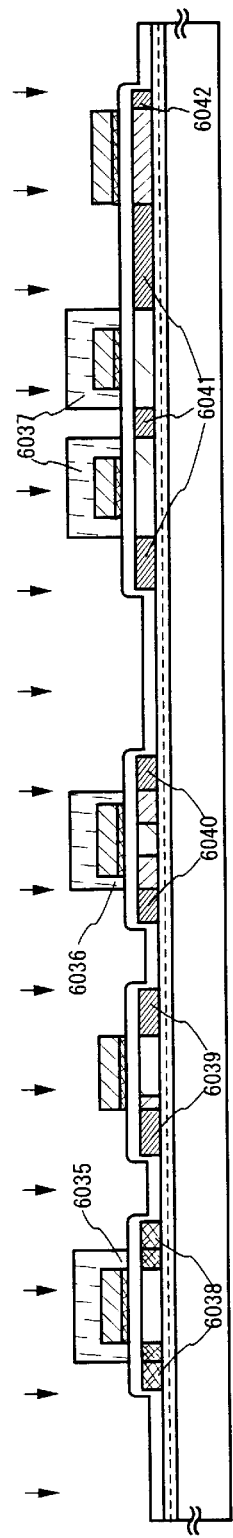
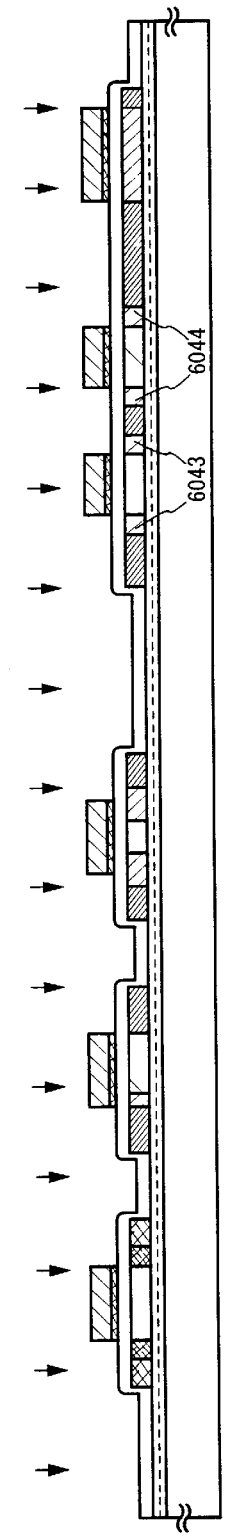
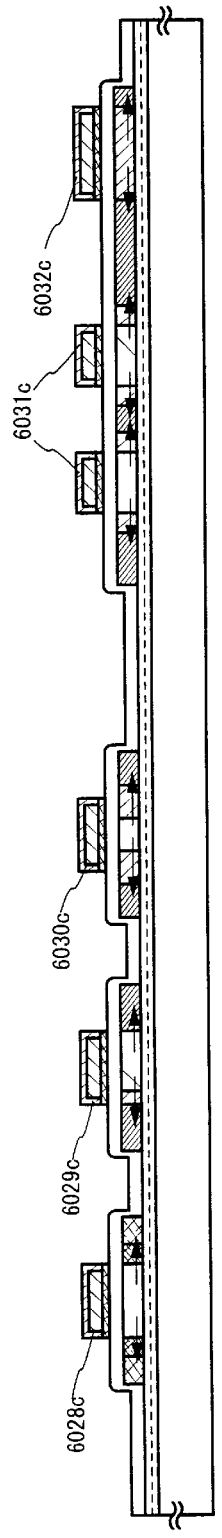
FIG. 26A
FIG. 26B
FIG. 26C
FIG. 26D

DISPLAY DEVICE

BACKGROUND OF THE INVENTION

1. Field of the Invention

The present invention relates to an active matrix type display device. More particularly, the present invention relates to a display device performing gradation display by both voltage gradation and time gradation.

2. Description of the Related Art

Recently, techniques of manufacturing a semiconductor device such as a thin film transistor (TFT) in which semiconductor thin films are formed on an inexpensive glass substrate, have been rapidly progressing. The reason for this resides in that the demand for active matrix type liquid crystal display devices has risen.

An active matrix type liquid crystal display device is a device in which TFTs are placed in each pixel of a pixel region having from several hundreds of thousands to several millions of pixels arranged in a matrix shape, and in which an electric charges input and output to pixel electrodes connected to each pixel TFT are controlled by the pixel TFT switching function.

In recent years, active matrix type liquid crystal display devices have spread from being used as only displays of notebook type personal computers, often seen conventionally, to being used as the display of desktop type personal computers.

There is a demand for the display of a large amount of information (including character information and image information) at once, and the image capabilities of personal computers are being made higher definition and with more gradation levels (preferably full colorization).

Accompanying the increase in personal computer display capabilities, improvements in active matrix type liquid crystal display devices as personal computer display devices are advancing. Digital driver type active matrix liquid crystal display devices with which the interface to a personal computer is easy, and with which high speed driving of the driver is possible, have recently been in the spotlight.

A digital video data is inputted into a digital driver type active matrix liquid crystal display device from a data source such as a personal computer. A D/A converter circuit (DAC: Digital-Analog Converter) for converting an externally inputted digital video data into analog data (gradation voltages) is necessary in an active matrix type liquid crystal display device having a digital driver. Various types of D/A converter circuits exist.

The multiple gradation display capability of an active matrix type liquid crystal display device having a digital driver depends on the capability of the D/A converter circuit. Namely, it depends on how many bits of digital video data is converted into analog data by the D/A converter circuit. For example, in general, display of $2^2=4$ gradations can be performed with an active matrix type liquid crystal display device having a D/A converter circuit which processes 2-bit digital video data, and if the D/A converter circuit processes 8-bit data, then $2^8=256$ gradation display can be performed. Furthermore, it is possible to perform $2^n$ gradation display for n-bit data.

Thus a multiple gradation display of the active matrix type liquid crystal display device, preferably a full color display, has been in demand recently. In order to raise the gradation display capability of the active matrix type liquid crystal display device with a digital driver, it is necessary to raise the signal processing capability of the D/A circuit. However, in order to increase the capability of the D/A converter circuit, the circuit structure of the D/A converter circuit becomes complex, and the layout surface area becomes large.

Liquid crystal display devices in which the D/A converter circuit and the pixel region are formed by polysilicon TFTs on the same substrate have been reported recently. However, if the circuit structure of the D/A converter circuit becomes complex in this case, then the D/A converter circuit yield drops, and so does the yield of the liquid crystal display device. Further, if the surface area for the D/A converter circuit becomes larger, then it becomes difficult to realize a small-scale liquid crystal display device.

SUMMARY OF THE INVENTION

The realization of a small-scale active matrix type liquid crystal display device which can accomplish high definition and multiple gradations is desired.

In view of the above stated problems, an object of the present invention is to provide a display device having a digital driver that can realize higher resolution and more gradations.

One of the features of the present invention is that a display device comprising: a pixel region having a plural number of pixel TFTs arranged in a matrix shape; a source driver and a gate driver for driving the plural number of TFTs; and a circuit for converting externally inputted m-bit digital video data into $2^{m-n}$ pieces of n-bit digital video data (where m and n are both positive integers greater than or equal to 2, and m>n), and for supplying the n-bit digital video data to the source driver; wherein: the $2^{m-n}$ pieces of n-bit digital data is outputted randomly; and a one-frame image is formed by displaying $2^{m-n}$ subframes formed by the n-bit digital data.

Another one of the features of the present invention is that a display device comprising: a pixel region having a plural number of pixel TFTs arranged in a matrix shape; a source driver and a gate driver for driving the plural number of TFTs; and a circuit for converting externally inputted m-bit digital video data into $2^{m-n}$ pieces of n-bit digital video data (where m and n are both positive integers greater than or equal to 2, and m>n), and for supplying the n-bit digital video data to the source driver; wherein: the $2^{m-n}$ pieces of n-bit digital data is outputted randomly; a one-frame image is formed by displaying $2^{m-n}$ subframes formed by the n-bit digital data; and $(2^m-(2^{m-n}-1))$ levels of display gradation can be obtained.

Another feature of the present invention is that a display device comprising: a pixel region having a plural number of pixel TFTs arranged in a matrix shape; a source driver and a gate driver for driving the plural number of TFTs; and a circuit for converting externally inputted m-bit digital video data into $2^{m-n}$ pieces of n-bit digital video data (where m and n are both positive integers greater than or equal to 2, and m>n), and for supplying the n-bit digital video data to the source driver; wherein: the $2^{m-n}$ pieces of n-bit digital data is outputted by a pattern selected randomly from a plural number of output patterns; and a one-frame image is formed by displaying $2^{m-n}$ subframes formed by the n-bit digital data.

Another feature of the present invention is that a display device comprising: a pixel region having a plural number of pixel TFTs, arranged in a matrix shape; a source driver and a gate driver for driving the plural number of TFTs; and a circuit for converting externally inputted m-bit digital video data into $2^{m-n}$ pieces of n-bit digital video data (where m and n are both positive integers greater than or equal to 2, and m>n), and for supplying the n-bit digital video data to the source driver; wherein: the $2^{m-n}$ pieces of n-bit digital data is outputted by a pattern selected randomly from a plural number of output patterns; a one-frame image is formed by displaying $2^{m-n}$ subframes formed by the n-bit digital data; and $(2^m-(2^{m-n}-1))$ levels of display gradation can be obtained.

In the above-mentioned display devices, a liquid crystal may be used as a display medium. Also, in the above-mentioned display devices, an EL may be used as a display medium.

Also, the above-mentioned display devices can be used in a rear projector having three display devices, a front projector having three display devices, a single stage rear projector having one display device, a goggle type display having two display device, a portable information terminal having a display device, a notebook type personal computer having a display device, or the like.

BRIEF DESCRIPTION OF THE DRAWINGS

In the accompanying drawings:

FIGS. 26A to 26D are diagrams showing a method of manufacturing the liquid crystal display device according to the present invention;

DETAILED DESCRIPTION OF THE PREFERRED EMBODIMENTS

Figure 1:
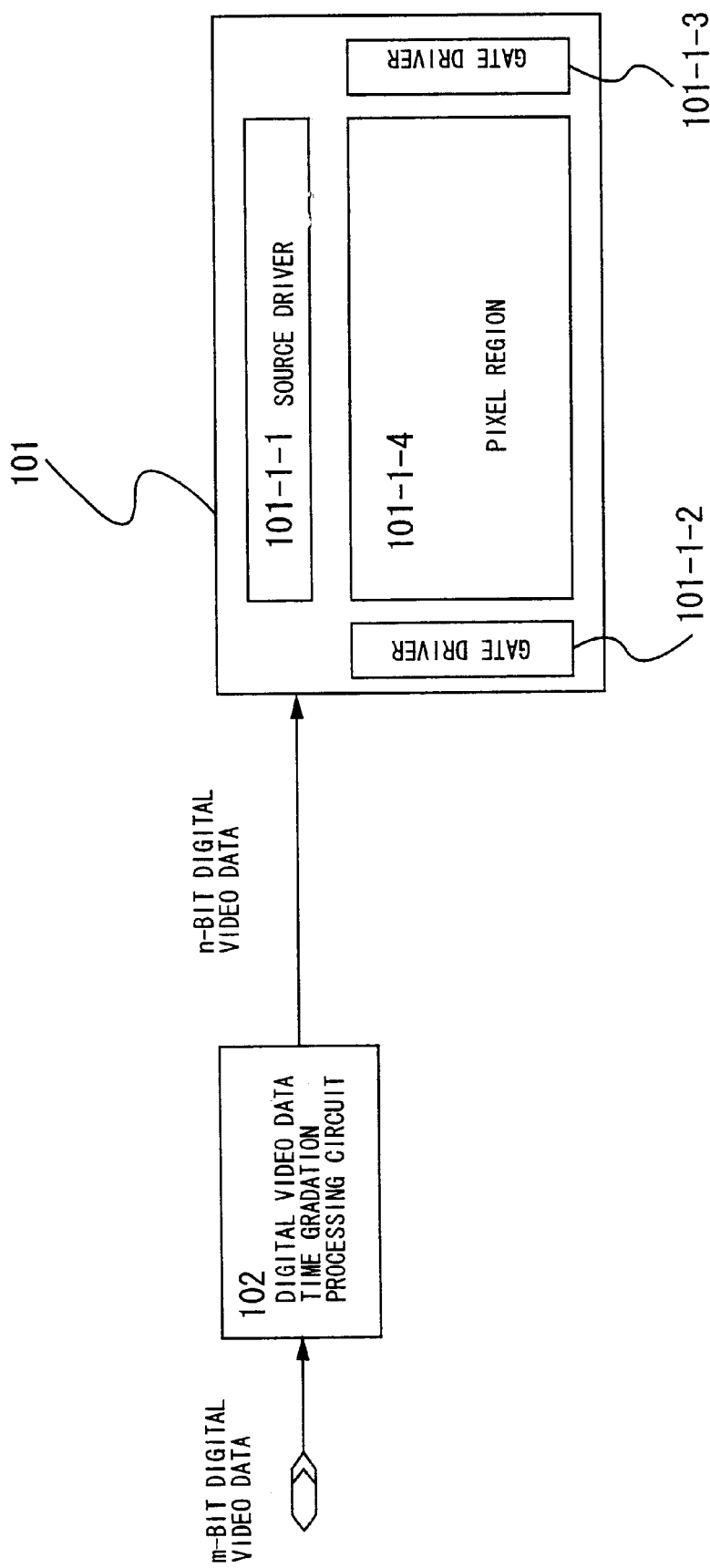
FIG. 1 is a schematic structure diagram of a display device according to the present invention.

FIG. 1 is referenced. A schematic structure diagram of the display device of the present invention is shown in FIG. 1. Reference numeral 101 denotes an active matrix type display device having a digital driver. The active matrix type display device 101 has an active matrix substrate 101-1 and an opposing substrate (not shown in the figure). The active matrix substrate 101-1 has a source driver 101-1-1, gate drivers 101-1-2 and 101-1-3, and a pixel region 101-1-4 in which a plural number of pixel TFTs are arranged into a matrix shape. The source driver 101-1-1, and the gate drivers 101-1-2 and 101-1-3 dirive the plural number of pixel TFTs in the pixel region 101-1-4. Further, the opposing substrate has an opposing electrode (not shown in the figure).

Reference numeral 102 denotes a digital video data time gradation processing circuit. The digital video data time gradation processing circuit 102 forms $2^{m-n}$ pieces of serial n-bit digital video data for voltage gradations, based on m-bit digital video data that is externally inputted. In other words, the externally inputted m-bit digital video data is converted into $2^{m-n}$ pieces of serial n-bit digital video data for voltage gradations by the digital video data time gradation processing circuit 102.

When m-bit digital video data is converted into $2^{m-n}$ pieces of serial n-bit digital video data, the output order of the $2^{m-n}$ pieces of n-bit digital video data is preformed randomly.

Note that, out of the m-bit digital video data, (m–n) bits of gradation information is used in gradation display by time gradation. A method of performing gradation display in accordance with time gradation is explained in detail later in this specification.

The $2^{m-n}$ pieces of serial n-bit digital video data formed by the digital video data time gradation processing circuit 102 is inputted into the active matrix type display device 101 with a digital driver.

The n-bit digital video data inputted into the active matrix type display device 101 is inputted to the source driver 101-1-1 where it is converted into analog gradation data by the D/A converter circuit inside the source driver, is supplied to each source signal line, and is further supplied to the corresponding pixel TFTs.

Note that in this specification, the display device of the present invention is an active matrix type display device having a digital driver and a digital video data time gradation processing circuit. Furthermore, as explained later, the active matrix type display device having the digital driver and the digital video data time gradation processing circuit are formed together on the same substrate for the display device of the present invention.

The display device of the present invention will be explained in detail below by the preferred embodiments. Note that the display device of the present invention is not necessarily limited to the embodiments below.

Embodiment 1

A liquid crystal display device to which 4-bit digital video data is externally inputted is explained in the present embodiment, as an example of the present invention.

Figure 2:
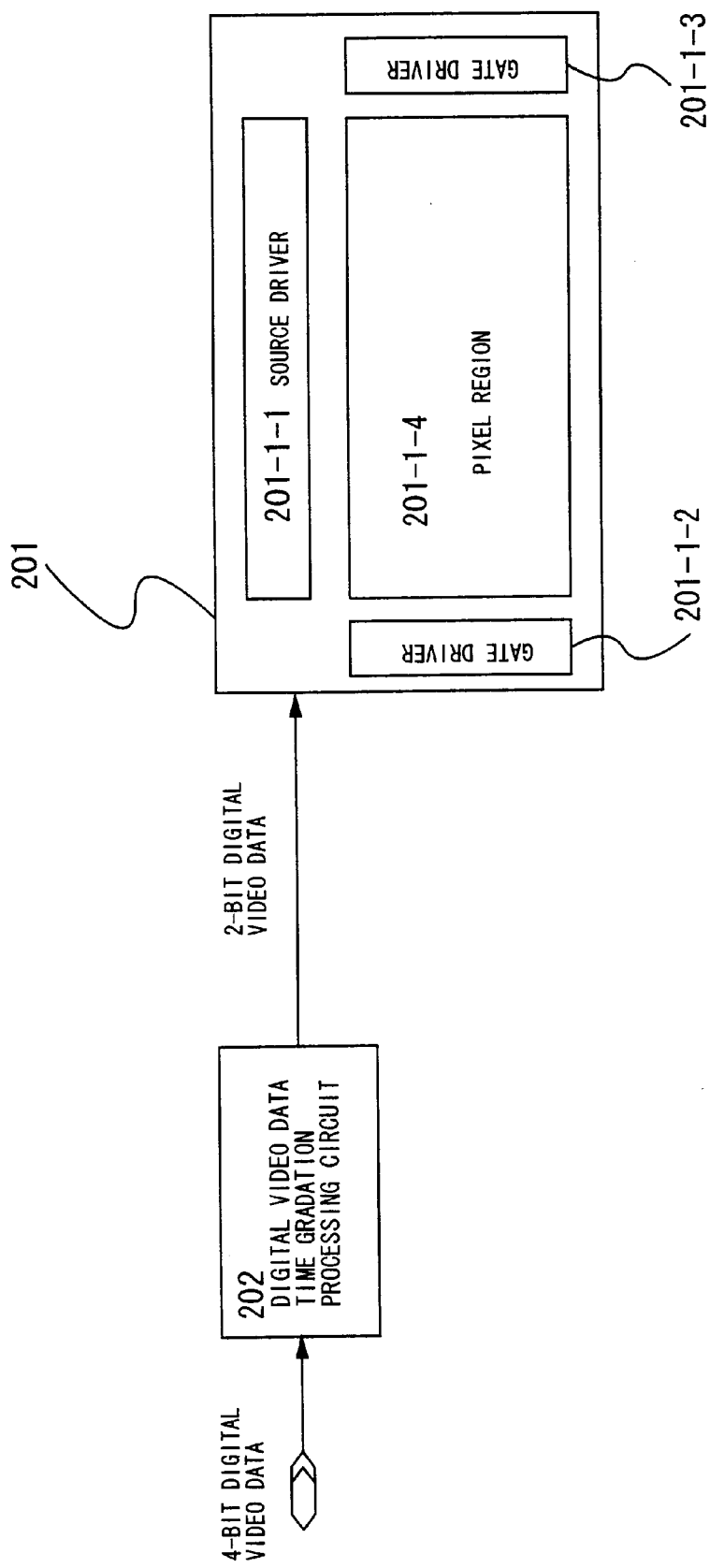
FIG. 2 is a schematic structure diagram of an embodiment of the liquid crystal display device according to the present invention.

FIG. 2 is referred to. A schematic structure diagram of the liquid crystal display device of the present invention is shown in FIG. 2. Reference numeral 201 denotes an active matrix type liquid crystal display device having a digital driver. The active matrix type liquid crystal display device 201 has an active matrix substrate 201-1 and an opposing substrate (not shown in the figure). The active matrix substrate 201-1 has a source driver 201-1-1, gate drivers 201-1-2 and 201-1-3, and a pixel region 201-1-4 in which a plural number of pixel TFTs are arranged into a matrix shape. The source driver 201-1-1, and the gate drivers 201-1-2 and 201-1-3 drive the plural number of pixel TFTs in the pixel region. Further, the opposing substrate has an opposing electrode (not shown in the figure).

Reference numeral 202 denotes a digital video data time gradation processing circuit. The digital video data time gradation processing circuit 202 forms 4 pieces ($=2^{4-2}$ pieces) of serial 2-bit digital video data for voltage gradations, based on 4-bit digital video data that is externally inputted. As stated above, the output order of the $2^{m-n}$ pieces of n-bit digital video data is random. Of the 4-bit digital video data, 2-bit gradation information is used in gradation display by time gradation.

The 4 pieces of 2-bit digital video data formed by the digital video data time gradation processing circuit 202 is inputted randomly as well as serially to the active matrix type liquid crystal display device 201 with the digital driver. The 2-bit digital video data inputted to the active matrix type liquid crystal display device 201 is inputted into the source driver 201-1-1, converted into analog gradation voltages by a D/A converter circuit inside the source driver, supplied to each source signal line, and supplied to the corresponding pixel TFTs.

Figure 3:
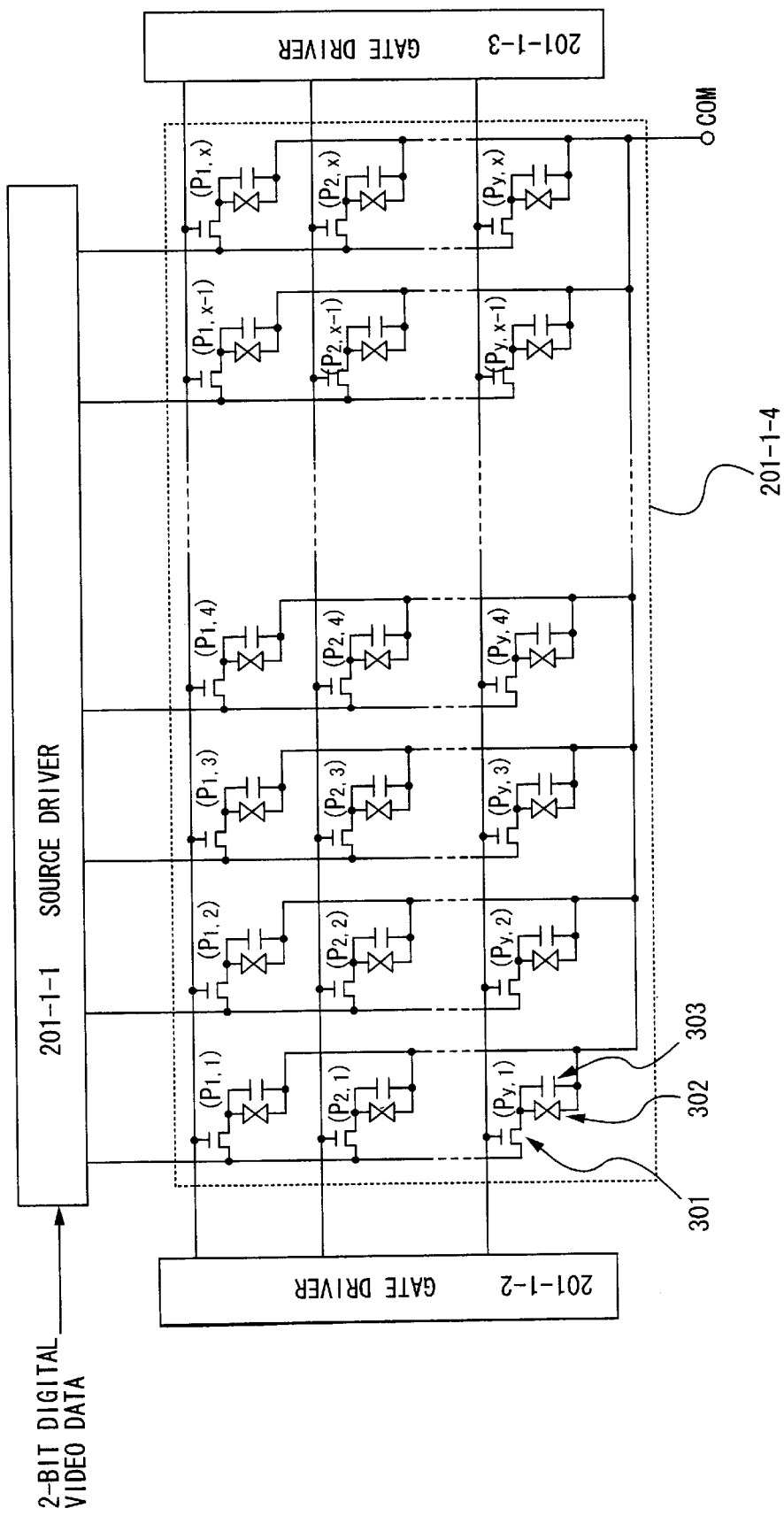
FIG. 3 is a circuit structure diagram of a pixel. region, a source driver, and a gate driver of an embodiment of the liquid crystal display device according to the present invention.

The circuit structure of the active matrix type liquid crystal display device 201 of the liquid crystal display device of the present embodiment, in particular the structure of the pixel region 201-1-4, is explained here using FIG. 3.

In the present embodiment, the pixel region 201-1-4 has (xxy) pixels. For convenience, symbols $P_{1,1}, P_{2,1}, \ldots, P_{y,x}$ are attached to the respective pixels. Further, each pixel has a pixel TFT 301 and a storage capacitor 303. A liquid crystal is sandwiched between the active matrix substrate and the opposing substrate, and a liquid crystal 302 schematically denotes the liquid crystal corresponding to each pixel. Note that COM is a common voltage terminal, and that it is connected to one terminal of the opposing electrode and of the storage capacitor.

The active matrix type liquid crystal display device of the present embodiment drives one line of pixels (for example, $P_{1,1}, P_{1,2}, \ldots, P_{1,x}$) at the same time, performing so-called line-sequential driving. In other words, the analog gradation voltages are written to all of the pixels in one line at the same time.

Note that one screen of display is referred to as one frame, and that one frame is formed in the present embodiment by time division display of four subframes in succession. In the present embodiment, then, the amount of time necessary to perform the display of one frame is referred to as one frame period (Tf), and the period of time for dividing one frame period into four divisions is referred to as subframe period (Tsf). In addition, the amount of time necessary to write out the analog gradation voltages to one line of pixels (for example, $P_{1,1}, P_{1,2}, \ldots, P_{1,x}$) is referred to as one subframe line period (Tsfl).

Figure 4:
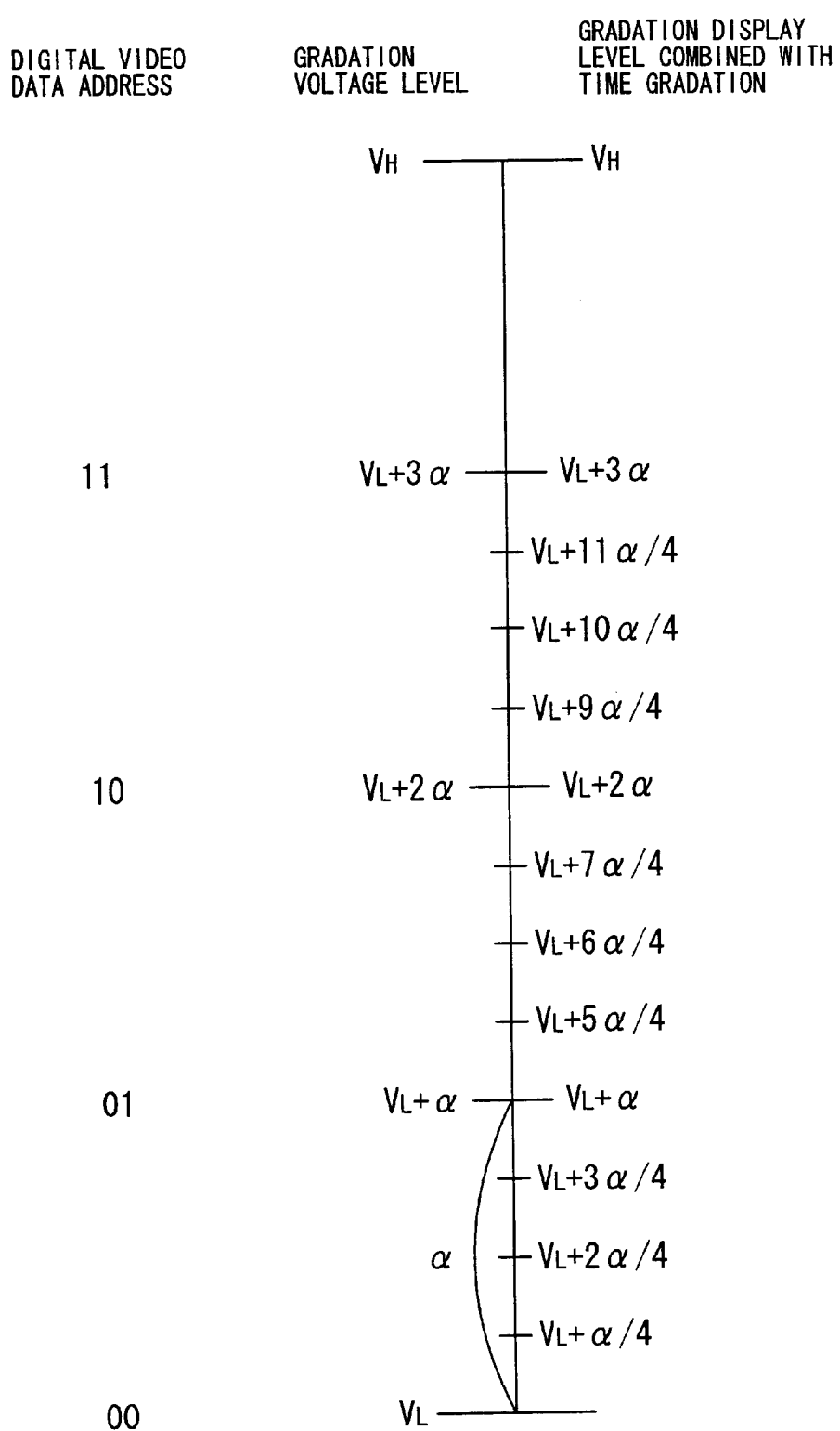
FIG. 4 is a diagram showing a gradation display level of an embodiment of the liquid crystal display device according to the present invention.

The gradation display of the liquid crystal display device of the present embodiment is explained next. 4-bit digital video data is supplied to the liquid crystal display device of the present embodiment, and the 4-bit digital video data has $2^4=16$ levels of gradation information, as stated above. FIG. 4 is referred to next. The gradation voltage level of the D/A converter circuit used in the liquid crystal display device of the present embodiment, and the actual gradation that is displayed (gradation display level) are shown in FIG. 4. The voltage level $V_L$ is the lowest voltage level that is inputted to the D/A converter circuit, and the voltage level $V_H$ is the highest voltage level that is inputted to the D/A converter circuit.

In order to realize 2-bits, or 4 gradation voltage levels, in the present embodiment, the voltage between the voltage level $V_H$ and the voltage level $V_L$ is divided into nearly 4 equal voltages, with the equal voltage taken as $\alpha$ (where $\alpha=(V_H-V_L)/4$). Note that a is referred to as a voltage level step here. Therefore, the gradation voltage level output from the D/A converter circuit of the present embodiment becomes: $V_L$ when the 2-bit digital video data address is (00); $V_L+\alpha$ when the 2-bit digital video data address is (01); $V_L+2\alpha$ when the 2-bit digital video data address is (10); and $V_L+3\alpha$ when the 2-bit digital video data address is (11).

The gradation voltage level which can be outputted by the D/A converter circuit of the present embodiment is the four levels stated above, $V_L$, $V_L+\alpha$, $V_L+2\alpha$, and $V_L+3\alpha$ but in combination with time gradation display, the number of gradation levels of the liquid crystal display device can be increased in the present invention.

Namely, of the 4-bit digital video data, by using 2 bits of gradation information as time gradation display information in the present embodiment, a gradation display level corresponding to the nearly equally divided 4 gradation voltage levels of the voltage level step $\alpha$ can be realized. In other words, the liquid crystal display device of the present embodiment can realize a gradation display level corresponding to the following gradation levels: $V_L$, $V_L+\alpha/4$, $V_L+2\alpha/4$, $V_L+3\alpha/4$, $V_L+\alpha$, $V_L+5\alpha/4$, $V_L+6\alpha/4$, $V_L+7\alpha/4$, $V_L+2\alpha$, $V_L+9\alpha/4$, $V_L+10\alpha/4$, $V_L+11\alpha/4$, and $V_L+3\alpha$.

The liquid crystal display device of the present invention divides one frame period Tf into four subframes (1st Tsf, 2nd Tsf, 3rd Tsf, and 4th Tsf) and then performs display. In addition, the liquid crystal display device of the present embodiment performs line-sequential driving, and therefore in one frame period, the gradation voltage is written to each pixel during one subframe line period, and the gradation information is stored in the pixel during the subframe period. Consequently, the address of the 2-bit digital video data after time gradation process is inputted to the D/A converter circuit in each subframe line period (1st Tsfl, 2nd Tsfl, 3rd Tsfl, and 4th Tsfl) corresponding to each subframe (1st Tsf, 2nd Tsf, 3rd Tsf, and 4th Tsf), and the gradation voltages are outputted from the D/A converter circuit. The subframe displays are performed 4 times at high speed by the gradation voltages written in the four subframe line periods (1st Tsfl, 2nd Tsfl, 3rd Tsfl, and 4th Tsfl), and as a result, the gradation display level of one frame becomes the time average of the sum total of gradation voltage levels of each subframe line period.

A display method of gradation display levels corresponding to the above gradation voltage levels in the liquid crystal display device of the present invention is explained while referring to FIGS. 5 to 8.

Figure 5:
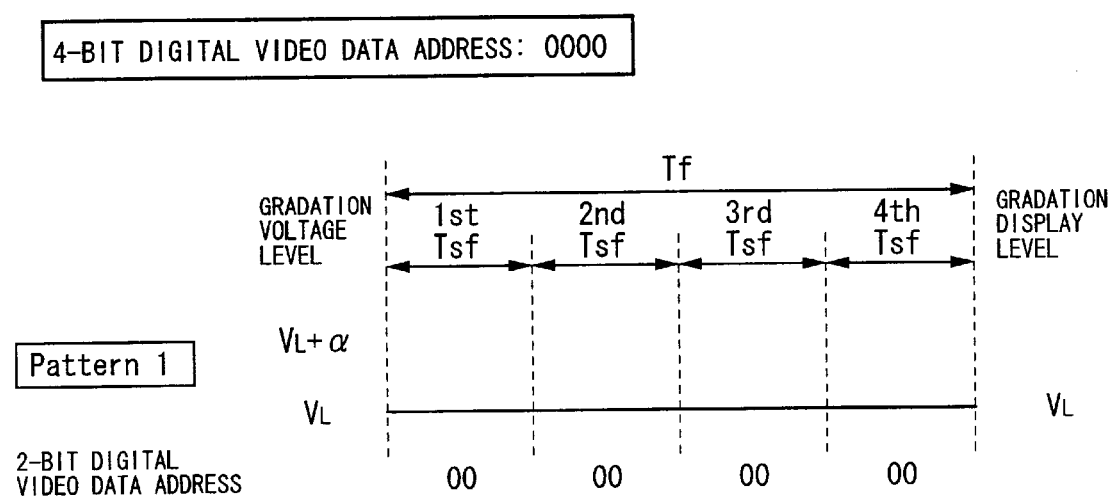
FIG. 5 is a timing chart showing a gradation voltage level that is to be outputted to a pixel, and a gradation display level, in an embodiment of the liquid crystal display device according to the present invention.

FIG. 5 is referred to first. When the externally inputted 4-bit digital video data address is (0000), the gradation voltage level that is supplied to each pixel (pixel TFT) in each subframe line period (1st Tsfl, 2nd Tsfl, 3rd Tsfl, and 4th Tsfl) and then held during each subframe period (1st Tsf, 2nd Tsf, 3rd Tsf, and 4th Tsf) is shown by a solid line in FIG. 5, and the gradation display level is shown by a dotted line. (Note that the dotted line showing the gradation display level in FIG. 5 overlaps the solid line showing the gradation voltage level.)

The digital video data time gradation processing circuit forms 4 pieces of 2-bit digital video data based on the externally inputted 4-bit digital video data. When the address of the externally inputted 4-bit digital video data is (0000), the digital video data time gradation processing circuit forms 2-bit digital video data (address (00)) and supplies this to the source driver of the active matrix type liquid crystal display device. As shown in FIG. 5, if the address of the externally inputted 4-bit digital video data is (0000), then the gradation voltage level $V_L$ (address (00)) is outputted to each corresponding pixel in each subframe line period (1st Tsfl, 2nd Tsfl, 3rd Tsfl, and 4th Tsfl) and then held during each subframe period (1st Tsf, 2nd Tsf, 3rd Tsf, and 4th Tsf). When the address of the externally inputted 4-bit digital video data is (0000), the gradation voltage level pattern that is supplied to each subframe line period (1st Tsfl, 2nd Tsfl, 3rd Tsfl, and 4th Tsfl) and then held during 1o each subframe period (1st Tsf, 2nd Tsf, 3rd Tsf, and 4th Tsf) has only one pattern (Pattern 1), as shown in FIG. 5. Therefore, the gradation display level becomes $V_L$.

Figure 6:
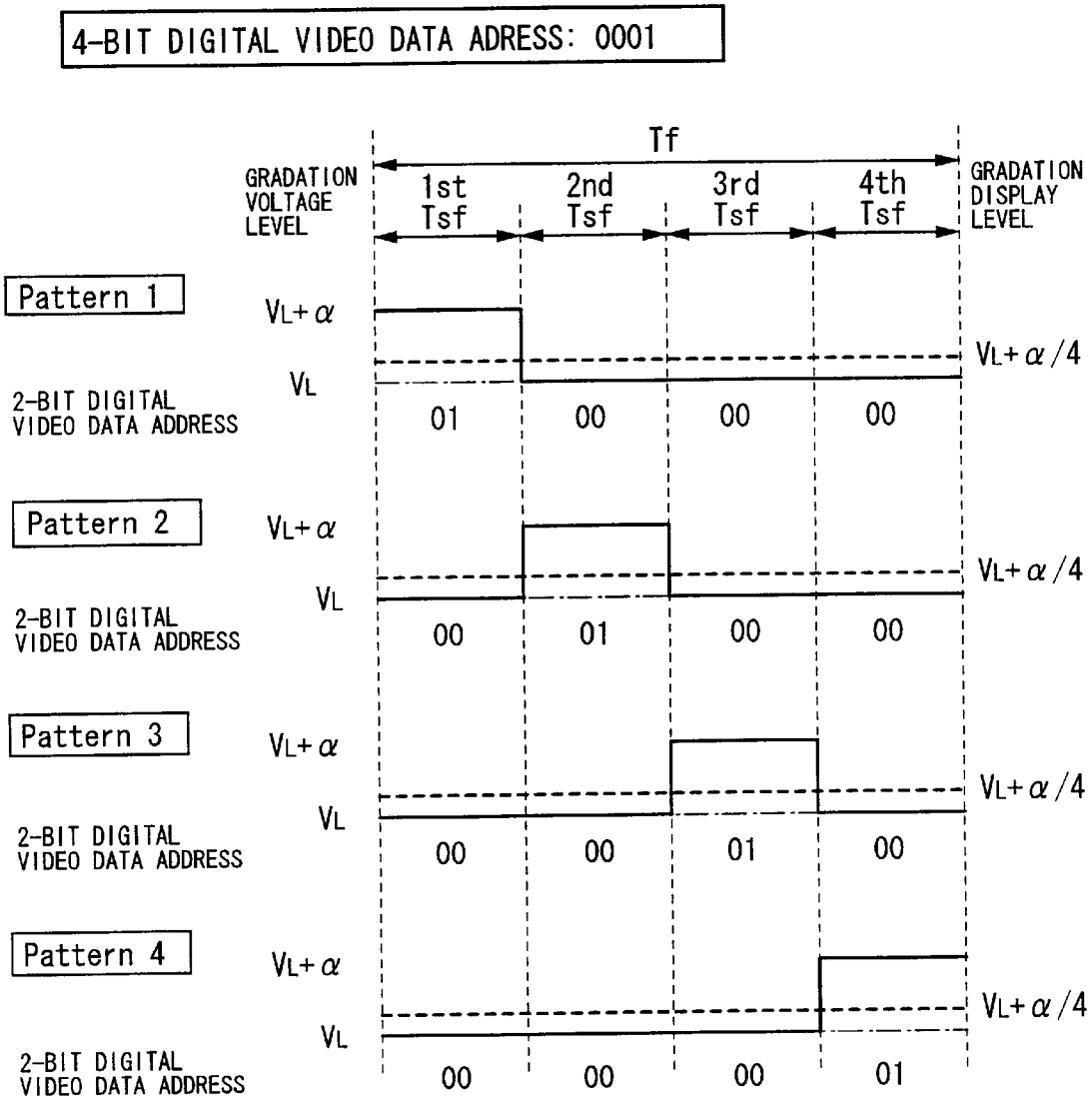
FIG. 6 is a timing chart showing the gradation voltage level that is to be outputted to a pixel, and the gradation display level, in an embodiment of the liquid crystal display device according to the present invention.

FIG. 6 is referred to next. When the externally inputted 4-bit digital video data address is (0001), the gradation voltage level that is supplied to each pixel (pixel TFT) in each subframe line period (1st Tsfl, 2nd Tsfl, 3rd Tsfl, and 4th Tsfl) and then held during each subframe period (1st Tsf, 2nd Tsf, 3rd Tsf, and 4th Tsf) is shown by a solid line in FIG. 6, and the gradation display level is shown by a dotted line.

When the address of the externally inputted 4-bit digital video data is (0001), the digital video data time gradation processing circuit forms 2-bit digital video data (address (00) or (01)) and supplies this to the source driver of the active matrix type liquid crystal display device. As shown in FIG. 6, if the address of the externally inputted 4-bit digital video data is (0001), then the gradation voltage level $V_L$ (address (00)) is supplied three times, and the gradation voltage level $V_L+\alpha$ (address (01)) is supplied once, in random order, to the corresponding pixel in each subframe line period and then held during each subframe period. When the address of the externally inputted 4-bit digital video data is (0001), the gradation voltage level pattern that is supplied to each pixel in, each subframe line period and then held during each subframe period has four patterns (Pattern 1, Pattern 2, Pattern 3, and Pattern 4), as is understood from FIG. 6. In each of the cases, the gradation display level becomes $V_L+\alpha/4$.

Then, when the address of the externally inputted 4-bit digital video data is (0001) in the liquid crystal display device of the present invention, the gradation voltage level that is supplied to each pixel during each subframe line period and then held during each subframe period is supplied at random by one of the four patterns (Pattern 1, Pattern 2, Pattern 3, and Pattern 4). Thus, a gradation display level corresponding to $V_L+\alpha/4$ can be realized. In addition, the gradation voltage is written to each pixel in each subframe line period without imbalance, and the generation of flicker can be reduced without increasing the frame frequency.

Figure 7:
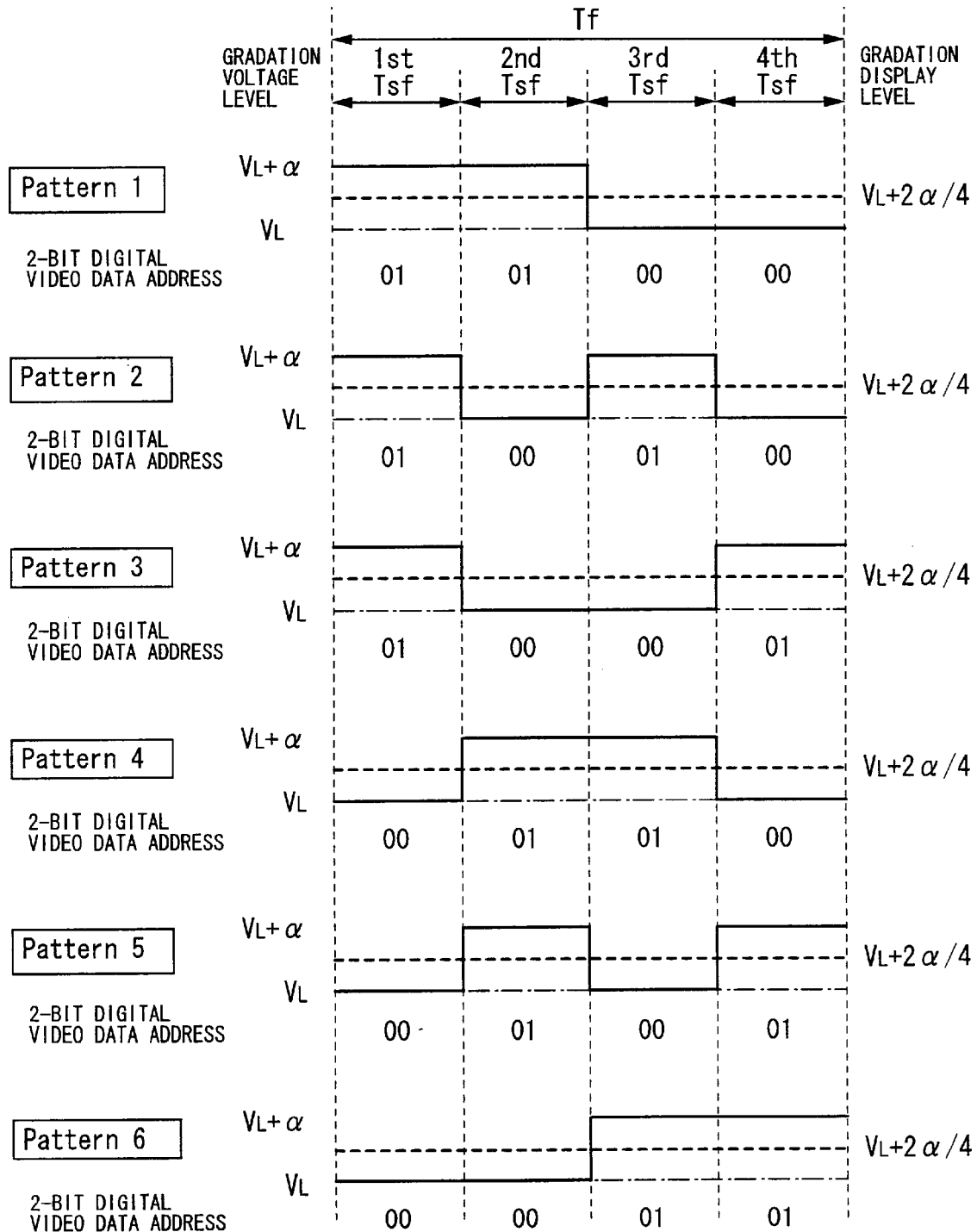
FIG. 7 is a timing chart showing the gradatioin voltage level that is to be outputted to a pixel, and the gradation display level, in an embodiment of the liquid crystal display device according to the present invention.

FIG. 7 is referred to next. When the externally inputted 4-bit digital video data address is (0010), the gradation voltage level that is supplied to each pixel (pixel TFT) in each subframe line period (1st Tsfl, 2nd Tsfl, 3rd Tsfl, and 4th Tsfl) and then held during each subframe period (1st Tsf, 2nd Tsf, 3rd Tsf, and 4th Tsf) is shown by a solid line in FIG. 7, and the gradation display level is shown by a dotted line.

When the address of the externally inputted 4-bit digital video data is (0010), the digital video data time gradation processing circuit forms 2-bit digital video data (address (00) or (01)) and supplies this to the source driver of the active matrix type liquid crystal display device. As shown in FIG. 7, if the address of the externally inputted 4-bit digital video data is (0010), then the gradation voltage level $V_L$ (address (00)) is supplied two times, and the gradation voltage level $V_L+\alpha$ (address (01)) is supplied twice, in random order, to the corresponding pixel in each subframe line period and then held during each, subframe period. When the address of the externally inputted 4-bit digital video data is (0010), the gradation voltage level pattern that is supplied to each pixel in each subframe line period and then held during each subframe period has six pattern's (Pattern 1, Pattern 2, Pattern 3, Pattern 4, Pattern 5, and Pattern 6), as is understood from FIG. 7. In each of the cases, the gradation display level becomes $V_L+2\alpha/4$.

Also, when the address of the externally inputted 4-bit digital video data is (0010), the gradation voltage level that is supplied to each pixel during each subframe line period and then held during each subframe period is supplied at random by one of the six patterns (Pattern 1, Pattern 2, Pattern 3, Pattern 4, Pattern 5, and Pattern 6). Thus, a gradation display level corresponding to $V_L+2\alpha/4$ can be realized. In addition, the gradation voltage is written to each pixel in each subframe line period without imbalance, and the generation of flicker can be reduced without increasing the frame frequency.

Figure 8:
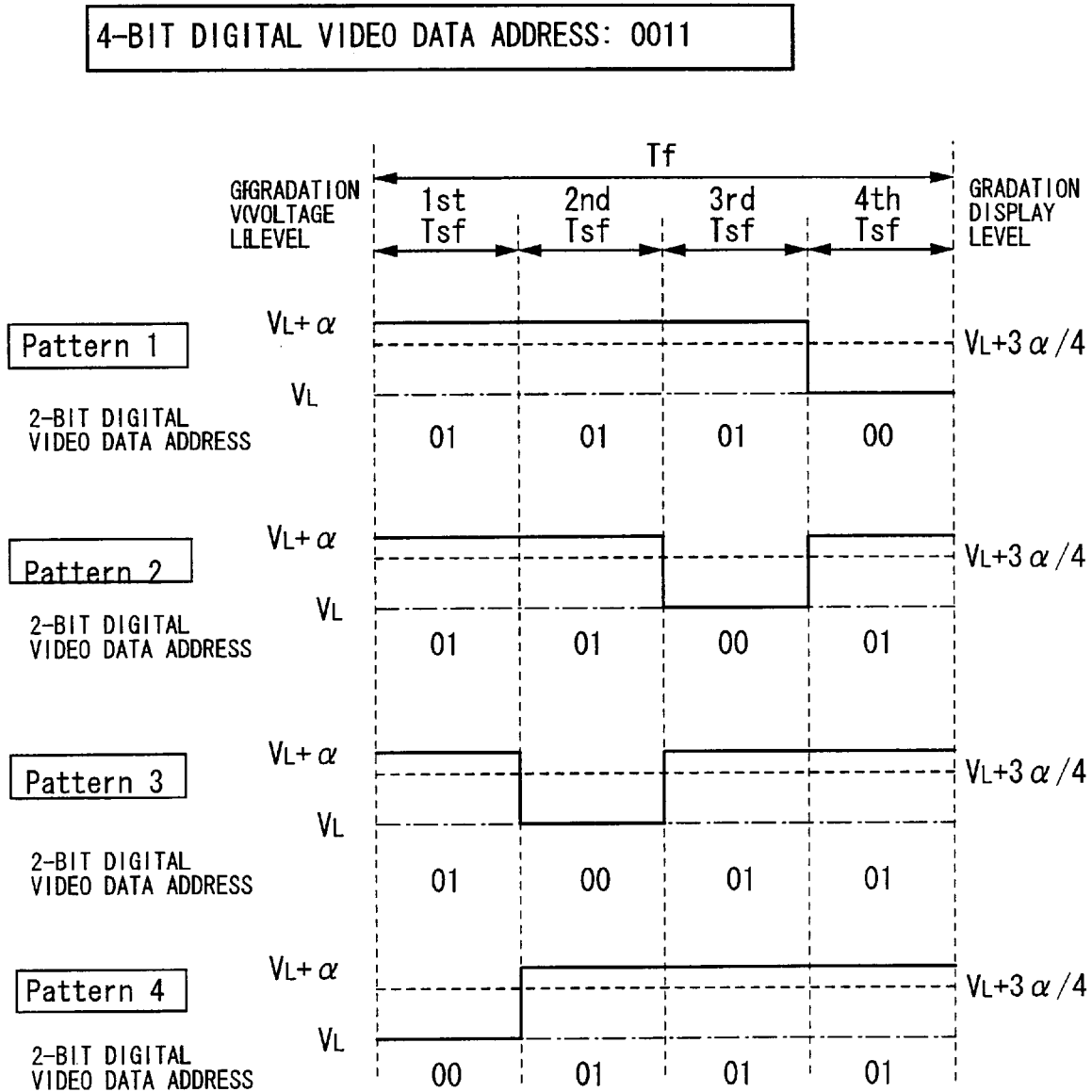
FIG. 8 is a timing chart showing the gradation voltage level that is to be outputted to a pixel, and the gradation display level, in an embodiment of the liquid crystal display device according to the present invention.

FIG. 8 is referred to next. When the externally inputted 4-bit digital video data address is (0011), the gradation voltage level that is supplied to each pixel (pixel TFT) in each subframe line period (1st Tsfl, 2nd Tsfl, 3rd Tsfl, and 4th Tsfl) and then held during each subframe period (1st Tsf, 2nd Tsf, 3rd Tsf, and 4th Tsf) is shown by a solid line in FIG. 8, and the gradation display level is shown by a dotted line.

When the address of the externally inputted 4-bit digital video data is (0011), the digital video data time gradation processing circuit forms 2-bit digital video data (address (00) or (01)) and supplies this to the source driver of the active matrix type liquid crystal display device. As shown in FIG. 8, if the address of the externally inputted 4-bit digital video data is (0011), then the gradation voltage level $V_L$ (address (00)) is supplied one time, and the gradation voltage level $V_L+\alpha$ (address (01)) is supplied three times, in random order, to the corresponding pixel in each subframe line period and then held during each subframe period. When the address of the externally inputted 4-bit digital video data is (0011), the gradation voltage level pattern that is supplied to each pixel in each subframe line period and then held during each subframe period has four patterns (Pattern 1, Pattern 2, Pattern 3, and Pattern 4), as is understood from FIG. 8. In each of the cases, the gradation display level becomes $V_L+3\alpha/4$.

Also, when the address of the externally inputted 4-bit digital video data is (0011), the gradation voltage level that is supplied to each pixel during each subframe line period and then held during each subframe period is outputted at random by one of the four patterns (Pattern 1, Pattern 2, Pattern 3, and Pattern 4). Thus, a gradation display level corresponding to $V_L+3\alpha/4$ can be realized. In is addition, the gradation voltage is written to each pixel in each subframe line period without imbalance, and the generation of flicker can be reduced without increasing the frame frequency.

Similarly, cases where the address of the externally inputted 4-bit digital video data is (0100), (0101), (0110), and (0111) are explained below.

Figure 9:
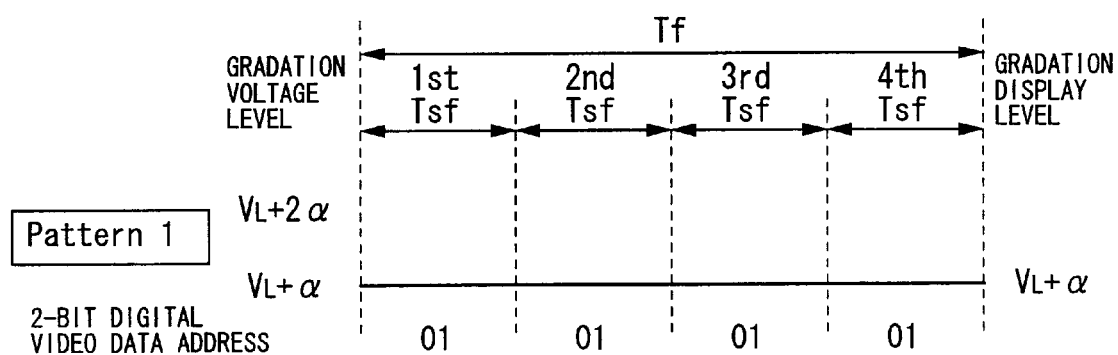
FIG. 9 is a timing chart showing the gradation voltage level that is to be outputted to a pixel, and the gradation display level, in an embodiment of the liquid crystal display device according to the present invention.

FIG. 9 is referred to. When the externally inputted 4-bit digital video data address is (0100), the gradation voltage level that is supplied to each pixel (pixel TFT) in each subframe line period (1st Tsfl, 2nd Tsfl, 3rd Tsfl, and 4th Tsfl) and then held during each subframe period (1st Tsf, 2nd Tsf, 3rd Tsf, and 4th Tsf) is shown by a solid line in FIG. 9, and the gradation display level is shown by a dotted line. (Note that the dotted line showing the gradation display level in FIG. 9 overlaps the solid line showing the gradation voltage level.)

The digital video data time gradation processing circuit forms 2-bit digital video data based on the externally inputted 4-bit digital video data. When the address of the externally inputted 4-bit digital video data is (0100), the digital video data time gradation processing circuit forms 2-bit digital video data (address (01)) and supplies this to the source driver of the active matrix type liquid crystal display device. As shown in FIG. 9, if the address of the externally inputted 4-bit digital video data is (0100), then the gradation voltage level $V_L+\alpha$ (address (01)) is supplied to each corresponding pixel in each subframe line period (1st Tsfl, 2nd Tsfl, 3rd Tsfl, and 4th Tsfl) and then held during each subframe period (1st Tsf, 2nd Tsf, 3rd Tsf, and 4th Tsf). When the address of the externally inputted 4-bit digital video data is (0100), the gradation voltage level pattern that is supplied to each subframe line period (1st Tsfl, 2nd Tsfl, 3rd Tsfl, and 4th Tsfl) and then held during each subframe period (1st Tsf, 2nd Tsf, 3rd Tsf, and 4th Tsf) has only one pattern (Pattern 1), as shown in FIG. 9. Therefore, the gradation display level becomes $V_L+\alpha$.

Figure 10:
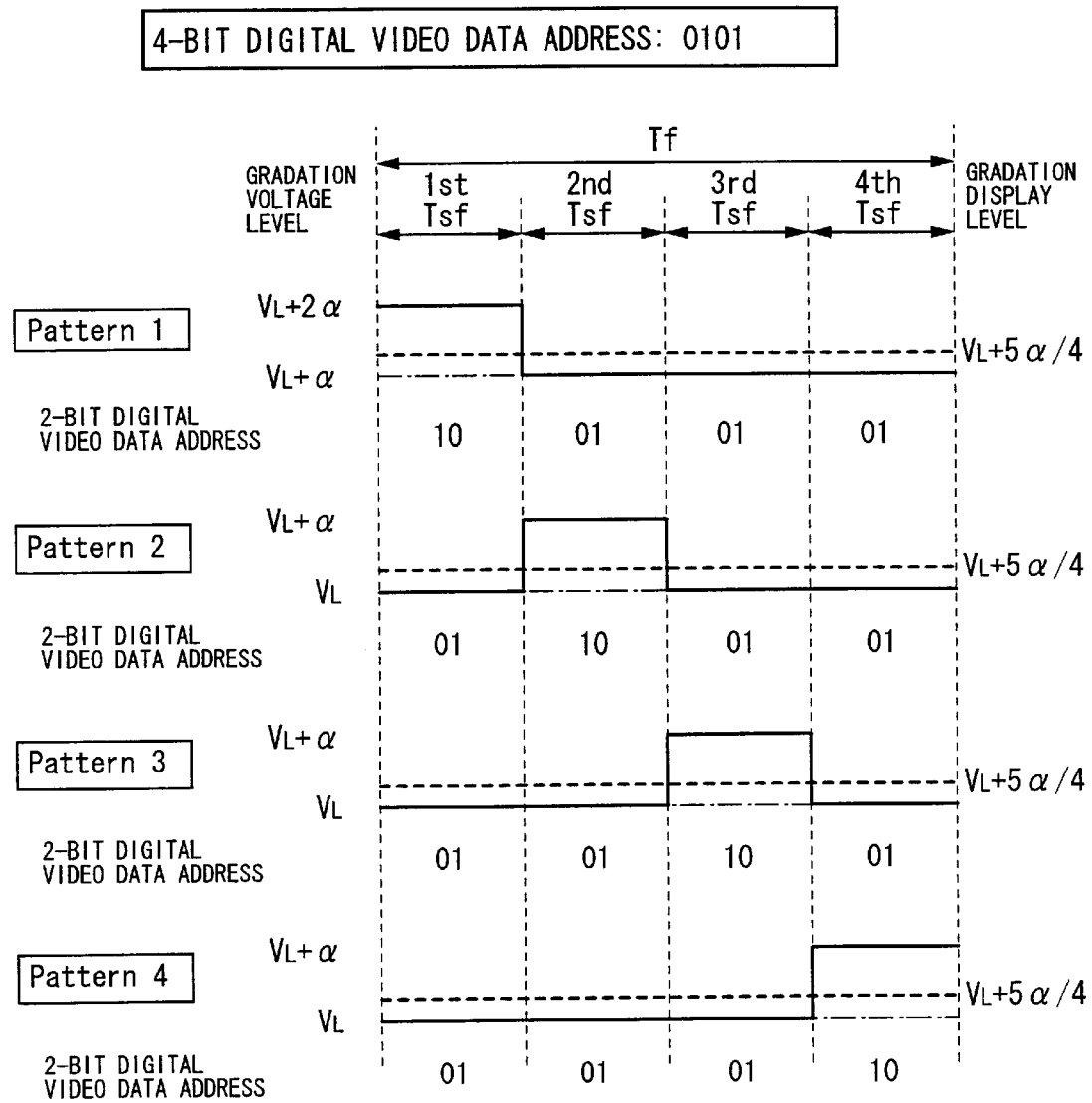
FIG. 10 is a timing chart showing the gradation voltage level that is to be outputted to a pixel, and the gradation display level, in an embodiment of the liquid crystal display device according to the present invention.

FIG. 10 is referred to next. When the externally inputted 4-bit digital video data address is (0101), the gradation voltage level that is supplied to each pixel (pixel TFT) in each subframe line period (1st Tsfl, 2nd Tsfl, 3rd Tsfl, and 4th Tsfl) and then held during each subframe period (1st Tsf, 2nd Tsf, 3rd Tsf, and 4th Tsf) is shown by a solid line in FIG. 10, and the gradation display level is shown by a dotted line.

When the address of the externally inputted 4-bit digital video data is (0101), the digital video data time gradation processing circuit forms 2-bit digital video data (address (01) or (10)) and supplies this to the source: driver of the active matrix type liquid crystal display device. As shown in FIG. 10, if the address of the externally inputted 4-bit digital video data is (0101), then the gradation voltage level $V_L+\alpha$ (address (01)) is supplied three times, and the gradation voltage level $V_L+2\alpha$ (address (10)) is supplied once, in random order, to the corresponding pixel in each subframe line period and then held during each subframe period. When the address of the externally inputted 4-bit digital video data is (0101), the gradation voltage level pattern that is supplied to each subframe line period and then held during each subframe period has four patterns (Pattern 1, Pattern 2, Pattern 3, and Pattern 4), as is understood from FIG. 10. In each of the cases, the gradation display level becomes $V_L+5\alpha/4$.

Also, note that when the address of the externally inputted 4-bit digital video data is (0101), the gradation voltage level that is supplied to each pixel during each subframe line period and then held during each subframe period is supplied at random by one of the four patterns (Pattern 1, Pattern 2, Pattern 3, and Pattern 4). Thus, a gradation display level corresponding to $V_L+5\alpha/4$ can be realized. In addition, the gradation voltage is written to each pixel in each subframe line period without imbalance, and the generation of flicker can be reduced without increasing the frame frequency.

Figure 11:
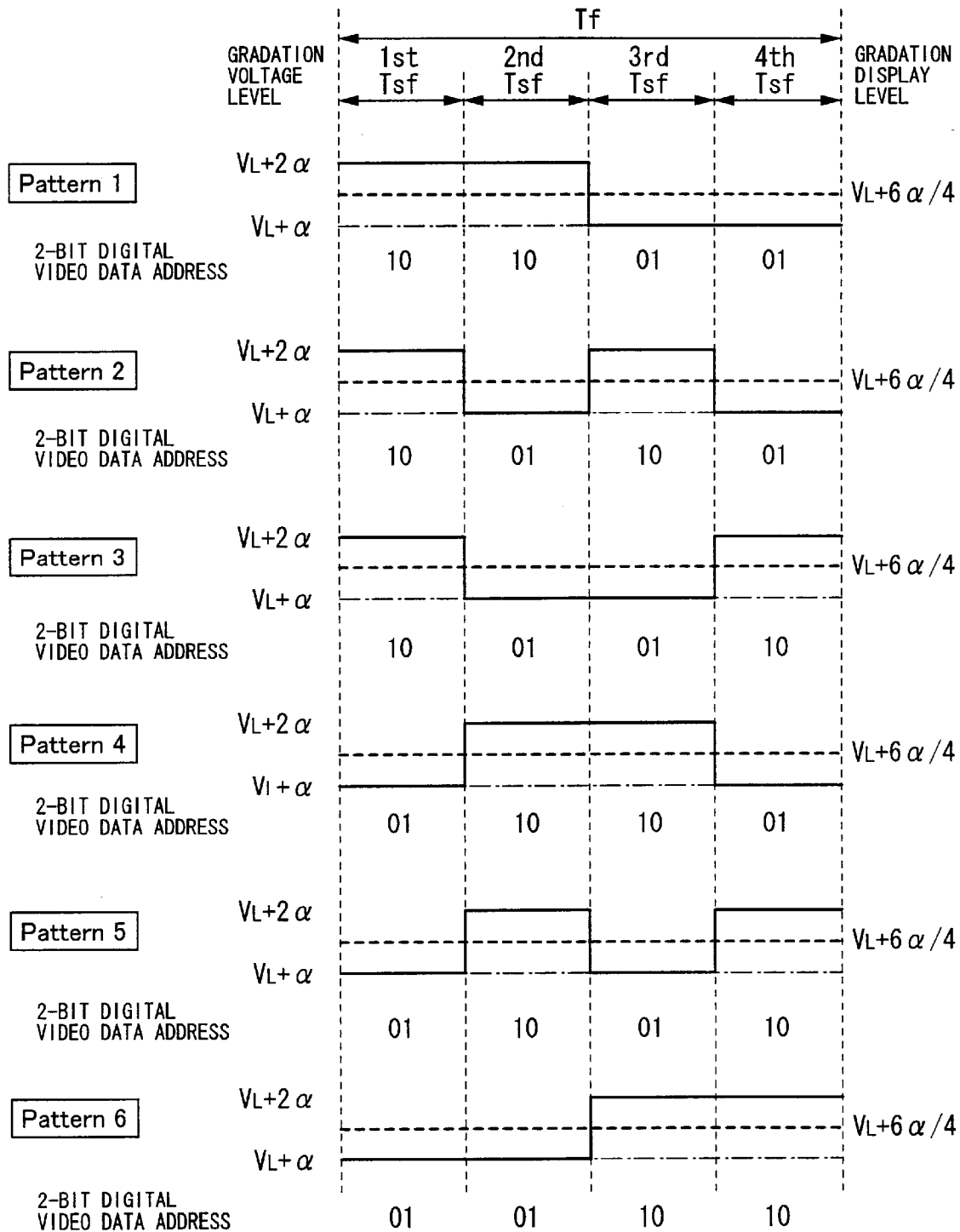
FIG. 11 is a timing chart showing the gradation voltage level that is to be outputted to a pixel, and the gradation display level, in an embodiment of the liquid crystal display device according to the present invention.

FIG. 11 is referred to next. When the externally inputted 4-bit digital video data address is (0110), the gradation voltage level, that is supplied to each pixel (pixel TFT) in each subframe line period (1st Tsfl, 2nd Tsfl, 3rd Tsfl, and 4th Tsfl) and then held during each subframe period (1st Tsf, 2nd Tsf, 3rd Tsf, and 4th Tsf) is shown by a solid line in FIG. 11, and the gradation display level is shown by a dotted line.

When the address of the externally inputted 4-bit digital video data is (0110), the digital video data time gradation processing circuit forms 2-bit digital video data (address (01) or (10)) and supplies this to the source driver of the active matrix type liquid crystal display device. As shown in FIG. 11, if the address of the externally inputted 4-bit digital video data is (0110), then the gradation voltage level $V_L+\alpha$ (address (01)) is supplied two times, and the gradation voltage level $V_L+2\alpha$ (address (10)) is supplied twice, in random order, to the corresponding pixel in each subframe line period and then held during each subframe period. When the address of the externally inputted 4-bit digital video data is (0110), the gradation voltage level pattern that is supplied to each pixel in. each subframe line period and then held during each subframe period has six patterns (Pattern 1, Pattern 2, Pattern 3, Pattern 4, Pattern 5, and Pattern 6), as is understood from FIG. 11. In each of the cases, the gradation display level becomes $V_L+6\alpha/4$.

Also, note that when the address of the externally inputted 4-bit digital video data is (0110), the gradation voltage level that is supplied to each pixel during each is subframe line period and then held during each subframe period is supplied at random by one of the six patterns (Pattern 1, Pattern 2, Pattern 3, Pattern 4, Pattern 5, and Pattern 6). Thus, a gradation display level corresponding to $V_L+\alpha/4$ can be realized. In addition, the gradation voltage is written to each pixel in each subframe line period without imbalance, and the generation of flicker can be reduced without increasing the frame frequency.

Figure 12:
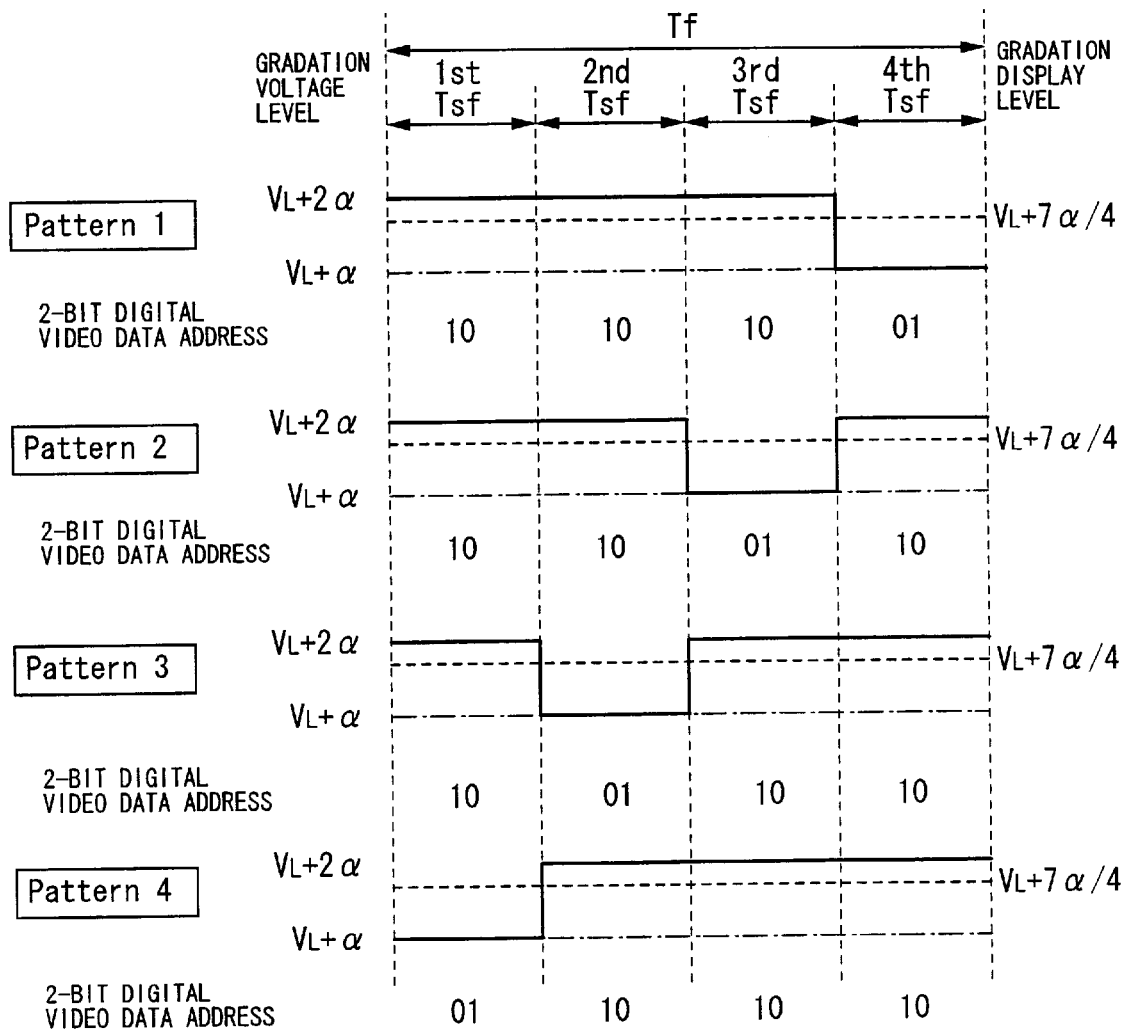
FIG. 12 is a timing chart showing the gradation voltage level that is to be outputted to a pixel, and the gradation display level, in an embodiment of the liquid crystal display device according to the present invention.

FIG. 12 is referred to next. When the externally inputted 4-bit digital video data address is (0111), the gradation voltage level that is supplied to each pixel (pixel TFT) in each subframe line period (1st Tsfl, 2nd Tsfl, 3rd Tsfl, and 4th Tsfl) and then held during each subframe period (1st Tsf, 2nd Tsf, 3rd Tsf, and 4th Tsf) is shown by a solid line in FIG. 12, and the gradation display level is shown by a dotted line.

When the address of the externally inputted 4-bit digital video data is (0111), the digital video data time gradation processing circuit forms 2-bit digital video data (address (01) or (10)) and supplies this to the source driver of the active matrix type liquid crystal display device. As shown in FIG. 12, if the address of the externally inputted 4-bit digital video data is (0111), then the gradation voltage level $V_L+\alpha$ (address (01)) is supplied one time, and the gradation voltage level $V_L+2\alpha$ (address (10)) is supplied three times, in random order, to the corresponding pixel in each subframe line period and then held during each subframe period. When the address of the externally inputted 4-bit digital video data is (0111), the gradation voltage level pattern that is supplied to each pixel in each subframe line period and then held during each subframe period has four patterns (Pattern 1, Pattern 2, Pattern 3, and Pattern 4), as is understood from FIG. 12. In each of the cases, the gradation display level becomes $V_L+7\alpha/4$.

Also, note that when the address of the externally inputted 4-bit digital video data is (0111), the gradation voltage level that is supplied to each pixel during each subframe line period and then held during each subframe period is supplied at random by one of the four patterns (Pattern 1, Pattern 2, Pattern 3, and Pattern 4). Thus, a gradation display level corresponding to $V_L+7\alpha/4$ can be realized. In addition, the gradation voltage is written to each pixel in each subframe line period without imbalance, and the generation of flicker can be reduced without increasing the frame frequency.

Similarly, cases where the address of the externally inputted 4-bit digital video data is (1000), (1001), (1010), and (1011) are explained below.

Figure 13:
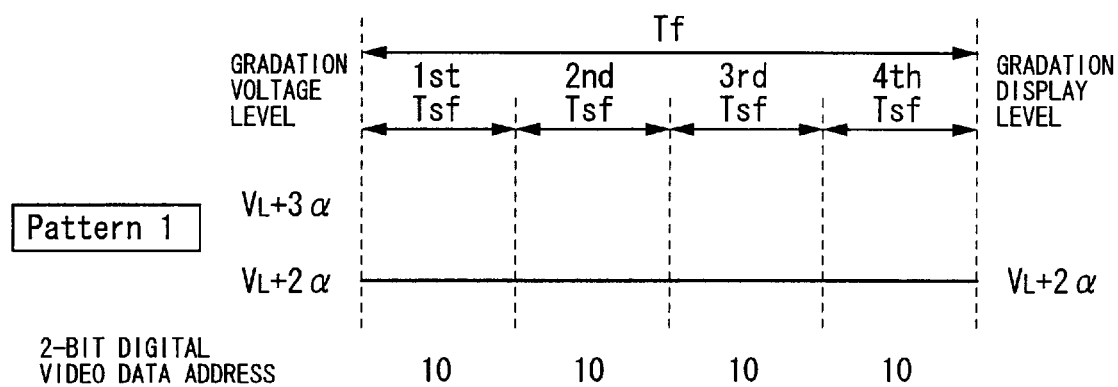
FIG. 13 is a timing chart showing the gradation voltage level that is to be outputted to a pixel, and the gradation display level, in an embodiment of the liquid crystal display device according to the present invention.

FIG. 13 is referred to. When the externally inputted 4-bit digital video data address is (1000), the gradation voltage level that is supplied to each pixel (pixel TFT) in each subframe line period (1st Tsfl, 2nd Tsfl, 3rd Tsfl, and 4th Tsfl) and then held during each subframe period (1st Tsf, 2nd Tsf, 3rd Tsf, and 4th Tsf) is shown by a solid line in FIG. 13, and the gradation display level is shown by a dotted line.

The digital video data time gradation processing circuit forms 2-bit digital video data based on the externally inputted 4-bit digital video data. When the address of the externally inputted 4-bit digital video data is (1000), the digital video data time gradation processing circuit forms 2-bit digital video data (address (10)) and supplies this to the source driver of the active matrix type liquid crystal display device. As shown in FIG. 13, if the address of the externally inputted 4-bit digital video data is (1000), then the gradation voltage level $V_L+2\alpha$ (address (01)) is supplied to each corresponding pixel in each subframe line period (1st Tsfl, 2nd Tsfl, 3rd Tsfl, and 4th Tsfl) and then held during each subframe period (1st Tsf, 2nd Tsf, 3rd Tsf, and 4th Tsf). When the address of the externally inputted 4-bit digital video data is (1000), the gradation voltage level pattern that is supplied to each subframe line period (1st Tsfl, 2nd Tsfl, 3rd Tsfl, and 4th Tsfl) and then held during each subframe period (1st Tsf, 2nd Tsf, 3rd Tsf, and 4th Tsf) has only one pattern (Pattern 1), as shown in FIG. 13. Therefore, the gradation display level becomes $V_L+2\alpha$.

Figure 14:
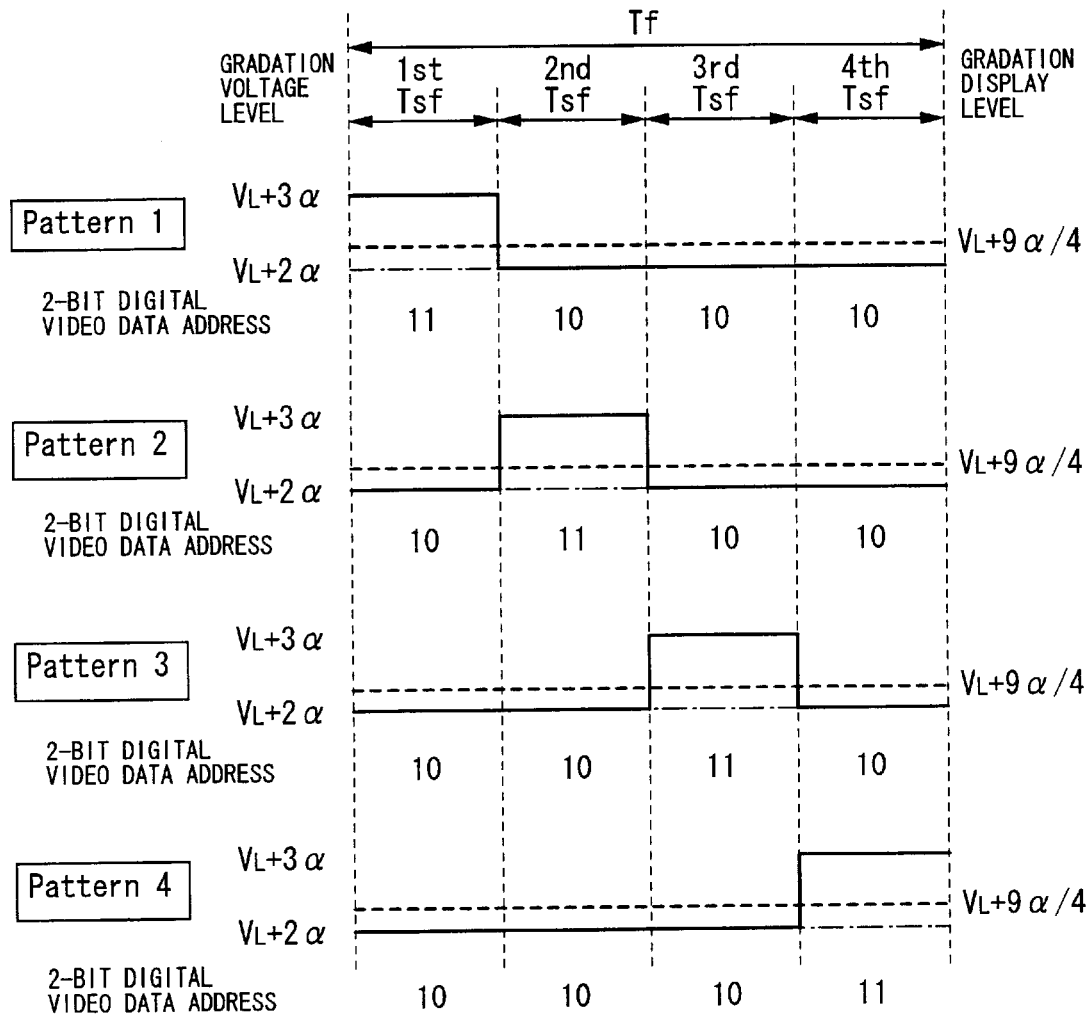
FIG. 14 is a timing chart showing the gradation voltage level that is to be outputted to a pixel, and the gradation display level, in an embodiment of the liquid crystal display device according to the present invention.

FIG. 14 is referred to next. When the externally inputted 4-bit digital video data address is (1001), the gradation voltage level that is supplied to each pixel (pixel TFT) in each subframe line period (1st Tsfl, 2nd Tsfl, 3rd Tsfl, and 4th Tsfl) and then held during each subframe period (1 st Tsf, 2nd Tsf, 3rd Tsf, and 4th Tsf) is shown by a solid line in FIG. 14, and the gradation display level is shown by a dotted line.

When the address of the externally inputted 4-bit digital video data is (1001), the digital video data time gradation processing circuit forms 2-bit digital video data (address (10) or (11)) and supplies this to the source driver of the active matrix type liquid crystal display device. As shown in FIG. 14, if the address of the externally inputted 4-bit digital video data is (1001), then the gradation voltage level $V_L+2\alpha$ (address (10)) is supplied three times, and the gradation voltage level $V_L+3\alpha$ (address (11)) is supplied once, in random order, to the corresponding pixel in each subframe line period and then held during each subframe period. When the address of the externally inputted 4-bit digital video data is (1001), the gradation voltage level pattern that is supplied to each pixel in each subframe line period and then held during each subframe period has four patterns (Pattern 1, Pattern 2, Pattern 3, and Pattern 4), as is understood from FIG. 10. In each of the cases, the gradation display level becomes $V_L+9\alpha/4$.

Note that when the address of the externally inputted 4-bit digital video data is (1001), the gradation voltage level that is supplied to each pixel during each subframe line period and then held during each subframe period is outputted at random by one of the four patterns (Pattern 1, Pattern 2, Pattern 3, and Pattern 4). Thus, a gradation display level corresponding to $V_L+9\alpha/4$ can be realized. In addition, the gradation voltage is written to each pixel in each subframe line period without imbalance, and the generation of flicker can be reduced without increasing the frame frequency.

Figure 15:
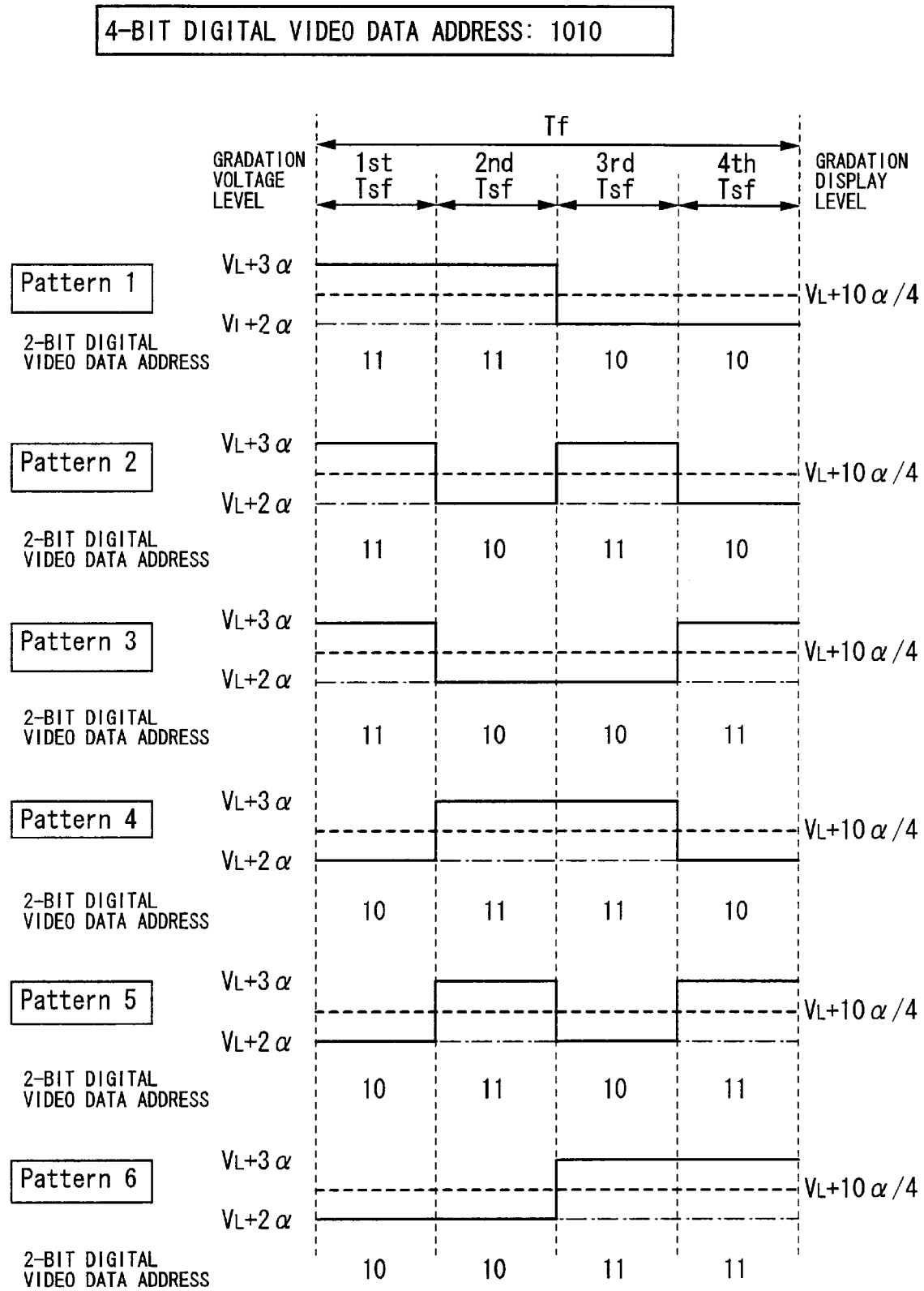
FIG. 15 is a timing chart showing the gradation voltage level that is to be outputted to a pixel, and the gradation display level, in an embodiment of the liquid crystal display device according to the present invention.

FIG. 15 is referred to next. When the externally inputted 4-bit digital video data address is (1010), the gradation voltage level that is supplied to each pixel (pixel TFT) in each subframe line period (1st Tsfl, 2nd Tsfl, 3rd Tsfl, and 4th Tsfl) and then held during each subframe period (1st Tsf, 2nd Tsf, 3rd Tsf, and 4th Tst) is shown by a solid line in FIG. 15, and the gradation display level is shown by a dotted line.

When the address of the externally inputted 4-bit digital video data is (1010), the digital video data time gradation processing circuit forms 2-bit digital video data (address (10) or (11)) and supplies this to the source driver of the active matrix type liquid crystal display device. As shown in FIG. 15, if the address of the externally inputted 4-bit digital video data is (1010), then the gradation voltage level $V_L+2\alpha$ (address (10)) is supplied two times, and the gradation voltage level $V_L+3\alpha$ (address (11)) is supplied twice, in random order, to the corresponding pixel in each subframe line period and then held during each subframe period. When the address of the externally inputted 4-bit digital video data is (1010), the gradation voltage level pattern that is supplied to each pixel in each subframe line period and then held during each subframe period has six patterns (Pattern 1, Pattern 2, Pattern 3, Pattern 4, Pattern 5, and Pattern 6), as is understood from Fir. 15. In each of the cases, the gradation display level becomes $V_L+10\alpha/4$.

Also, when the address of the externally inputted 4-bit digital video data is (1010), the gradation voltage level that is supplied to each pixel during each subframe line period and then held during each subframe period is outputted at random by one of the six patterns (Pattern 1, Pattern 2, Pattern 3, Pattern 4, Pattern 5, and Pattern 6). Thus, a gradation display level corresponding to $V_L+10\alpha/4$ can be realized. In addition, the gradation voltage is written to each pixel in each subframe line period without imbalance, and the generation of flicker can be reduced without increasing the frame frequency.

Figure 16:
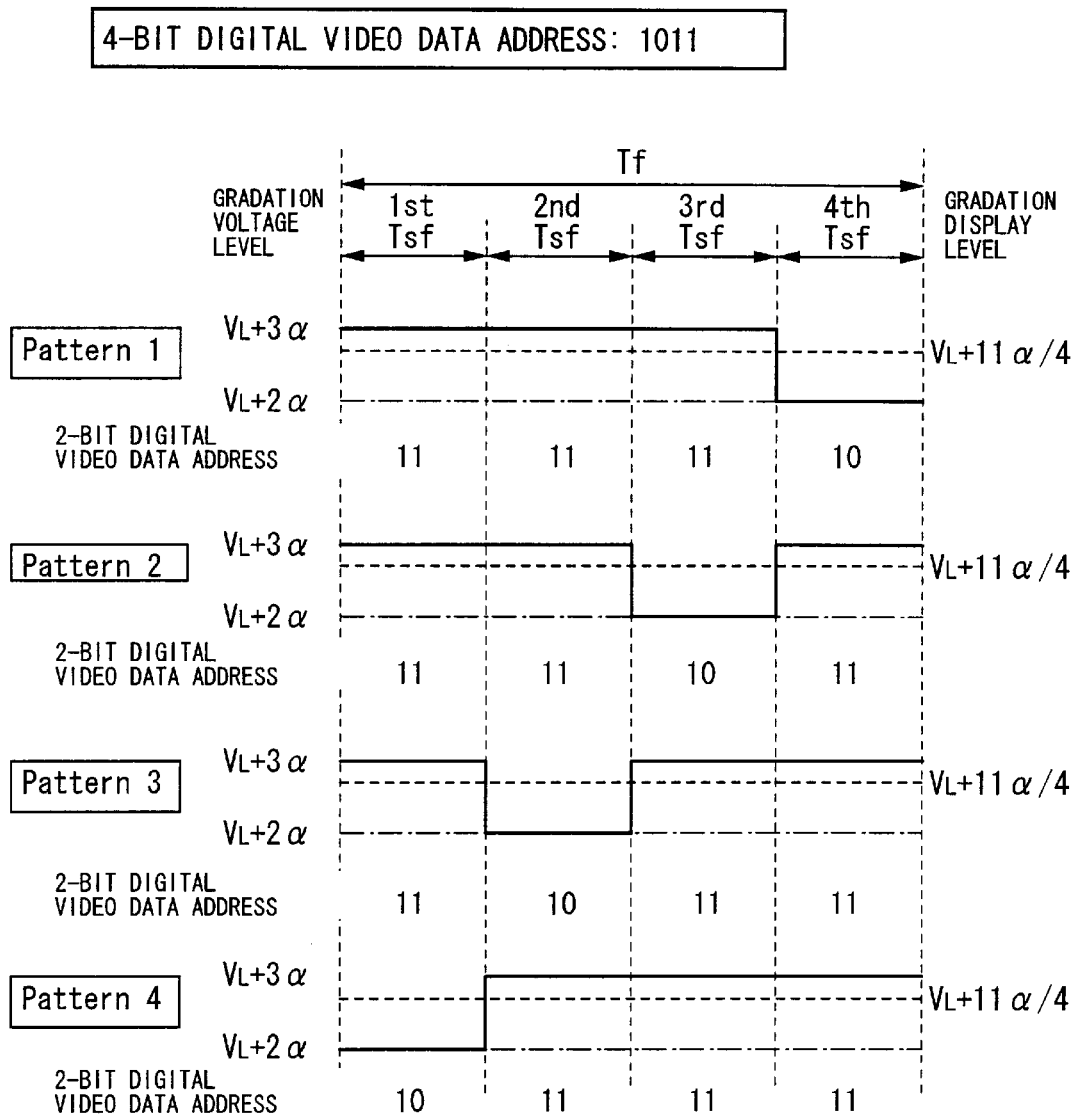
FIG. 16 is a timing chart showing the gradation voltage level that is to be outputted to a pixel, and the gradation display level, in an embodiment of the liquid crystal display device according to the present invention.

FIG. 16 is referred to next. When the externally inputted 4-bit digital video data address is (1011), the gradation voltage level that is supplied to each pixel (pixel TFT) in each subframe line period (1st Tsfl, 2nd Tsfl, 3rd Tsfl, and 4th Tsfl) and then held during each subframe period (1st Tsf, 2nd Tsf, 3rd Tsf, and 4th Tsf) is shown by a solid line in FIG. 16, and the gradation display level is shown by a dotted line.

When the address of the externally inputted 4-bit digital video data is (1011), the digital video data time gradation processing circuit forms 2-bit digital video data (address (10) or (11)) and supplies this to the source driver of the active matrix type liquid crystal display device. As shown in FIG. 16, if the address of the externally inputted 4-bit digital video data is (1011), then the gradation voltage level $V_L+2\alpha$ (address (10)) is supplied one time, and the gradation voltage level $V_L+3\alpha$ (address (11)) is supplied three times, in random order, to the corresponding pixel in each subframe line period and then held during each subframe period. When the address of the externally inputted 4-bit digital video data is (1011), the gradation voltage level pattern that is supplied to each pixel in each subframe line period and then held during each subframe period has four patterns (Pattern 1, Pattern 2, Pattern 3, and Pattern 4) as is understood from FIG. 16. In each of the cases, the gradation display level becomes $V_L+11\alpha/4$.

Also, when the address of the externally inputted 4-bit digital video data is (1011), the gradation voltage level that is supplied to each pixel during each subframe line period and then held during each subframe period is outputted at random by one of the four patterns (Pattern 1, Pattern 2, Pattern 3, and Pattern 4). Thus, a gradation display level corresponding to $V_L+11\alpha/4$ can be realized. In addition, the gradation voltage is written to each pixel in each subframe line period without imbalance, and the generation of flicker can be reduced without increasing the frame frequency.

Figure 17:
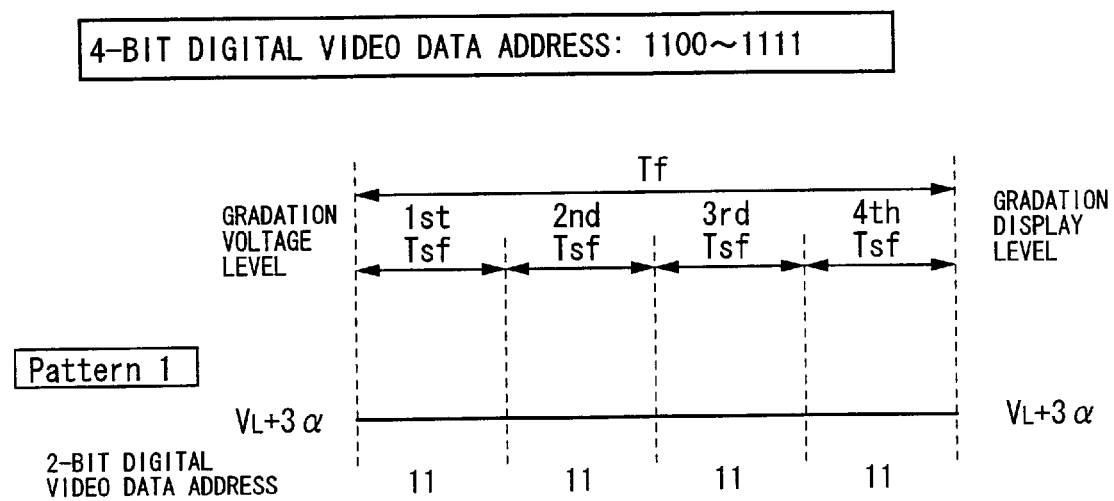
FIG. 17 is a timing chart showing the gradation voltage level that is to be outputted to a pixel, and the gradation display level, in an embodiment of the liquid crystal display device according to the present invention.

FIG. 17 is referred to next. When the externally inputted 4-bit digital video data address is from (1100) to (1111), the gradation voltage level that is supplied to each pixel (pixel TFT) in each subframe line period (1st Tsfl, 2nd Tsfl, 3rd Tsfl, and 4th Tsfl) and then held during each subframe period (1st Tsf, 2nd Tsf, 3rd Tsf, and 4th Tsf) is shown by a solid line in FIG. 17.

The digital video data time gradation processing circuit forms 2-bit digital video data based on the externally inputted 4-bit digital video data. When the address of the externally inputted 4-bit digital video data is from (1100) to (1111), the digital video data time gradation processing circuit forms 2-bit digital video data (address (11)) and supplies this to the source driver of the active matrix type liquid crystal display device. As shown in FIG. 17, if the address of the externally inputted 4-bit digital video data is from (1100) to (1111), then the gradation voltage level $V_L+3\alpha$ (address (11)) is supplied to each corresponding pixel in each subframe line period (1st Tsfl, 2nd Tsfl, 3rd Tsfl, and 4th Tsfl) and then held during each subframe period (1st Tsf, 2nd Tsf, 3rd Tsf, and 4th Tsf). When the address of the externally inputted 4-bit digital video data is from (1100) to (1111), the gradation voltage level pattern that is supplied to each subframe line period (1st Tsfl, 2nd Tsfl, 3rd Tsfl, and 4th Tsfl) and then held during each subframe period (1st Tsf, 2nd Tsf, 3rd Tsf, and 4th Tsf) has only one pattern (Pattern 1), as shown in FIG. 17. Therefore, the gradation display level becomes $V_L+3\alpha$.

Figure 18:
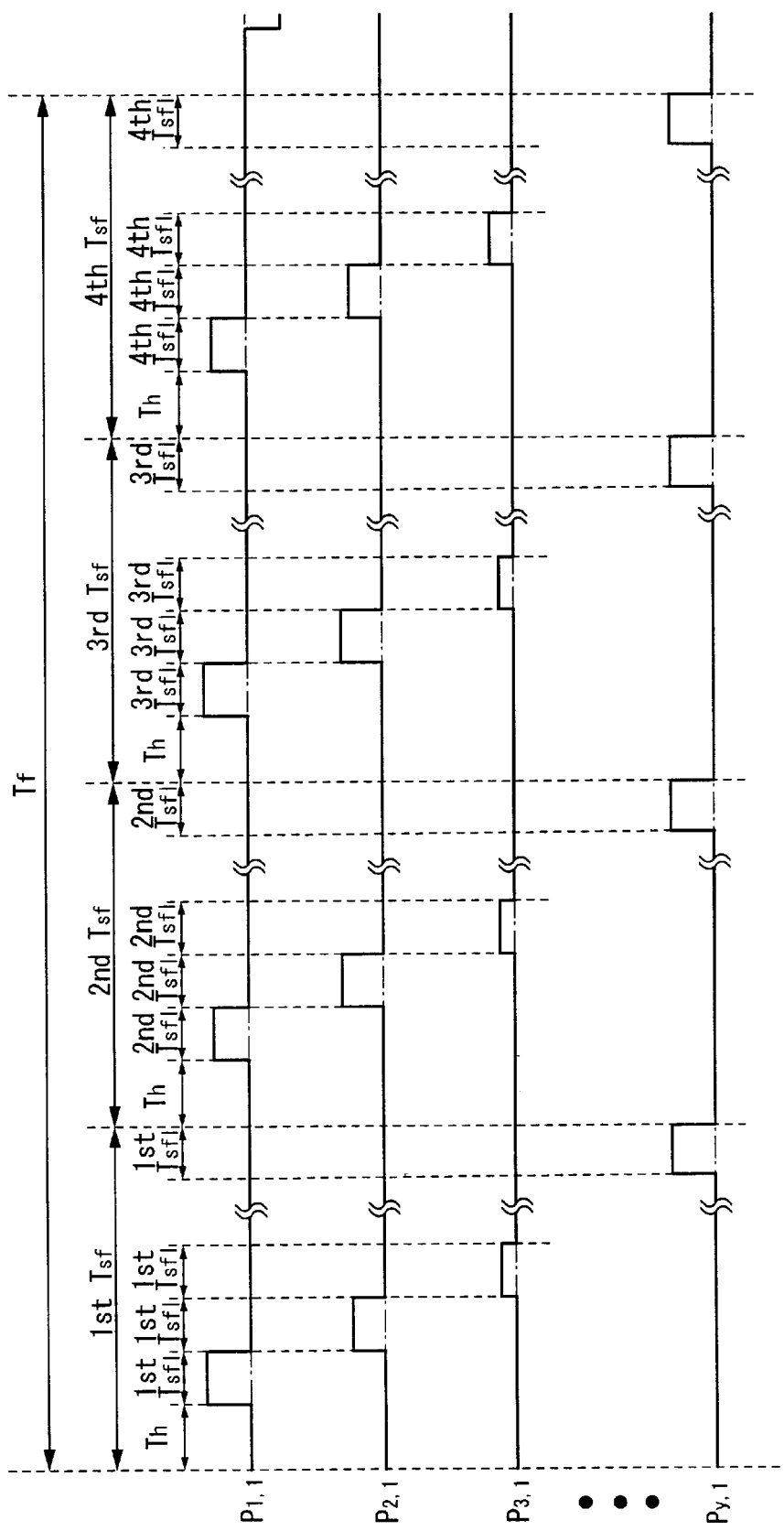
FIG. 18 is a diagram showing a driver timing chart of an embodiment of the liquid crystal display device according to the present invention.
Figure 19:
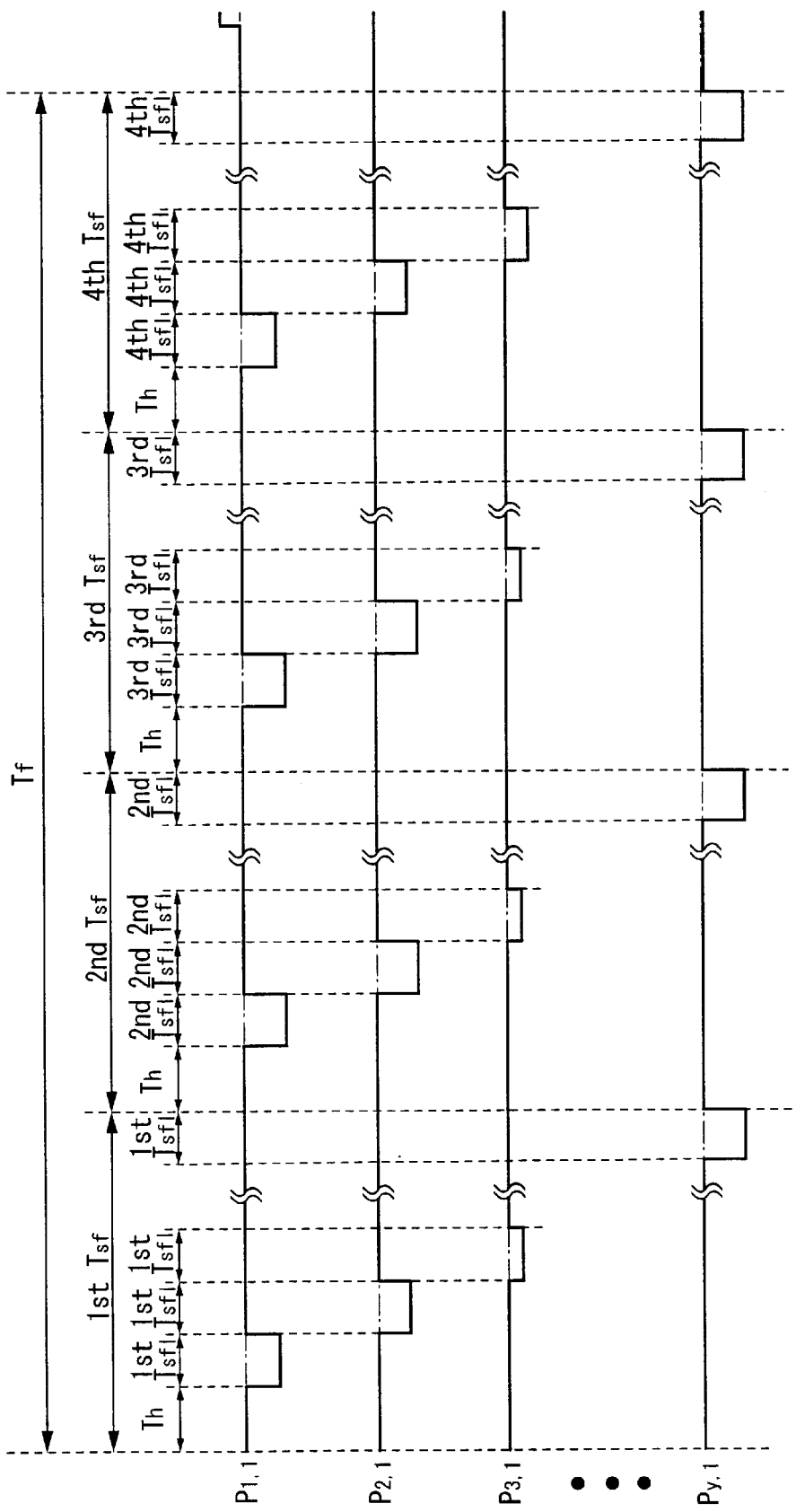
FIG. 19 is a diagram showing a driver timing chart of an embodiment of the liquid crystal display device according to the present invention.

FIGS. 18 and 19 are referred to here. Driver timing charts for the liquid crystal display device of the present embodiment is shown in FIGS. 18 and 19. A pixel $P_{1,1}$, a pixel $P_{2,1}$, a pixel $P_{3,1}$, and a pixel $P_{y,1}$, are taken as examples and shown in FIGS. 18 and 19. Note that FIGS. 18 and 19 are temporally successive timing charts, and that they are divided into two figures for convenience.

Similar to the above, one frame period (Tf) is formed by the first subframe period (1st Tsf), the second subframe period (2nd Tsf), the third subframe period (3rd Tsf), and the fourth subframe period (4th Tsf). AT the start of each subframe period there is a horizontal retrace line period (Th).

During the first subframe period (1st Tsf), 2-bit digital video data corresponding to the first subframe line period (1st Tsfl) is converted into analog gradation voltages by the D/A converter circuit and written to the pixels $P_{1,1}$ to $P_{1,x}$.

After the digital video data is converted into analog gradation voltages by the D/A converter circuit and written to the pixels $P_{1,1}$, to $P_{1,x}$, in the next subframe line period, digital video data is converted into analog gradation voltages by the D/A converter circuit and written to the pixels $P_{2,1}$ to $P_{2,x}$.

In this way, analog gradation voltages containing image information are written in order to all of the pixels. The first subframe period is thus completed.

The second subframe period then begins after the first subframe period has elapsed. After the horizontal retrace line period Th, digital video data corresponding to the second subframe line period (2nd Tsfl) is also converted into analog gradation voltages by the D/A converter circuit and written to the pixels $P_{1,1}$ to $P_{1,x}$ in the second subframe period (2nd Tsf). After the digital video data is converted into analog gradation voltages by the D/A converter circuit and written to the pixels $P_{1,1}$ to $P_{1,x}$, in the next subframe line period, digital video data is converted into analog gradation voltages by the D/A converter circuit and written to the pixels $P_{2,1}$ to $P_{2,x}$.

In this way, analog gradation voltages containing image information are written in order to all of the pixels. The second subframe period is thus completed.

Similar operations are performed for the third subframe period (3rd Tsf) and for the fourth subframe period (4th Tsf).

The first subframe period through the fourth subframe period are thus completed.

The second frame period begins after completion of the first frame period (see FIG. 19). Frame inversion, in which the direction of the electric field applied to the liquid crystal changes every frame, is performed in the present embodiment.

Figure 20:
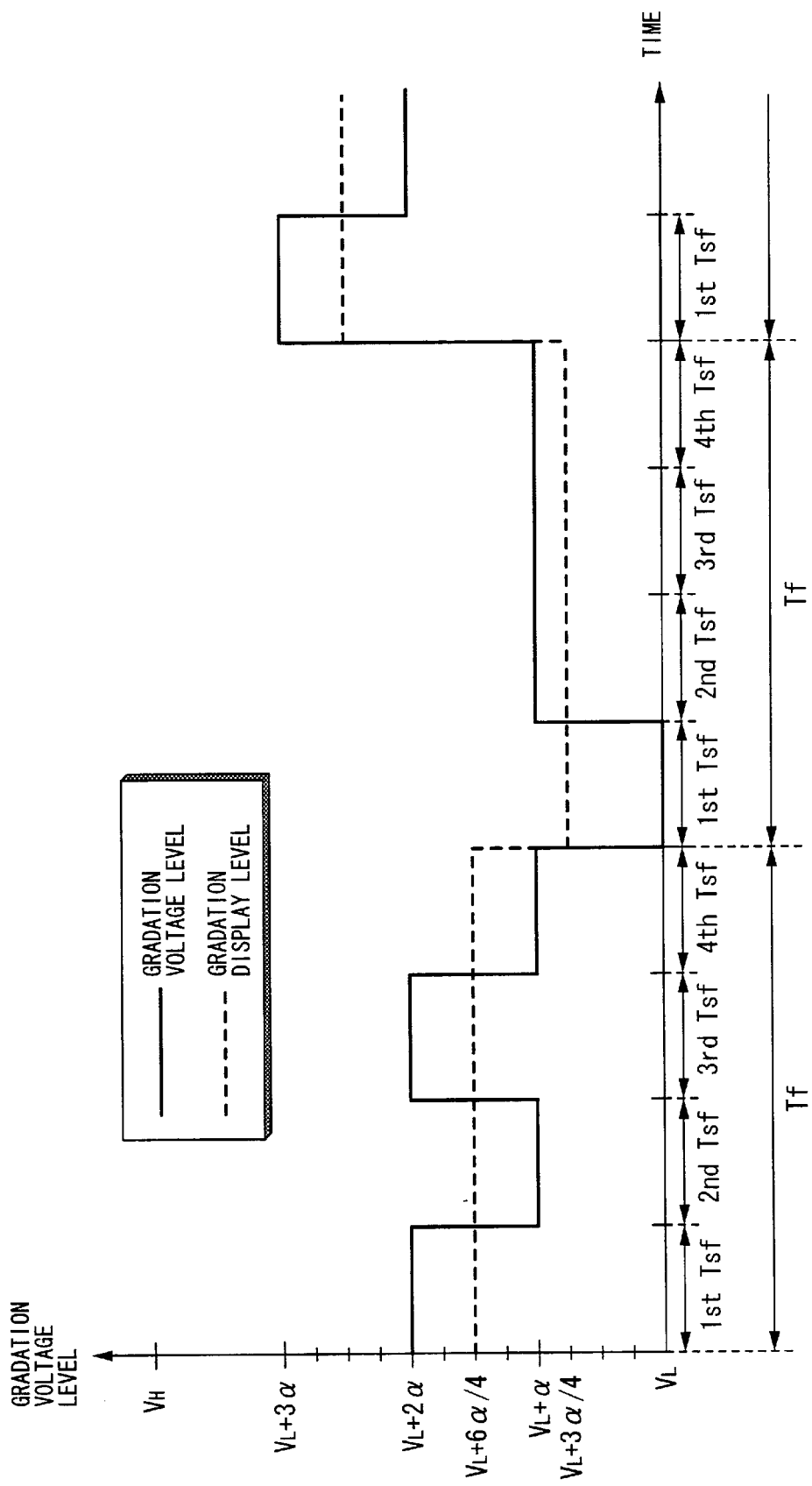
FIG. 20 is a diagram showing a driver timing chart of an embodiment of the liquid crystal display device according to the present invention.

FIG. 20 is referred to here. FIG. 20 is an example showing the relationship between the gradation voltage level written per subframe to the pixel electrode of a certain pixel (for example, the pixel $P_{1,1}$), and the gradation display level in the frame period.

The first frame period is observed initially. Digital data with the externally inputted 4-bit data address of (0110) is supplied in the first frame period. When the address of the above 4-bit digital video data is (0110) during the first frame. Pattern 2 is outputted. The $V_L+2\alpha$ gradation voltage is written into in the first subframe line period (1st Tsfl), and stored during the first subframe period (1st Tsf), and gradation display corresponding to the gradation voltage $V_L+2\alpha$ is performed. During the second subframe line period (2nd Tsfl), $V_L+\alpha$ gradation voltages are written, and gradation display corresponding to $V_L+\alpha$ is performed during the second subframe period (2nd Tsf). In the third subframe line period (3rd Tsfl), $V_L+2\alpha$ gradation voltages are written, and gradation display corresponding to $V_L+2\alpha$ is performed in the third subframe period (3rd Tsf). In the fourth subframe line period (4th Tsfl), $V_L+\alpha$ gradation voltages are written, and gradation display corresponding to $V_L+\alpha$ is performed during the fourth subframe period (4th Tsf). The gradation display level of the first frame thus becomes a gradation display corresponding to the gradation voltage level $V_L+6\alpha/4$.

The second frame period is observed next. Digital data with the externally inputted 4-bit data address of (0011) is supplied in the second frame period. When the address of the above 4-bit digital video data is (0011) during the first frame, Pattern 4 is outputted. The $V_L$ gradation voltage is written into in the first subframe line period (1st Tsfl), and gradation display corresponding to the gradation voltage $V_L$ is performed during the first subframe period (1st Tsf). During the second subframe line period (2nd Tsfl), $V_L+\alpha$ gradation voltages are written, and gradation display corresponding to $V_L+\alpha$ is performed during the second subframe period (2nd Tsf). In the third subframe line period (3rd Tsfl), $V_L+\alpha$ gradation voltages are written, and gradation display corresponding to $V_L+\alpha$ is performed in the third subframe period (3rd Tsf). In the fourth subframe line period (4th Tsfl), $V_L+\alpha$ gradation voltages are written, and gradation display corresponding to $V_L+\alpha$ is performed during the fourth subframe period (4th Tsf). The gradation display level of the second frame thus becomes a gradation display corresponding to the gradation voltage level $V_L+3\alpha/4$.

Note that the display example shown in FIG. 20 is only one example, and the determination of which pattern to be outputted corresponding to the inputted 4-bit digital video data is performed randomly.

In addition, although the voltage level between the voltage level $V_H$ and the voltage level $V_L$ is divided into nearly equal voltage levels, taking the equal voltage as a step a in the present embodiment, the present invention can also be applied to cases which are set intentionally without dividing the voltage level between $V_H$ and $V_L$ into nearly equal voltage levels in order to realize four gradation voltage levels.

Further, although the gradation voltage level can be realized by inputting the voltage level $V_H$ and the voltage level $V_L$ into the D/A converter circuit of the liquid crystal panel in this embodiment, the gradation voltage level can also be realized by inputting three or more voltage levels.

Furthermore, in the present embodiment the digital video data for the 2-bit voltage gradation is formed based on the externally inputted 4-bit digital video data, and of the four bits of digital video data, two bits of gradation information are realized by time gradation. In general here, this can be considered as a case of externally inputted m-bit digital video data being converted by the time gradation processing circuit into n-bit digital video data for gradation voltages, and (m−n) bit gradation information being realized by time gradation. Note that m and n are both integers greater than or equal to 2 (m>n).

In this case, the relationship between the frame period (Tf) and the subframe period (Tsf) becomes:

$$Tf=2^{m-n} \cdot Tsf,$$

and $(2^m-(2^{m-n}-1))$ gradation displays can be performed.

Note that the case of m=4 and n=2 is taken as an example and explained in the present embodiment, but of course there is no need to place any limits on this. A case of m=12 and n=4 is fine, as is a case of m=8 and n=2. Further, m=8 and n=6, and m=10 and n=2 are also good, and cases other than these are acceptable.

Note that the gradation voltage level may be the actual voltage applied to the liquid crystal. In other words, the gradation voltage level may be set to a voltage level in consideration of a voltage $V_{COM}$ applied to the opposing electrode.

Embodiment 2

An explanation of a case of performing frame inversion driving for each subframe in the structure of the liquid crystal display device of embodiment 1 of the present invention is given in embodiment 2.

Figure 21:
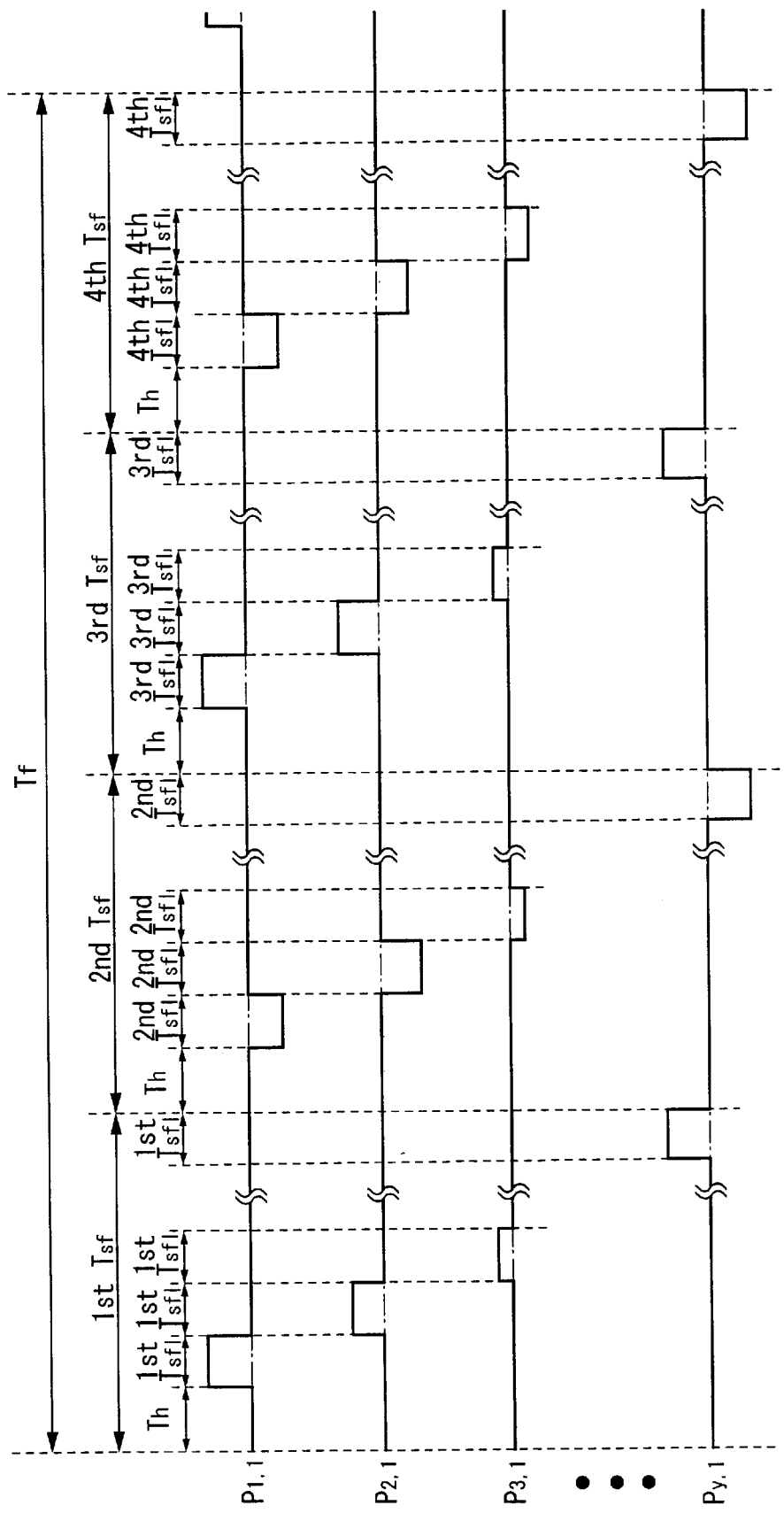
FIG. 21 is a diagram showing a driver timing chart of an embodiment of the liquid crystal display device according to the present invention.

FIG. 21 is referred to. A driver timing chart of the liquid crystal display device of embodiment 2 is shown in FIG. 21. A pixel $P_{1,1}$, a pixel $P_{2,1}$, a pixel $P_{3,1}$, and a pixel $P_{y,1}$, are taken as examples and shown FIG. 21.

In embodiment 2 as well, one frame period (Tf) is formed by a first subframe period (1st Tsf), a second subframe period (2nd Tsf), a third subframe period (3rd Tsf), and a fourth subframe period (4th Tsf), similar to the above. At the start of each subframe period there is a horizontal retrace line period (Th).

During the first frame period, after the horizontal retrace line period Th, digital video data in the first subframe line period (1st Tsfl) is converted into analog gradation voltages by the D/A converter circuit and written to the pixel $P_{1,1}$. Note that analog gradation voltages corresponding to each of the respective pixels $P_{1,1}$ to $P_{1,x}$ are written at the same time.

After the digital video data is converted into analog gradation voltages by the D/A converter circuit and written to the pixels $P_{1,1}$ to $P_{1,x}$, in the next subframe period digital video data is converted into analog gradation voltages by the D/A converter circuit and written to the pixels $P_{2,1}$ to $P_{2,x}$.

In this way, analog gradation voltages containing image information are written in order to all of the pixels. The first subframe period is thus completed.

The second subframe period then begins after the first subframe period has elapsed. After the horizontal retrace line period Th, in the second subframe line period (2nd Tsfl), digital video data is also converted into analog gradation voltages by the D/A converter circuit and written to the pixels $P_{1,1}$ to $P_{1,x}$ in the second subframe period (2nd Tsf). As shown in the figure, the voltages written in the second subframe period are voltages in which the electric field direction is reversed from that of the voltage written in the first subframe period. After the digital video data is converted into analog gradation voltages by the D/A converter circuit and written to the pixels $P_{1,1}$ to $P_{1,x}$, in the next subframe period digital video data is converted into analog gradation voltages by the D/A converter circuit and written to the pixels $P_{2,1}$ to $P_{2,x}$.

In this way, analog gradation voltages containing image information are written in order to all of the pixels. The second subframe period is thus completed.

Similar operations are performed for the third subframe period (3rd Tsf) and for the fourth subframe period (4th Tsf).

The first subframe period through the fourth subframe period are thus completed.

The second frame period begins after completion of the first frame period (not shown in the figure).

Display is thus performed in embodiment 2 by subframe inversion in which the direction of the electric field applied to the liquid crystal is reversed every subframe, and therefore a display having very little flicker is possible.

Embodiment 3

Figure 22:
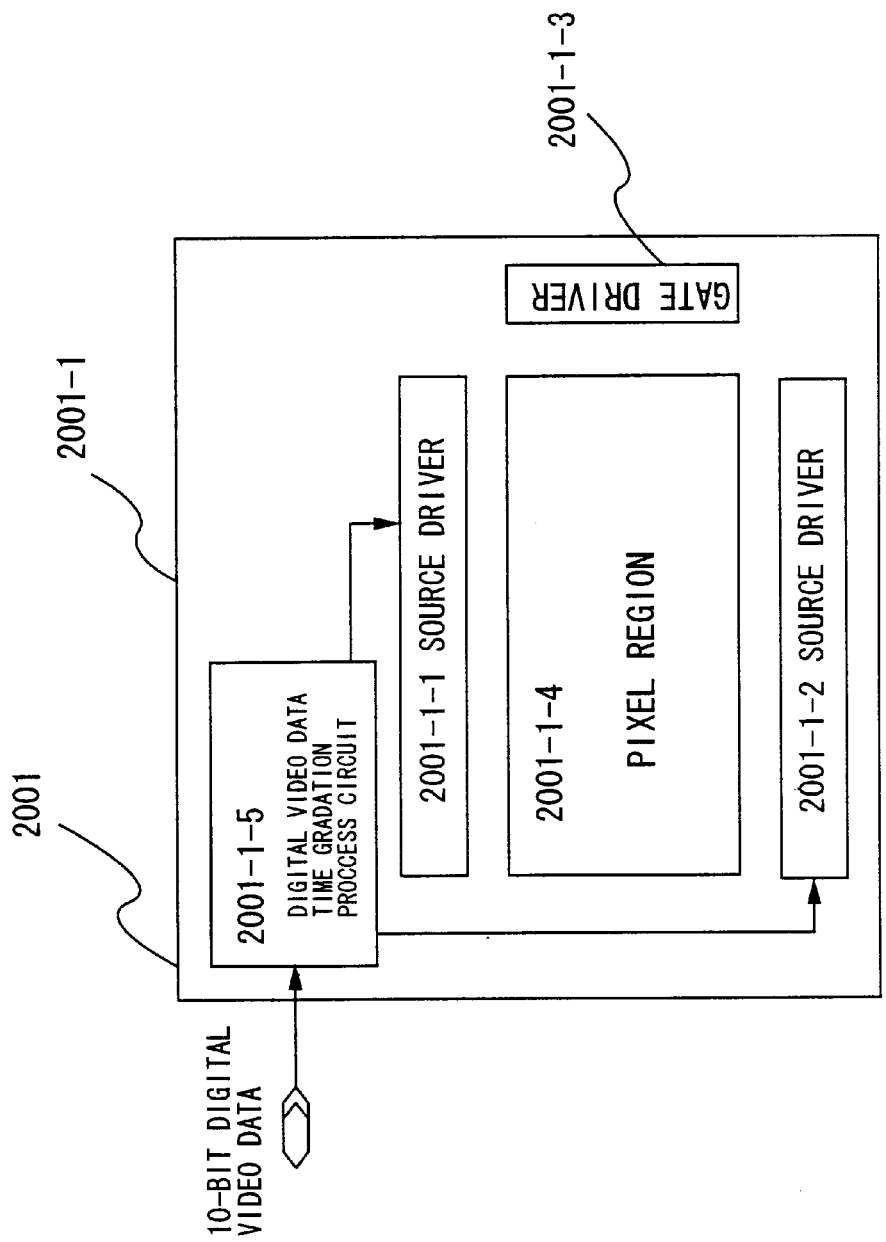
FIG. 22 is a schematic structure diagram of an embodiment of the liquid crystal display device according to the present invention.

An explanation is given in embodiment 3 of a liquid crystal display device in which 10-bit digital video data is inputted. FIG. 22 is referred to. A schematic structure diagram of the liquid crystal display device of embodiment 3 is shown in FIG. 22. A liquid crystal panel 2001 has an active matrix substrate 2001-1 and an opposing substrate (not shown in the figure). The active matrix substrate 2001-1 has source drivers 2001-1-1- and 2001-1-2, a gate driver 2001-1-3, a pixel region 2001-1-4 in which a plural number of pixel TFTs are arranged in a matrix shape, and a digital video data time gradation processing circuit 2001-1-5. Further, the opposing substrate has an opposing electrode.

As shown in FIG. 22, in embodiment 3, the pixel region, the drivers, and the digital video data time gradation processing circuit are integrated and formed on the active matrix substrate, and the liquid crystal display device is formed as an entire structure.

The digital video data time gradation processing circuit 2001-1-5 converts four pieces of serial 8-bit digital video data based on externally inputted 10-bit digital video data. Of the eight bits of digital video data, two bits of gradation information are displayed by time gradation. Note that the random output of the four pieces of 8-bit digital video data is similar to the above stated explanation of embodiment 1.

The four pieces of 8-bit digital video data converted by the digital video data time gradation processing circuit 2001-1-5 is inputted in random order to the source drivers 2001-1-1 and 2001-1-2, converted into analog gradation voltages by a D/A converter circuit (not shown in the figure) inside the source drivers, and supplied to each source signal line.

Figure 23:
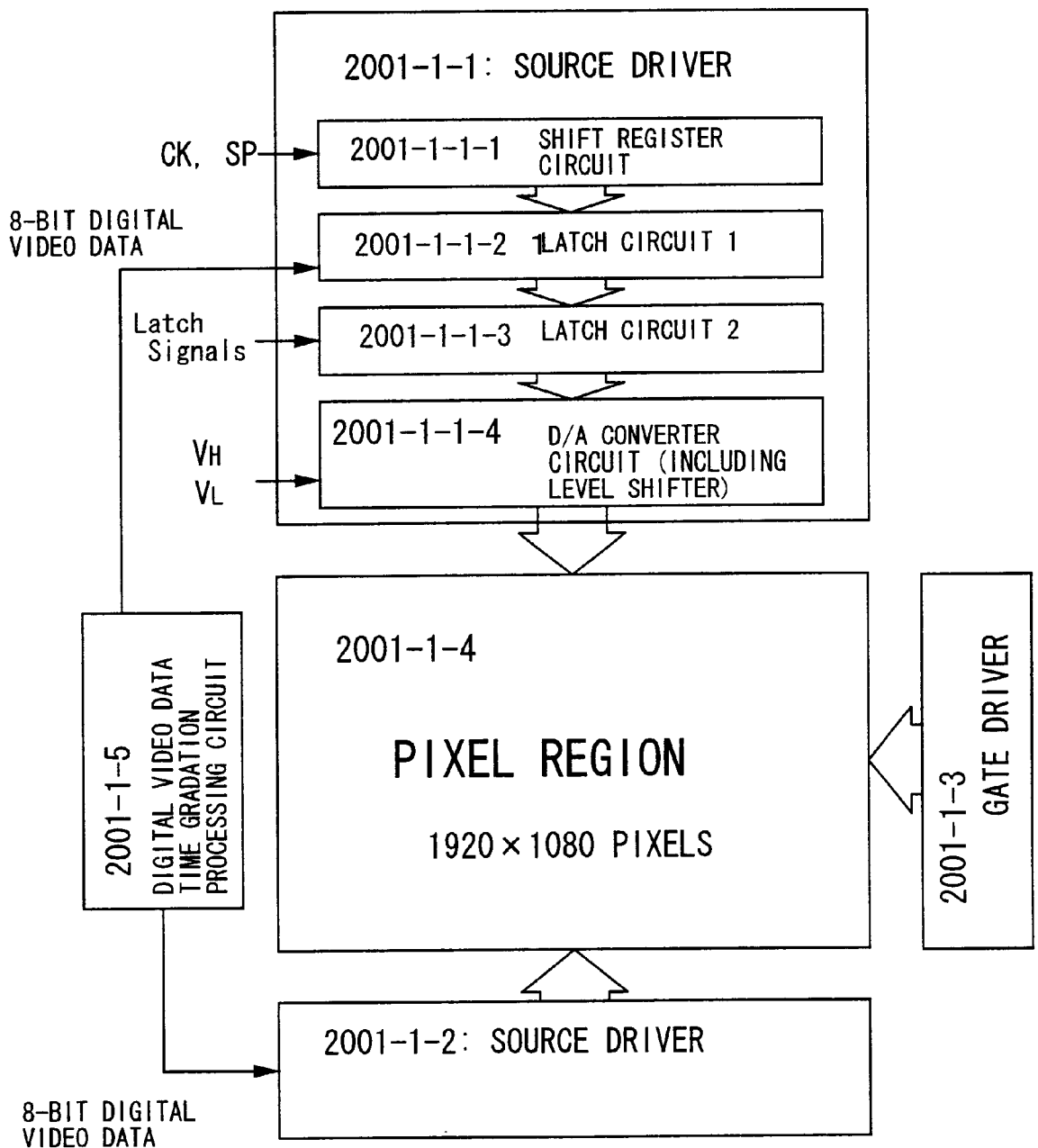
FIG. 23 is a circuit structure diagram of the pixel region, the source driver, and the gate driver of an embodiment of the liquid crystal display device according to the present invention.

FIG. 23 is referred to here. FIG. 23 shows a very detailed circuit structure of the liquid crystal display device of embodiment 3. The source driver 2001-1-1 has a shift register circuit 2001-1-1-1, a latch circuit 1 (2001-1-1-2), a latch circuit 2 (2001-1-1-3), and a D/A converter circuit 2001-1-1-4. In addition, the source driver 2001-1-1 has a buffer circuit and a level shifter circuit (neither shown in the figure). Further, a level shifter circuit is included in the D/A converter circuit 2001-1-1-4 for convenience of explanation.

The source driver 2001-1-2 has the same structure as the source driver 2001-1-1. Note that the source driver 2001-1-1 supplies gradation voltages to the odd numbered source signal lines, and that the source driver 2001-1-2 supplies gradation voltages to the even numbered source signal lines.

Note that the two source drivers 2001-1-1 and 2001-1-2 are formed sandwiching the pixel region from above and below in the active matrix type liquid crystal display device of embodiment 3, for convenience of circuit layout, but only one source driver may be formed, provided that circuit layout is possible.

Further, reference numeral 2001-1-3 denotes the gate driver, which has circuits such as a shift register circuit, a buffer circuit, and a level shifter circuit (none shown in the figure).

The pixel region 2001-1-4 has 1920×1080 (horizontal× vertical) pixels. The structure of each pixel is similar to that explained above in embodiment 1.

Embodiment 4

A detailed description is set forth regarding a manufacturing method for fabricating the pixel TFTs in the pixel region and TFTs for driver circuit provided in peripheral of the pixel region (source driver, gate, driver, D/A converter circuit, digital video data time gradation processing circuit etc.) over a same substrate, in accordance with the process steps. Note that for the simplicity of the explanation, a CMOS circuit that is used as a base circuit in a shift register circuit, a buffer circuit, D/A converter circuit etc. is shown in the Figure for the driver circuit, and an n-channel TFT is shown.

Figure 24A:
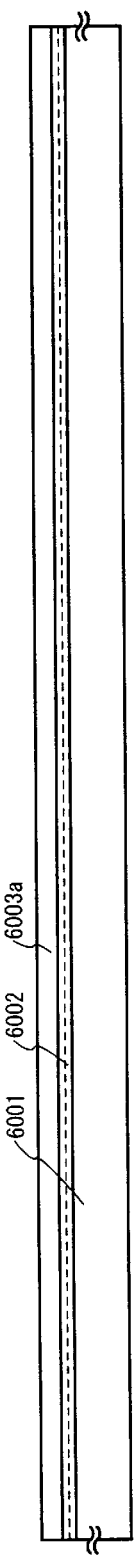
FIGS. 24A to 24D are diagrams showing a method of manufacturing the liquid crystal display device according to the present invention.

In FIG. 24A, a low alkali glass substrate or a quartz substrate may be used as the substrate 6001. In this embodiment, a low alkali glass substrate was used. Heat treatment may be performed beforehand at a temperature about 10–20° C. lower than the glass strain temperature. On the surface of the substrate 6001 on which the TFT is formed, there is formed an underlayer film 6002 comprising a silicon oxide film, silicon nitride film or silicon nitride oxide film, in order to prevent diffusion of the impurity from the substrate 6001. For example, a laminate in which a silicon nitride oxide film is formed from $SiH_4$, $NH_3$ and $N_2O$ to a thickness of 100 nm and a silicon nitride oxide film is formed from $SiH_4$ and $N_2O$ to a thickness of 200 nm, are formed by plasma CVD.

Next, a semiconductor film 6003a having an amorphous structure with a thickness of 20 to 150 nm (preferably 30 to 80 nm) is formed by a publicly known method such as plasma CVD or sputtering. In this embodiment, an amorphous silicon film was formed to a thickness of 55 nm by plasma CVD. Semiconductor films with amorphous structures include amorphous semiconductor films and microcrystalline semiconductor films, and a compound semiconductor film with an amorphous structure, such as an amorphous silicon-germanium film, may also be used. Since the underlayer film 6002 and the amorphous silicon film 6003a can be formed by the same film deposition method, they may be formed in succession. The surface contamination can be prevented by not exposing to the aerial atmosphere after forming the underlayer film, and the scattering of the characteristics in the formed TFTs and fluctuation of threshold voltage can be reduced. (FIG. 24A)

Figure 24B:
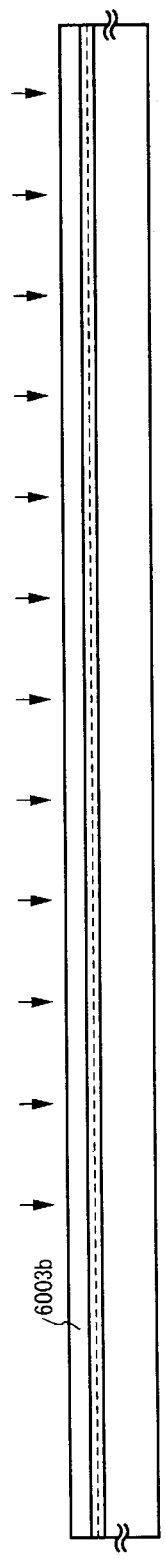

A publicly known crystallizing technique is then used to form a crystalline silicon film 6003b from the amorphous silicon film 6003a. For example, a laser crystallizing or heat crystallizing method (solid phase growth method) may be used, and here a crystalline silicon film 6003b was formed by a crystallization method using a catalyst element, according to the technique disclosed in Japanese Patent Application Laid-Open No. Hei 7-130652. Though it depends on the hydrogen content of the amorphous silicon film, heat treatment is preferably performed for about one hour at 400 to 500° C. to reduce the hydrogen content to below 5 atom % prior to crystallization. Crystallization of the amorphous silicon film causes rearrangement of the atoms to a more dense form, so that the thickness of the crystalline silicon film that is fabricated is reduced by about 1 to 15% from the thickness of the original amorphous silicon film (55 nm in this embodiment) (FIG. 24B).

Figure 24C:
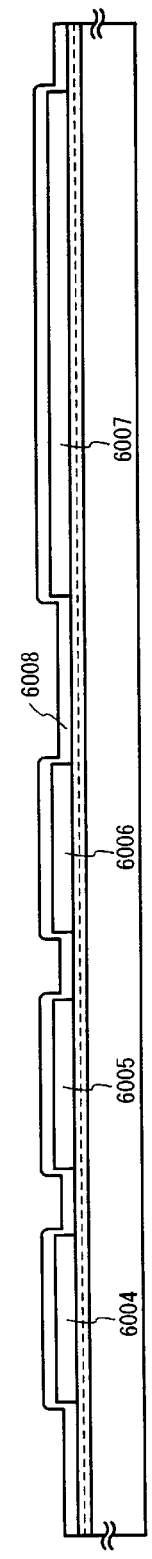

The crystalline silicon film 6003b is then separated into island shape to form island semiconductor layers 6004 to 6007. A mask layer 6008 comprising a silicon oxide film is then formed with a thickness of 50 to 100 nm by plasma CVD or sputtering (FIG. 24C).

A resist mask 6009 was provided, and boron (B) was added as a p-type impurity element at a concentration of about $1 \times 10^{16}$ to $5 \times 10^{17}$ atoms/cm$^3$ for the purpose of controlling the threshold voltage of the island semiconductor layers 6005 to 6007 forming the n-channel-type TFT. The addition of boron (B) may be accomplished by an ion doping, or it may be added simultaneously with formation of the amorphous silicon film. While the addition of boron (B) is not necessarily essential, the semiconductor layers 6010 to 6012 were preferably formed with boron (B) added thereto to keep the threshold voltage of the n-channel TFT in the prescribed range (FIG. 24D).

An n-type impurity element is selectively added to the island semiconductor layers 6010 and 6011 in order to form the LDD regions of the n-channel-type TFT of the driving circuit. Resist masks 6013 to 6016 are formed beforehand for this purpose. The n-type impurity element used may be phosphorus (P) or arsenic (As), and in this case an ion doping method was employed using phosphine ($PH_3$) for addition of phosphorus (P). The phosphorus (P) concentration of the formed impurity regions 6017, 6018 may be in the range of $2 \times 10^{16}$ to $5 \times 10^{19}$ atoms/cm$^3$. Throughout the present specification, the concentration of the n-type impurity element in the impurity regions 6017 to 6019 formed here will be represented as (n$^-$). The impurity region 6019 is a semiconductor layer for formation of the storage capacitor of the pixel region, and phosphorus (P) was added in the same concentration in this region as well (FIG. 25A).

Figure 24D:
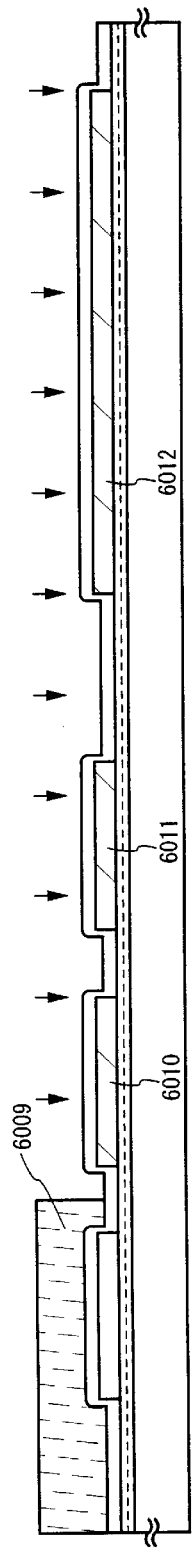
Figure 25A:
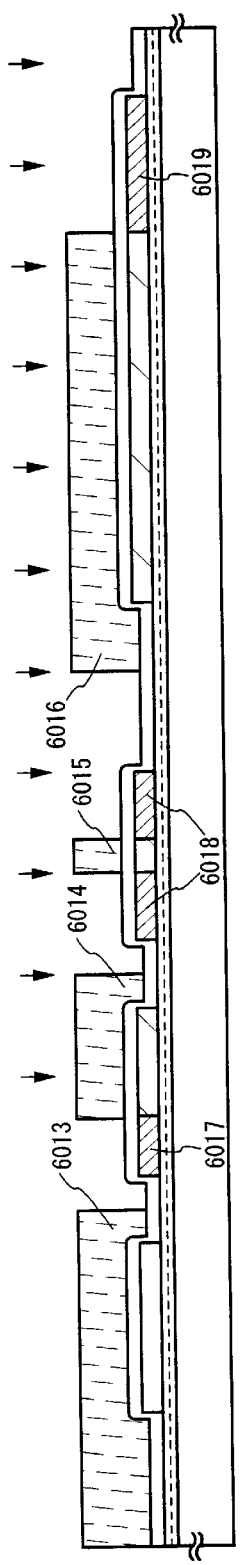
FIGS. 25A to 25D are diagrams showing a method of manufacturing the liquid crystal display device according to the present invention.

This is followed by a step of removing the mask layer 6008 by hydrofluoric acid or the like, and activating the impurity elements added in FIG. 24D and FIG. 25A. The activation may be carried out by heat treatment for 1 to 4 hours at 500 to 600° C. in a nitrogen atmosphere, or by a laser activation method. These may also be carried out in combination. In this embodiment, a laser activation method was used in which a linear beam is formed by using KrF excimer laser light (248 nm wavelength) and scanned the laser light at an oscillation frequency of 5 to 50 Hz and an energy density of 100 to 500 mJ/cm$^2$ with 80 to 98% overlap ratio, to treat the entire substrate on which the island semiconductor layers had been formed. There are no particular restrictions on the laser light irradiation conditions, and they may be appropriately set by the operator.

Figure 25B:
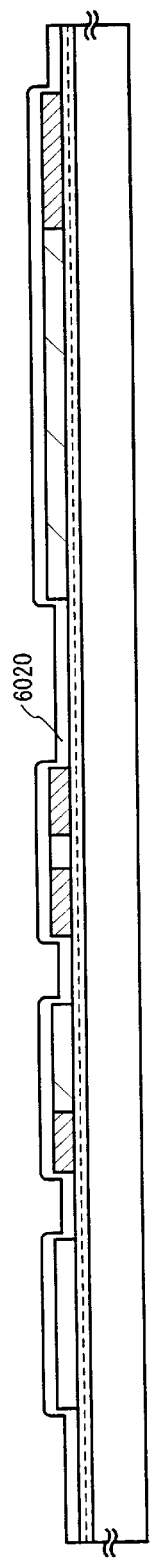

A gate insulating film 6020 is then formed with an insulating film including silicon to a thickness of 10 to 150 nm using plasma CVD or sputtering. For example, a silicon nitride oxide film is formed to a thickness of 120 nm. The gate insulating film may also be a single layer or multilayer structure of other silicon-containing insulating films (FIG. 25B).

A first conductive layer is then deposited to form the gate electrodes. This first conductive layer may be formed as a single layer, but if necessary it may also have a laminated structure of two or three layers. In this embodiment, a conductive layer (A) 6021 comprising a metal nitride film and a conductive layer (B) 6022 comprising a metal film were laminated. The conductive layer (B) 6022 may be formed of an element selected from among tantalum (Ta), titanium (Ti), molybdenum (Mo) and tungsten (W), or an alloy composed mainly of one of these elements, or an alloy film comprising a combination of these elements (typically a Mo—W alloy film or Mo—Ta alloy film), and the conductive layer (A) 6021 is formed of tantalum nitride (TaN), tungsten nitride (WN), titanium nitride (TiN) or molybdenum nitride (MoN). As alternative materials for the conductive layer (A) 6021 there may be used tungsten silicide, titanium silicide or molybdenum silicide. The conductive layer (B) may have a reduced impurity concentration for the purpose of lower resistance, and in particular the oxygen concentration was satisfactory at 30 ppm or less. For example, tungsten (W) with an oxygen concentration of 30 ppm or less allowed realization of a resistivity of 20 μΩcm or less.

Figure 25C:
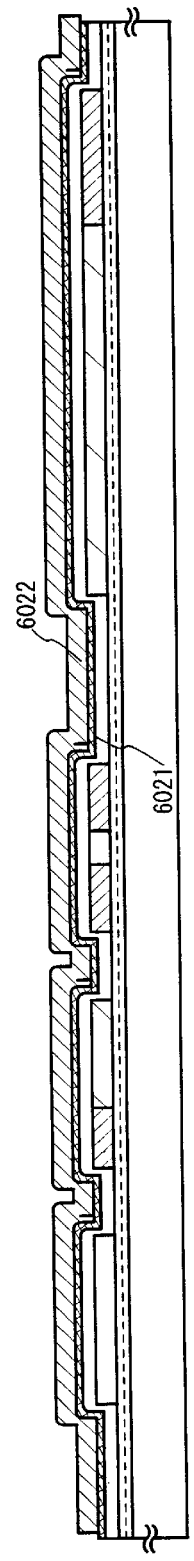

The conductive layer (A) 6021 may be 10 to 56 nm (preferably 20 to 30 nm) and the conductive layer (B) 6022 may be 100 to 400 nm (preferably 250 to 350 nm). In this embodiment, a tantalum nitride film with a thickness of 30 nm was used as the conductive layer (A) 6021 and a Ta film of 350 nm was used as the conductive layer (B) 6022, and both were formed by sputtering. In this film formation by sputtering, addition of an appropriate amount of Xe or Kr to the Ar sputtering gas can alleviate the internal stress of the formed film to thus prevent peeling of the film. Though not shown, it is effective to form a silicon film doped with phosphorus (P) to a thickness of about 2 to 20 nm under the conductive layer (A) 6021. This can improve adhesion and prevent oxidation of the conductive film formed thereover, while also preventing diffusion of trace alkali metal elements into the gate insulating film 6020 that are contained in the conductive layer (A) or conductive layer (B) (FIG. 25C).

Figure 25D:
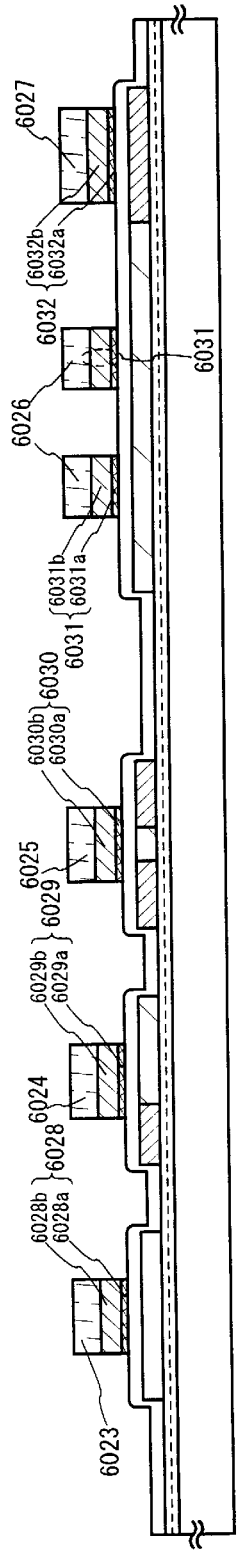

Resist masks 6023 to 6027 are then formed, and the conductive layer (A) 6021 and conductive layer (B) 6022 are etched together to form gate electrodes 6028 to 6031 and a capacitance wiring 6032. The gate electrodes 6028 to 6031 and capacitance wiring 6032 are integrally formed from 6028a to 6032a comprising conductive layer (A) and 6028b to 6032b comprising conductive layer (B). Here, the gate electrodes 6029 and 6030 formed in the driving circuit are formed so as to overlap with a portion of the impurity regions 6017 and 6018 by interposing the gate insulating layer 6020 (FIG. 25D).

This is followed by a step of adding a p-type impurity element to form the p-channel source region and drain region of the driving circuit. Here, the gate electrode 6028 is used as a mask to form impurity regions in a self-alignment manner. The region in which the n-channel TFT is formed is covered at this time with a resist mask 6033. The impurity region 6034 is formed by ion doping using diborane ($B_2H_6$). The boron (B) concentration of this region is $3 \times 10^{20}$ to $3 \times 10^{21}$ atoms/cm$^3$. Throughout this specification, the concentration of the p-type impurity element in the impurity region 6034 formed here will be represented as (p$^+$) (FIG. 26A).

Next, impurity regions functioning as a source region or drain region were formed in the n-channel TFT. Resist masks 6035 to 6037 were formed, and an n-type impurity element was added to form impurity regions 6038 to 6042. This was accomplished by ion doping using phosphine (PH$_3$), and the phosphorus (P) concentration in the regions was in the range of $1 \times 10^{20}$ to $1 \times 10^{21}$ atoms/cm$^3$. Throughout the present specification, the concentration of the n-type impurity element in the impurity regions 6038 to 6042 formed here will be represented as (n$^+$) (FIG. 26B).

The impurity regions 6038 to 6042 already contain phosphorus (P) or boron (B) added in the previous step, but since a sufficiently high concentration of phosphorus (P) is added in comparison, the influence of the phosphorus (P) or boron (B) added in the previous step may be ignored. As the concentration of phosphorus (P) added to the impurity region 6038 is ½ to ⅓ of the boron (B) concentration added in FIG. 26A, the p-type conductivity is guaranteed so that there is no effect on the properties of the TFT.

This was followed by a step of adding an n-type impurity to form an LDD region in the n-channel type TFT of the pixel region. Here, the gate electrode 6031 was used as a mask for addition of an n-type impurity element in a self-aligning manner by ion doping. The concentration of phosphorus (P) added was $1 \times 10^{16}$ to $5 \times 10^{18}$ atoms/cm$^3$, and addition of a lower concentration than the concentrations of the impurity elements added in FIGS. 25A, 26A and 26B substantially forms only impurity regions 6043 and 6044. Throughout this specification, the concentration of the n-type impurity element in these impurity regions 6043 and 6044 will be represented as (n$^{--}$) (FIG. 26C).

This was followed by a step of heat treatment for activation of the n-type or p-type impurity element added at their respective concentrations. This step can be accomplished by furnace annealing, laser annealing or rapid thermal annealing (RTA). Here, the activation step was accomplished by furnace annealing. The heat treatment is carried out in a nitrogen atmosphere containing oxygen at a concentration no greater than 1 ppm and preferably no greater than 0.1 ppm, at 400 to 800° C., typically 500 to 600° C., and for this embodiment the heat treatment was carried out at 550° C. for 4 hours. When a heat resistant material such as a quartz substrate is used for the substrate 6001, the heat treatment may be at 800° C. for one hour, and this allowed activation of the impurity. element and formation of a satisfactory junction between an impurity region added with impurity element and a channel forming region.

In the heat treatment, conductive layers (C) 6028c to 6032c are formed to a thickness of 5 to 80 nm from the surfaces of the metal films 6028b to 6032b which comprise the gate electrodes 6028 to 6031 and the capacity wiring 6032. For example, when the conductive layers (B) 6028b to 6032b comprise tungsten (W), tungsten nitride (WN) is formed, whereas when tantalum (Ta) is used, tantalum nitride (TaN) can be formed. The conductive layers (C) 6028c to 6032c may be formed in the same manner by exposing the gate electrodes 6028 to 6031 to a plasma atmosphere containing nitrogen, using either nitrogen or ammonia. Further a process for hydrogenation was also performed on the island semiconductor layer by heat treatment at 300 to 450° C. for 1 to 12 hours in an atmosphere containing 3 to 100% hydrogen. This step is for terminating the dangling bond of the semiconductor layer by thermally excited hydrogen. Plasma hydrogenation (using plasma-excited hydrogen) may also be carried out as another means for hydrogenation.

When the island semiconductor layer were fabricated by a method of crystallization from an amorphous silicon film using a catalyst element, a trace amount of the catalyst element remained in the island semiconductor layers. While the TFT can be completed even in this condition, needless to say, it is more preferable for the residual catalyst element to be eliminated at least from the channel forming region. One means used to eliminate the catalyst element was utilizing the gettering effect by phosphorus (P). The phosphorus (P) concentration necessary for gettering is on the same level as the impurity region (n$^+$) formed in FIG. 26B, and the heat treatment for the activation step carried out here allowed gettering of the catalyst element from the channel forming region of the n-channel-type TFT and p-channel-type TFT (FIG. 26D).

Figure 27A:
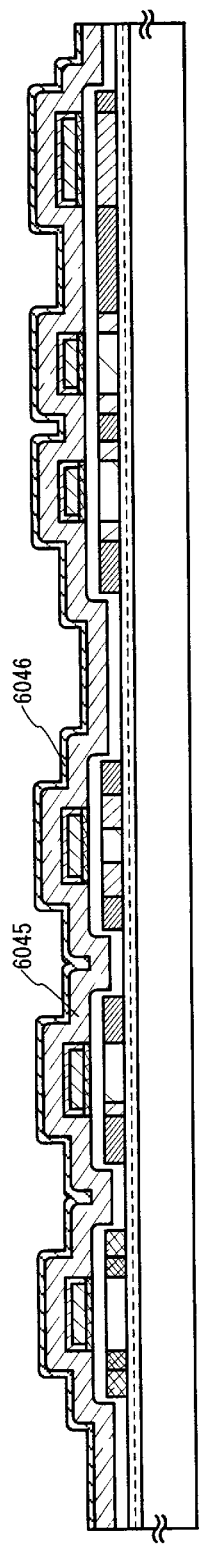
FIGS. 27A to 27C are diagrams showing a method of manufacturing the liquid crystal display device according to the present invention.
Figure 27B:
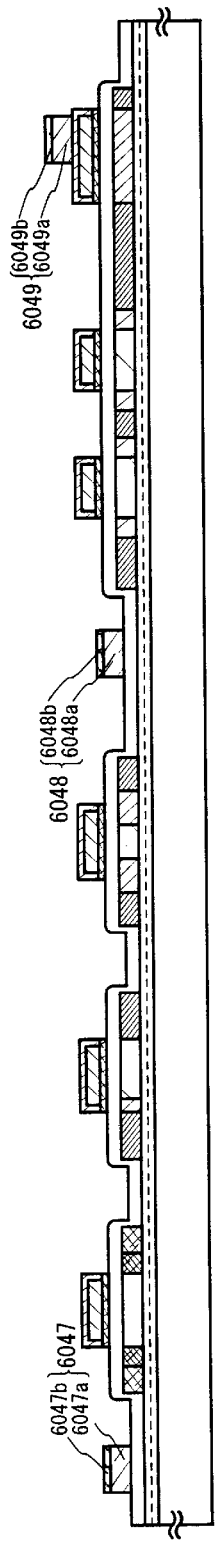

After completion of the steps of activation and hydrogenation, the second conductive layer which becomes the gate wiring is formed. This second conductive layer may be formed with a conductive layer (D) composed mainly of aluminum (A) or copper (Cu) as low resistance materials, and a conductive layer (E) made of titanium (Ti), tantalum (Ta), tungsten (W) or molybdenum (W). In this embodiment, the conductive layer (D) 6045 was formed from an aluminum (Al) film containing 0.1 to 2 wt % titanium (Ti), and the conductive layer (E) 6046 was formed from a titanium (Ti) film. The conductive layer (D) 6045 may be formed to 100 to 400 nm (preferably 250 to 350 nm), and the conductive layer (E) 6046 may be formed to 50 to 200 nm (preferably 100 to 150 nm) (FIG. 27A).

The conductive layer (E) 6046 and conductive layer (D) 6045 were etched to form gate wirings 6047, 6048 and capacitance wiring 6049 for forming the gate wiring connecting the gate electrodes. In the etching treatment, first removed from the surface of the conductive layer (E) to partway through the conductive layer (D) by dry etching using a mixed gas of $SiCl_4$, $Cl_2$ and $BCl_3$, and then wet etching was performed with a phosphoric acid-based etching solution to remove the conductive layer (D), thus allowing formation of a gate wiring while maintaining selective working with the ground layer.

A first interlayer insulating film 6050 is formed with a silicon oxide film or silicon nitride oxide film to a thickness of 500 to 1500 nm, and then contact holes are formed reaching to the source region or drain region formed in each island semiconductor layer, to form source wirings 6051 to 6054 and drain wirings 6055 to 6058. While not shown here, in this embodiment the electrode has a 3-layer laminated structure with continuous formation off a Ti film to 100 nm, a Ti-containing aluminum film to 300 nm and a Ti film to 150 nm by sputtering.

Figure 27C:
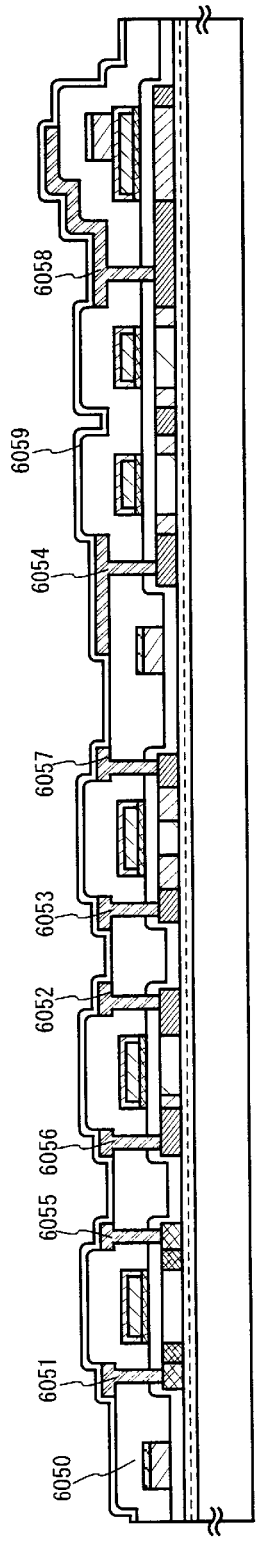

Next, a silicon nitride film, silicon oxide film or a silicon nitride oxide film is formed to a thickness of 50 to 500 nm (typically 100 to 300 nm) as a passivation film 6059. Hydrogenation treatment in this state gave favorable results for enhancement of the TFT characteristics. For example, heat treatment may be carried out for 1 to 12 hours at 300 to 450° C. in an atmosphere containing 3 to 100% hydrogen, or a similar effect may be achieved by using a plasma hydrogenation method. Note that an opening may be formed in the passivation film 6059 here at the position where the contact holes are to be formed for connection of the pixel electrodes and the drain wirings (FIG. 27C).

Figure 28:
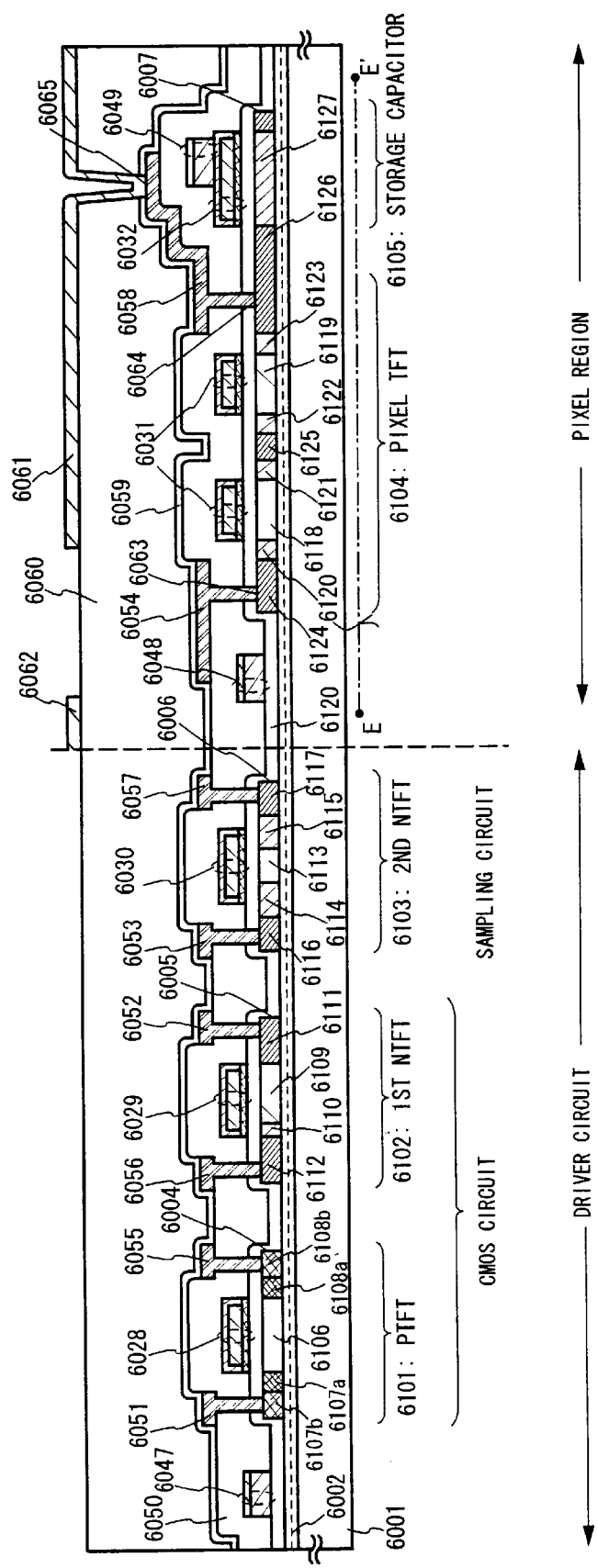
FIG. 28 is diagram showing a method of manufacturing the liquid crystal display device according to the present invention.

Next, a second interlayer insulating film 6060 made of an organic resin is formed to a thickness of 1.0 to 1.5 $\mu$m. The organic resin used may be polyimide, acrylic, polyamide, polyimideamide, BCB (benzocyclobutene) or the like. Here, a polyimide which thermally polymerizes after coating over the substrate and formed by firing at 300° C. A contact hole reaching to the drain wiring 6058 is then formed in the second interlayer insulating film 6060, and pixel electrodes 6061 and 6062 are formed. The pixel electrodes used may be of a transparent conductive film in the case of forming a transmission type liquid crystal display device, or of a metal film in the case of forming a reflective type liquid crystal display device. In this embodiment, an indium-tin oxide (ITO) film was formed by sputtering to a thickness of 100 nm in order to form a transmission type liquid crystal display device (FIG. 28).

A substrate comprising a driving circuit TFT and a pixel TFT of pixel region on the same substrate was completed in this manner. A p-channel TFT 6101, a first n-channel TFT 6102 and a second n-channel TFT 6103 were formed on the driving circuit and a pixel TFT 6104 and a storage capacitor 6105 were formed on the pixel region. Throughout the present specification, this substrate will be referred to as an active matrix substrate for convenience.

The p-channel TFT 6101 of the driving circuit, comprises a channel forming region 6106, source regions 6107a and 6107b and drain regions 6108a and 6108b in the island semiconductor layer 6004. The first n-channel TFT 6102 has a channel forming region 6109, an LDD region 6110 overlapping the gate electrode 6129 (hereunder this type of LDD region will be referred to as $L_{ov}$), a source region 6111 and a drain region 6112 in the island semiconductor layer 6005. The length of this $L_{ov}$ region in the channel length direction was 0.5 to 3.0 $\mu$m, and is preferably 1.0 to 1.5 $\mu$m. The second n-channel TFT 6103 comprises a channel forming region 6113, LDD regions 6114 and 6115, a source region 6116 and a drain region 6117 in the island semiconductor layer 6006. These LDD regions are formed of an $L_{ov}$ region and an LDD region not overlapping the gate electrode 6030 (hereunder this type of LDD region will be referred to as $L_{off}$), and the length of this $L_{off}$ region in the channel length direction is 0.3 to 2.0 $\mu$m, and preferably 0.5 to 1.5 $\mu$m. The pixel TFT 6104 comprises channel forming regions 6118 and 6119, $L_{off}$ regions 6120 to 6123 and source or drain regions 6124 to 6126 in the island semiconductor layer 6007. The length of the $L_{off}$ regions in the channel length direction is 0.5 to 3.0 $\mu$m, and preferably 1.5 to 2.5 $\mu$m. A storage capacitor 6105 is formed from: capacitance wirings 6032 and 6049; an insulating film formed from the same material as gate insulating film; and a semiconductor layer 6127 added with impurity element imparting n-type which is connected to drain region 6126 of pixel TFT 6104. In FIG. 28 the pixel TFT 6104 has a double gate structure, but it may also have a single gate structure, and there is no problem with a multi-gate structure provided with multiple gate electrodes.

Thus, the present invention optimizes the structures of the TFTs of each circuit in accordance with the specifications required for the pixel TFT and driving circuit, thus allowing the operating performance and reliability of the semiconductor device to be improved. In addition, formation of the gate electrodes with a heat resistant conductive material enabled to facilitate activation of the LDD regions and source and drain regions, and formation of the gate wirings with low resistance materials adequately reduce wiring resistance. This allows application to display devices having display areas (screen sizes) in the class of 4 inches and larger.

Embodiment 5

Figure 29:
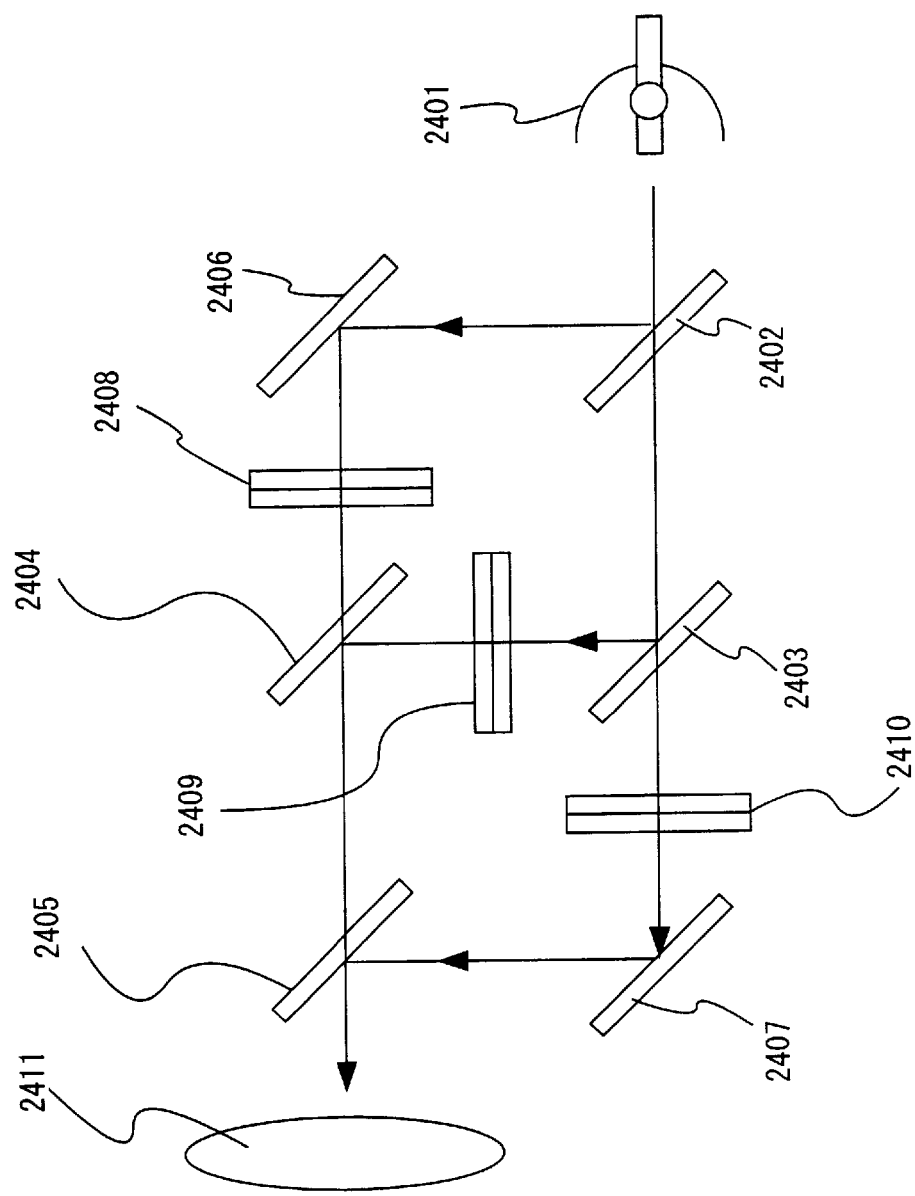
FIG. 29 is a schematic structure diagram of a three-stage projector using the liquid crystal display device according to the present invention.

The liquid crystal display device of the present invention explained above may be used also for a three-plate type projector as shown in FIG. 29.

In FIG. 29: the reference numeral 2401 denotes a white light source; 2402 to 2405, dichroic mirrors; 2406 and 2407, total reflection mirrors; 2408 to 2410, liquid crystal displays of the present invention; and 2411, a projector lens.

Embodiment 6

Figure 30:
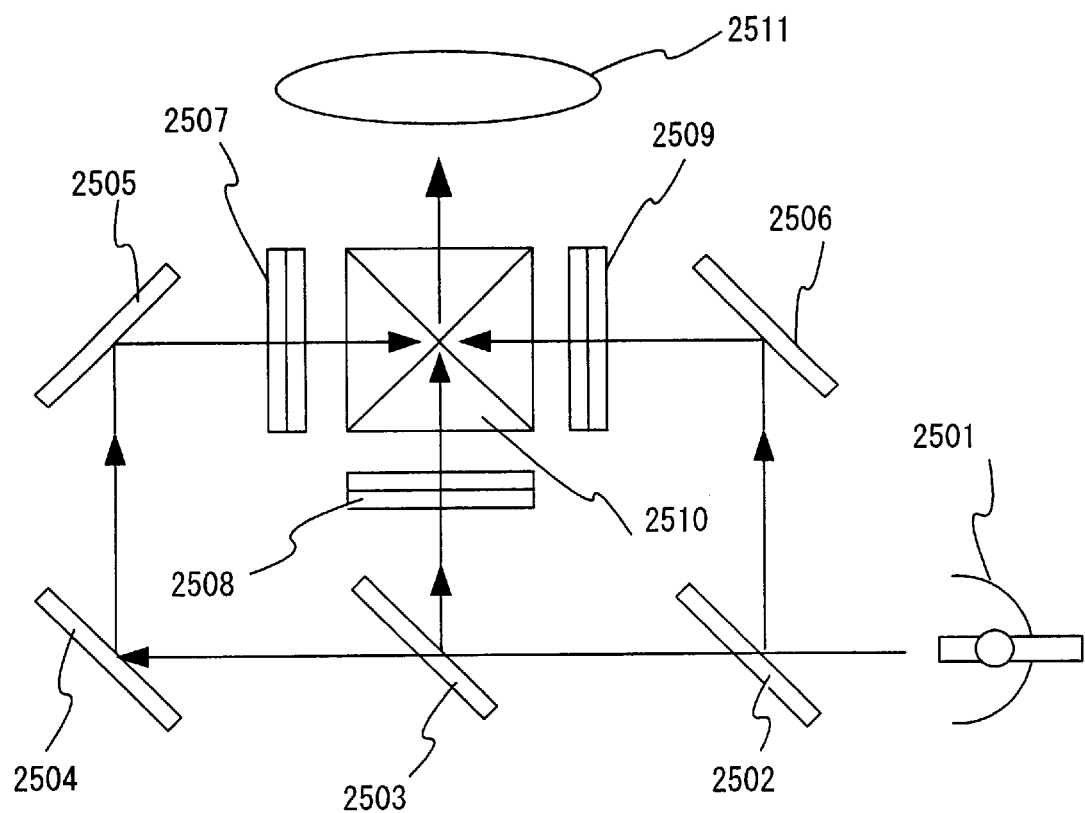
FIG. 30 is a schematic structure diagram of a three-stage projector using the liquid crystal display device according to the present invention.

The liquid crystal display device of the present invention explained above may be used also for a three-plate type projector as shown in FIG. 30.

In FIG. 30: the reference numeral 2501 denotes a white light source; 2502 and 2503, dichroic mirrors; 2504 to 2506, total reflection mirrors; 2507 to 2509, liquid crystal display devices of the present invention; 2510, dichroic prism; and 2511, projection lens.

Embodiment 7

Figure 31:
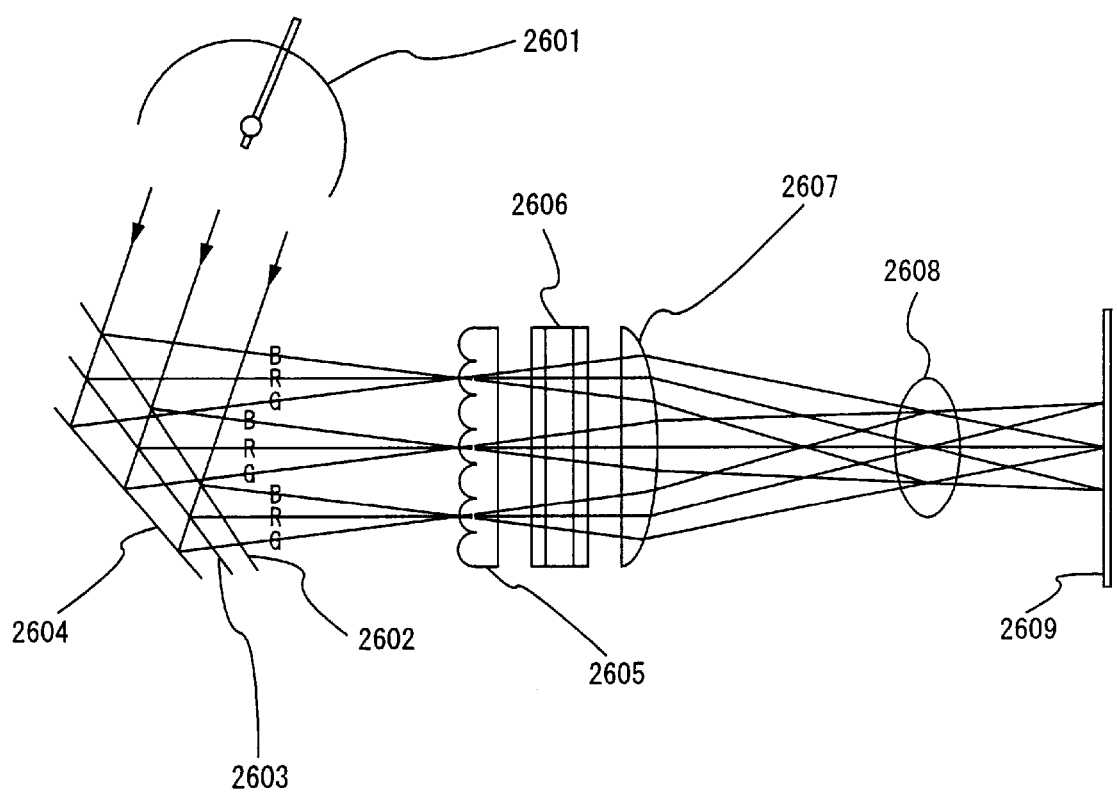
FIG. 31 is a schematic structure diagram of a three-stage projector using the liquid crystal display device according to the present invention.

Further, the liquid crystal display device of the present invention explained above may be used also for a single-plate type projector as shown in FIG. 31.

In FIG. 31: the reference numeral 2601 denotes a white light source comprising a lamp and a reflector; 2602, 2603 and 2604, dichroic mirrors which selectively reflect the rays in the wavelength range of blue, red and green respectively; 2605, a micro lens array which comprises a plurality of micro lenses; 2606, liquid crystal display devices of the present invention; 2607, condensing lens; 2608, projection lens; and 2609, screen.

Embodiment 8

Among the projectors in the Embodiments 5 through 7, there are a rear projector and a front projector depending on its projecting method.

Figure 32A:
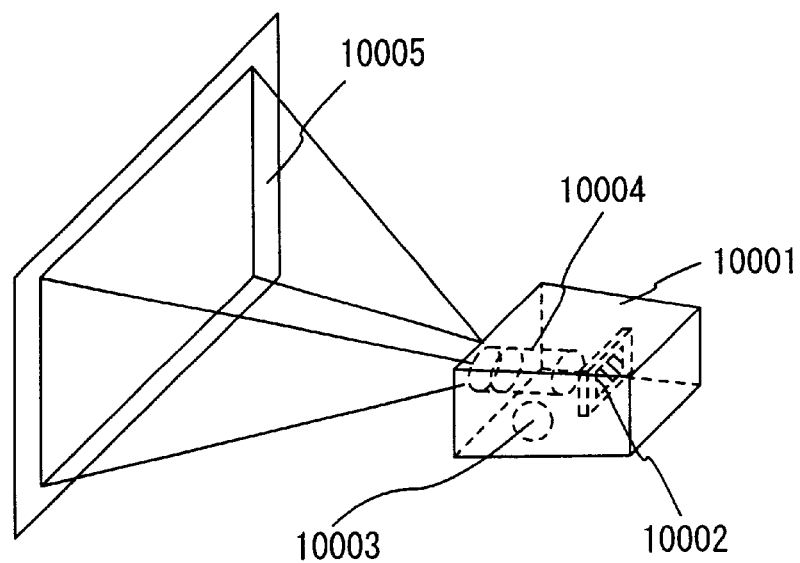
FIGS. 32A and 32B are schematic structure diagrams of a front projector and a rear projector using the liquid crystal display device according to the present invention.

FIG. 32A shows the front type projector comprising a main body 10001, a liquid crystal display 10002 of the present invention, a light source 10003, an optical system 10004 and a screen 10005. It is noted that although FIG. 32A shows the front projector in which one liquid crystal display is built in, a front type projector of higher resolution and higher definition may be realized by combining three liquid crystal displays (corresponding to light of R, G and B, respectively).

Figure 32B:
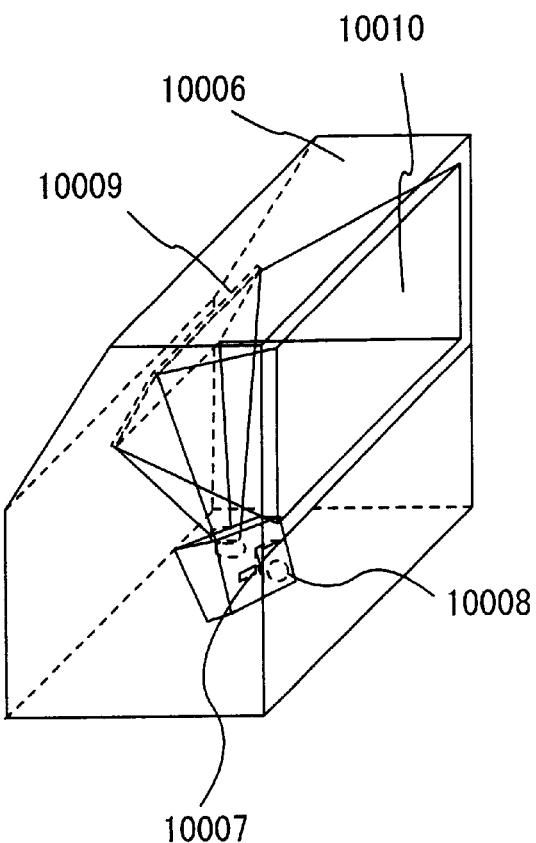

FIG. 32B shows the rear type projector comprising a main body 10006, a liquid crystal display 10007 of the present invention, a light source 10008, a reflector 10009 and a screen 10010. FIG. 32B shows the rear projector in which three liquid crystal displays are built in (corresponding to light of R, G and B, respectively).

Embodiment 9

An example in which the liquid crystal display in the present invention is used for a goggle type display will be explained in the present embodiment.

Figure 33:
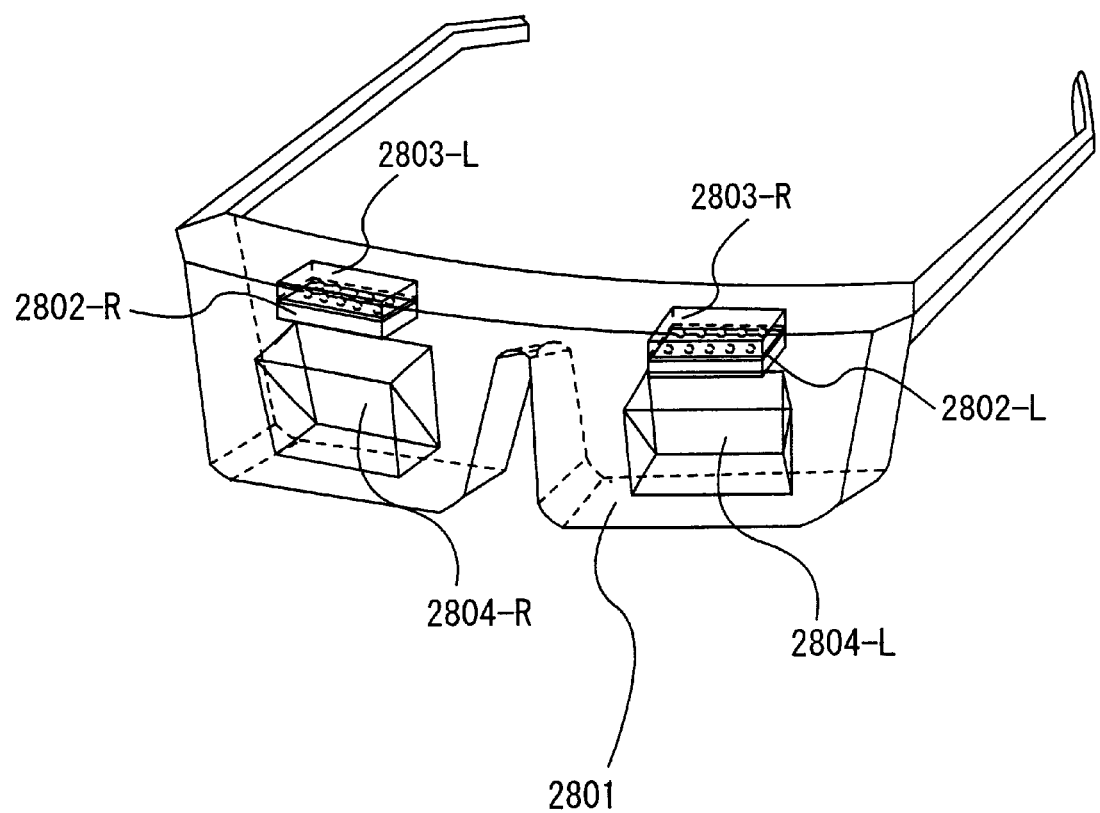
FIG. 33 is a schematic structure diagram of a goggle type display using the liquid crystal display device according to the present invention.

In FIG. 33, the reference numeral 2801 denotes a main body of the goggle type display; 2802-R and 2802-L, the inventive liquid crystal displays; 2803-R and 2803-L, LED back lights; and 2804-R and 2804-L, optical elements.

Embodiment 10

The examples of electronic devices incorporating the active matrix type display device of the present invention as a display medium are given.

The following can be given as examples of this type of electronic devices: video cameras; digital cameras; projectors (rear type or front type); head mounted display (goggle type display); car navigation systems; personal computers; and portable information terminals (such as mobile computers, portable telephones and electronic notebook). Some examples of these are shown in FIGS. 34A to 34F.

Figure 34A:
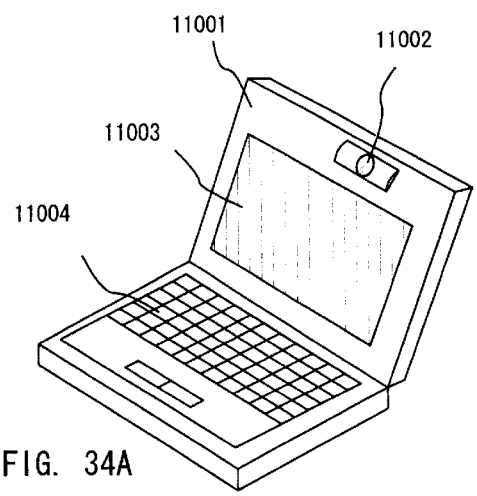
FIGS. 34A to 34F, are examples of electronic equipment using the liquid crystal display device according to the present invention.

FIG. 34A is a personal computer, and comprises a main body 11001, an image input section 11002, a liquid crystal display device of the present invention 11003, and a keyboard 2004.

Figure 34B:
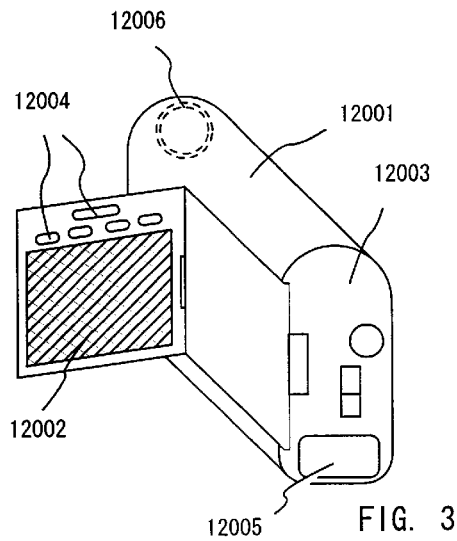

FIG. 34B is a video camera, and comprises a main body 12001, a liquid crystal display device of the present invention 12002; a voice input section 12003, operation switches 12004, a battery 12005, and an image receiving section 12006 etc.

Figure 34C:
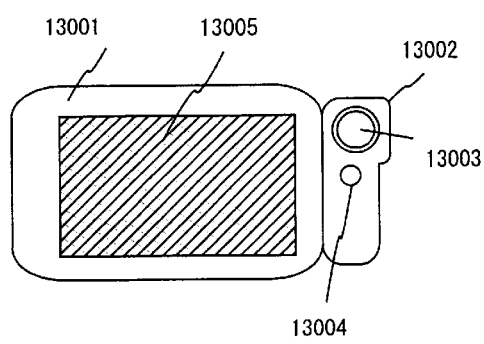

FIG. 34C is a mobile computer and comprises: a main body 13001; a camera section 13002; an image receiving section 13003; operation switches 13004; and a liquid crystal display device of the present invention 13005.

Figure 34D:
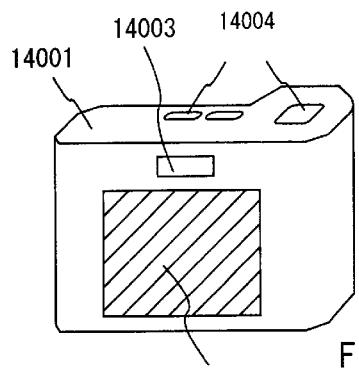

FIG. 34D is a digital camera and comprises: a main body 14001; a liquid crystal display device of the present invention 14002, a view finder section 14003; operation switches 14004; and an image receiving section (not shown in the figure).

Figure 34E:
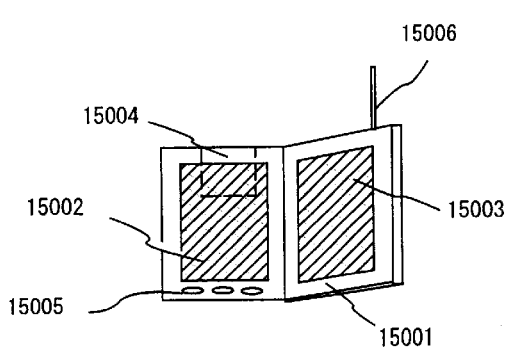

FIG. 34E is a portable book (electronic book) and comprises: a main body 15001; liquid crystal display devices of the present invention 15002 and 15003; a recording medium 15004; operation switches 15005; and an antenna.

Figure 34F:
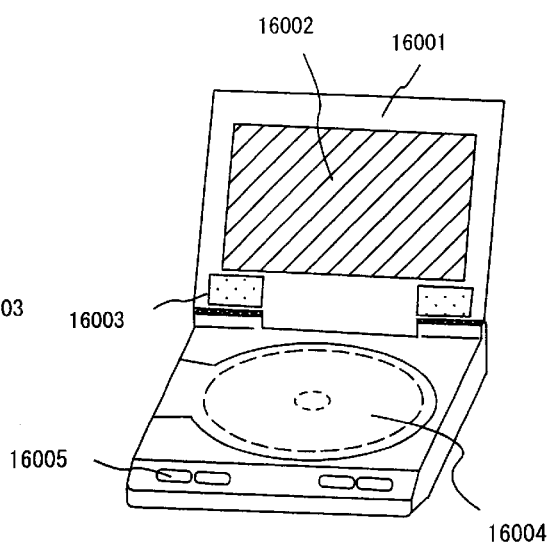

FIG. 34F is a player that uses a recording medium on which a program is recorded (hereinafter referred to as a recording medium), and comprises: a main body 16001, a liquid crystal display device 16002, a speaker section 16003, a recording medium 16004, and operation switches 16005 etc. Note that music appreciation, film appreciation, games, and the use of the Internet can be performed with this device using a DVD (digital versatile disk), a CD, etc., as a recording medium.

As described above, the applicable range of the liquid crystal display device of the present invention is very large, and it is possible to apply to electronic devices of various areas.

Embodiment 11

In addition to TN liquid crystals, it is possible to use various kinds of liquid crystals for the above stated liquid crystal display device of the present invention. For example, it is possible to use the liquid crystals published in any of the following papers: Furue, H. et al, "Characteristics and Driving Scheme of Polymer-Stabilized Monostable FLCD Exhibiting Fast Response Time and High Contrast Ratio with Gray-Scale Capability", SID, 1998; Yoshida, T. et al, "A Full-Color Thresholdless Antiferroelectric LCD Exhibiting Wide Viewing Angle with Fast Response Time", SID Digest, 814, 1997, Inui, S. et al, "Thresholdless Antiferroelectricity in Liquid Crystals and its Application to Displays", J. Mater. Chem., 6(4), 1996, p. 671–3; and disclosed in U.S. Pat. No. 5,594,569.

A liquid crystal which exhibits an anti-ferroelectric phase in a certain temperature range is called an anti-ferroelectric liquid crystal. There are mixed liquid crystals, which have an anti-ferroelectric . liquid crystal, which show electro-optical response characteristics in which the transmittance continuously changes in response to the electric field, and are called thresholdless antiferroelectric mixed liquid crystals. There are thresholdless antiferroelectric mixed liquid crystals that show so-called V-type electro-optical response characteristics, and some have been shown to, have a driver voltage of approximately ±2.5 V (when the cell thickness is between 1 $\mu$m and 2 $\mu$m).

Figure 35:
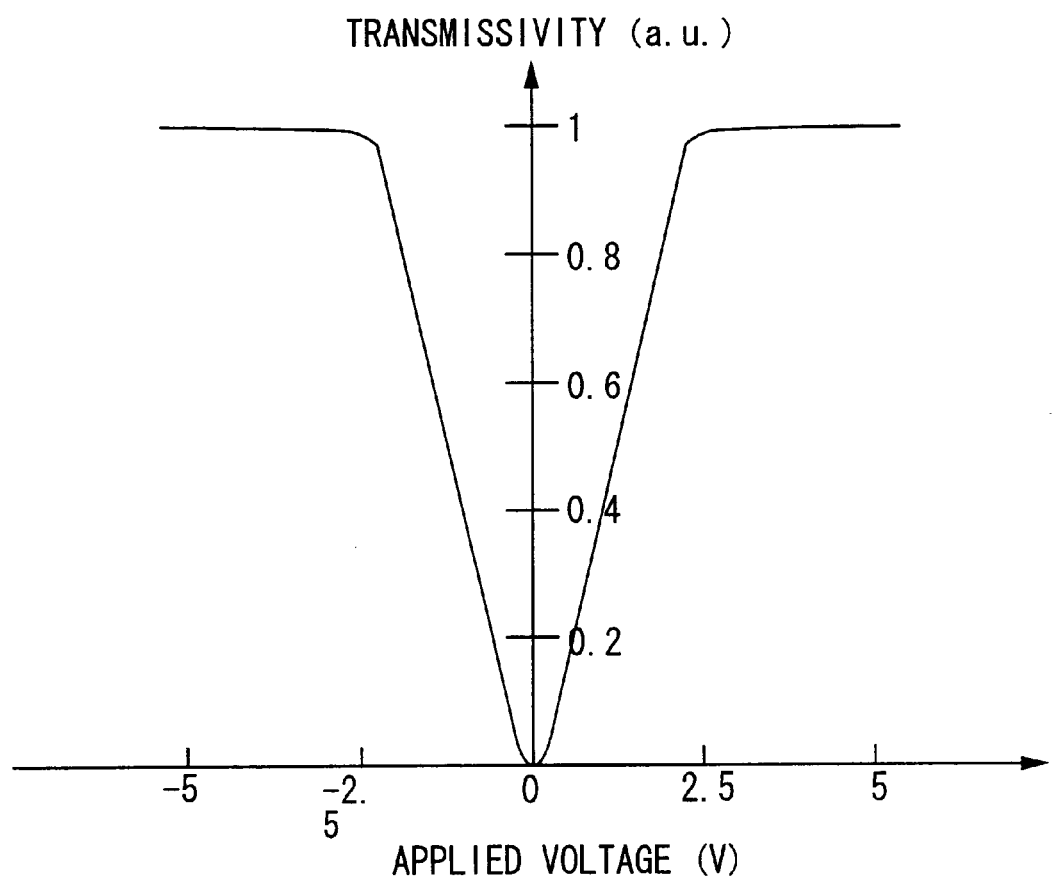
FIG. 35 is a graph showing the electro-optical characteristics of a thresholdless anti-ferroelectric compound liquid crystal.

An example showing the characteristics of the voltage applied to a thresholdless antiferroelectric mixed liquid crystal showing so-called V-type electro-optical response characteristics vs. the optical transmissivity is shown in FIG. 35. The vertical axis of the graph shown in FIG. 35 is the transmissivity (in arbitrary units), and the horizontal axis is the applied voltage. Note that the transmission axis of the polarizing plate on the incidence side is set nearly in agreement with the rubbing direction of the liquid crystal display device, and nearly parallel to the direction normal to the smectic. layer of the thresholdless antiferroelectric mixed liquid crystal. Further, the transmission axis of the polarizing plate on the outgoing side is set nearly perpendicular (crossed Nichols) to the transmission axis of the polarizing plate on the incidence side.

As shown in FIG. 35, it is apparent that if this type of thresholdless antiferroelectric mixed liquid crystal is used, it is possible to have a low voltage drive and a gradation display.

Furthermore, the output voltage of a D/A converter circuit can be reduced in cases using a liquid crystal display device having a digital driver with this type of low voltage driven thresholdless antiferroelectric mixed liquid crystal, and therefore the operation power source voltage for the D/A converter circuit can be lowered, and the operation power source voltage of the driver can be reduced. Consequently, a low power consumption, high reliability liquid crystal display device can be realized.

Thus, the use of this kind of low voltage driven thresholdless antiferroelectric mixed liquid crystal is also effective in cases using TFTs having a relatively small LDD (low concentration impurity region) region width (for example, from 0 nm to 500 nm, or from 0 nm to 200 nm).

Further, the spontaneous polarization of a thresholdless antiferroelectric mixed liquid crystal is large in general, and the dielectric constant of the liquid crystal itself is high. Thus a pixel needs-a relatively large retention capacitor when a thresholdless antiferroelectric mixed liquid crystal is used for a liquid crystal display device. Therefore it is desirable to use a thresholdless antiferroelectric mixed liquid crystal that has a small spontaneous polarization.

Note that by using this type of thresholdless antiferroelectric mixed liquid crystal in the liquid crystal display devices of the present invention, a low drive voltage can be realized, so low power consumption can also be realized.

Furthermore, provided a liquid crystal having electro-optical characteristics like those shown in FIG. 35, any type of liquid crystal can be used as the display medium of the liquid crystal display device of the present invention.

Embodiment 12

An EL (electro-luminescence) display device is described in the present embodiment as an embodiment of an active matrix display device of the present invention.

Figure 36A:
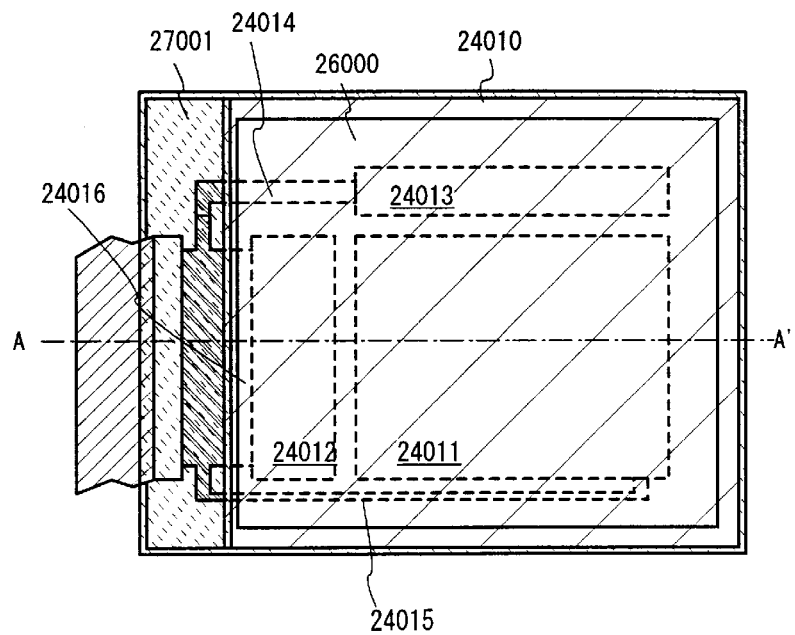
FIGS. 36A and 36B are diagrams showing a structure of an EL display device of embodiment 12 in accordance with the present invention.

FIG. 36A is a top view of an EL display device according to this embodiment. In FIG. 36A, reference numeral 24010 denotes a substrate; 24011, a pixel portion; 24012, a source side driver circuit; and 24013, a gate side driver circuit. Each of the driver circuits reach an FPC 24017 through wirings 24014 to 24016, and further connected to external equipment.

Figure 36B:
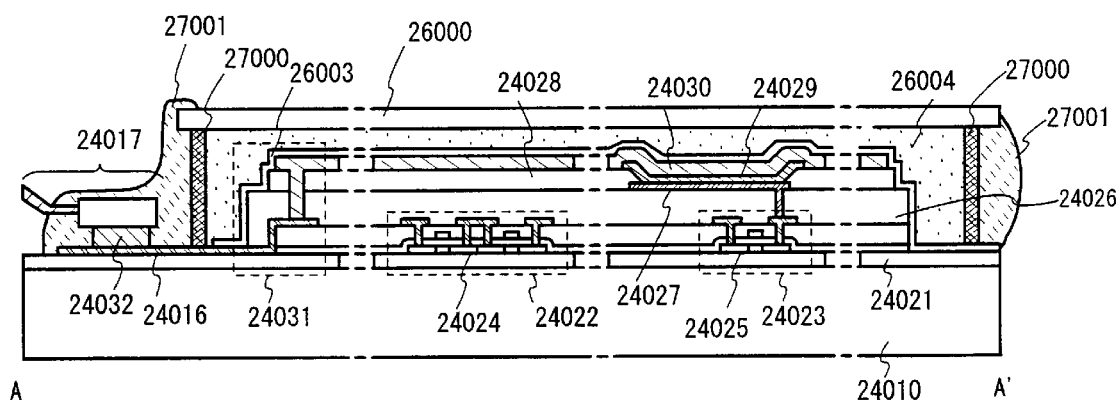

FIG. 36B shows a cross section of the EL display device according to this embodiment. A cover member 26000, a sealing material 27000 and a sealant (second sealing material) 27001 are arranged so as to enclose, at least, the pixel portion, preferably, the driver circuits and the pixel portion.

A driver circuit TFT (note that a CMOS circuit having a combination of an N channel TFT and a P channel TFT is shown here) 24022 and a pixel TFT (note that only a TFT for controlling the current flowing to an EL element is shown here) 24023 are formed over the substrate 24010 and a base film 24021.

Upon completion of the driver circuit TFT 24022 and the pixel region TFT 24023, a pixel electrode 24027 made of a transparent conductive film and electrically connected to a drain of the pixel portion TFT 24023 is formed over an interlayer insulating film (leveling film) 24026 Fade of a resin material. A compound of indium oxide and tin oxide (called ITO) or a compound of indium oxide and zinc oxide can be used as the transparent conductive film. After forming the pixel electrode 24027, an insulating film 24028 is formed and an opening section is formed on the pixel electrode 24027.

An EL layer 24029 is next formed. The EL layer 24029 may have a laminate structure in which known EL materials (hole injection layer, hole transport layer, light emitting layer, electron transport layer, or electron injection layer) are freely combined, or may have a single layer structure. Known techniques may be used in forming either structure. EL materials are divided into small molecular materials and polymer materials. The evaporation method is used for the small molecular materials while a simple method such as spin coating, printing method and ink jet method may be used for the polymer materials.

In this embodiment, the evaporation is employed with the use of a shadow mask to form the EL layer. The shadow mask is used to form a light emitting layer capable of emitting light different in wavelength for each pixel (red-colored light emitting layer, green-colored light emitting layer and blue-colored light emitting layer), so that color display is obtained. There are other color display systems, such as a system using in combination a color conversion layer (CCM) and a color filter, and a system using in combination a white-light emitting layer and a color filter. Any of these systems may be employed. Needless to say, the EL display device may be of single-colored light emission.

After forming the EL layer 24029, a cathode 24030 is formed thereon. It is preferable to remove as much as possible the moisture and oxygen present in the interface between the cathode 24030 and the EL layer 24029. Measures such as depositing the EL layer 24029 and the cathode 24030 sequentially in vacuum, or forming the EL layer 24029 in an inert atmosphere and then forming the cathode 24030 without exposing it to the air, are needed. The present embodiment enabled such deposition by employing a multi-chamber deposition system (cluster tool system).

In this embodiment a lamination structure consisting of a LiF (lithium fluoride) film and an Al (aluminum) film is used as the cathode 24030. Specifically, a LiF (lithium fluoride) film with a thickness of 1 nm is formed on the EL layer 24029 by evaporation and an aluminum film with a thickness of 300 nm is formed thereon. Needless to say, a MgAg electrode, which is a known cathode material, may used. The cathode 24030 is then connected to the wiring 24016 in a region denoted by 24031. The wiring 24016 is a power supply line for providing the cathode 24030 with a preset voltage, and is connected to the FPC 24017 through a conductive paste material 24032.

In order to electrically connect the cathode 24030 to the wiring 24016 in the region denoted by 24031, contact holes have to lbe formed in the interlayer insulating film 24026 and the insulating film 24028. These holes may be formed in etching the interlayer insulating film 24026 (in forming a contact hole for pixel electrode) and in etching the insulating film 24028 (in forming the opening prior to the formation of the EL layer). Alternatively, the contact holes may be formed by etching at once both the insulating film 24028 and the interlayer insulating film 24026 when the insulating film 24028 is to be etched. In this case, an excellent shape may be obtained for the contact holes if the interlayer insulating film 24026 and the insulating film 24028 are made of the same resin material.

A passivation film 26003, a filling material 26004 and the cover member 26000 are formed to cover the surface of the thus formed EL element.

Further, the sealing material 27000 is arranged in between the cover member 26000 and the substrate 24010, and the sealant (secdnd sealing material) 27001 is formed outside the sealing material 27000 so that the EL element portion is enclosed.

At this point, the filling material 26004 serves also as an adhesive for adhering the cover member 26000. A material usable as the filling material 26004 is PVC (polyvinyl chloride), epoxy resin, silicone resin, PVB (polyvinyl butyral) or EVA (ethylene vinyl acetate). Providing a drying agent inside the filling material 26004 is preferable, since moisture-absorbing effect can be mnaintained.

The filling material 26004 may contain a spacer therein. The spacer may be made of a granular substance such as BaO, giving the spacer itself moisture-absorbing property.

In case of providing a spacer, the passivation film 26003 can release the spacer pressure. A resin film for releasing the spacer pressure may be formed separately from the passivaton film.

Examples of the usable cover member 26000 include a glass plate, an aluminum plate, a stainless steel plate, an FRP (fiberglass-reinforced plastics) plate, a PVF (polyvinyl fluoride) film, a Mylar™ film, a polyester film and an acrylic film. In case of using PVB or EVA for the filling material 26004, preferable cover member is a sheet having a structure in which an aluminum foil of several tens gm in thickness is sandwiched between PVF films or Mylar™ films.

Note that light transmitting property is required for the cover member 26000 depending on the direction of light emitted from the EL element (light emission direction).

The wiring 24016 is electrically connected to the FPC 24017 passing through the clearance defined by the substrate 24010 and by the sealing material 27000 and the sealant 27001. Though explanation here is made, on the wiring 24016, the rest of the wirings, namely, wirings 24014, 24015 similarly pass under the sealing material 27000 and the sealant 27001 to be electrically, connected to the FPC 24017.

Embodiment 13

Figure 37A:
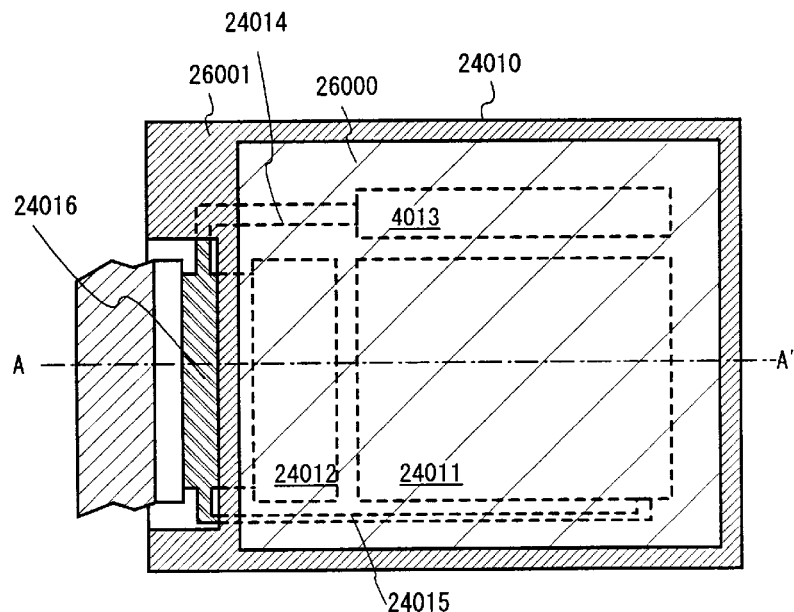
FIGS. 37A and 37B are diagrams showing the structure of the EL display device of embodiment 13 in accordance with the present invention.
Figure 37B:
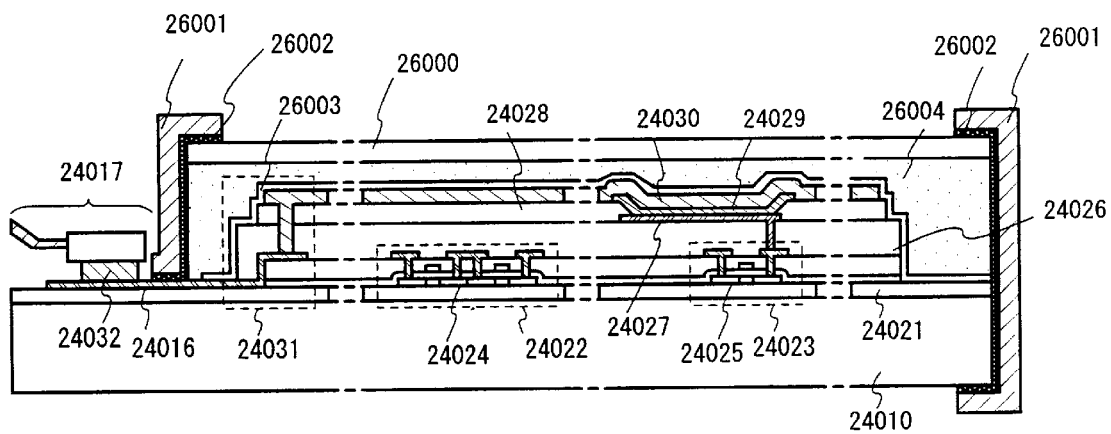

A description given in this embodiment with reference to FIGS. 37A and 37B is about an example of manufacturing an EL display device different in constitution from the one in embodiment 12. Reference numerals identical to the ones in FIGS. 36A and 36B designate the same parts, so that explanation thereof is omitted.

FIG. 37A is a top view of an EL display device according to this embodiment, and FIG. 37B shows a cross sectional view taken along the line A–A' in FIG. 37A.

The procedure here follows the description in Embodiment 12 up through the is formation of the passivation film 26003 covering the surface of the EL element.

The filling material 26004 is arranged so as to further cover the EL element. This filling material 26004 serves also as an adhesive for adhering the cover member 26000. A material usable as the filling material 26004 is PVC (polyvinyl chloride), epoxy resin, silicone resin, PVB (polyvinyl butyral) or EVA (ethylene vinyl acetate). Providing a drying agent inside the filling material 26004 is preferable, for moisture-absorbing effect can be maintained.

The filling material 26004 may contain a spacer therein. The spacer may be made of a granular substance such as BaO, giving the spacer itself moisture-absorbing property.

In case of providing the spacer, the passivation film 26003 can release the spacer pressure. A resin film for releasing the spacer pressure may be formed separately from the passivaton film.

Example of the usable cover member 26000 include a glass plate, an aluminum plate, a stainless steel plate, an FRP (fiberglass-reinforced plastics) plate, a PVF (polyvinyl fluoride) film, a Mylar™ film, a polyester film and an acrylic film. If PVB or EVA is used for the filling material 26004, preferable cover member is a sheet having a structure in which an aluminum foil several tens pm in thickness is sandwiched between PVF films or Mylar™ films.

Depending on the direction of light emitted from the EL element (light emission direction), light-transmitting property is required for the cover member 26000.

After adhering the cover member 26000 utilizing the filling material 26004, a frame member 26001 is attached so as to cover the side faces (exposed faces) of the filling material 26004. The frame member 26001 is adhered with a sealing material (functioning as an adhesive) 26002. At this point, though preferably employed sealing material 26002 is an optically curable resin, a thermally curable resin may be used instead if the heat resistance of the EL layer allows. The sealing material 26002 is desirably a material that transmits less moisture and oxygen. The sealing material 26002 may additionally contains a drying agent.

The wiring 24016 is electrically connected to the FPC 24017 passing through the clearance between the sealing material 26002 and the substrate 24010. Though explanation here is made on the wiring 24016, the rest of the wirings, namely, wirings 24014, 24015 similarly pass under the sealing material 26002 to be electrically connected to the FPC 24017.

Embodiment 14

Figure 38:
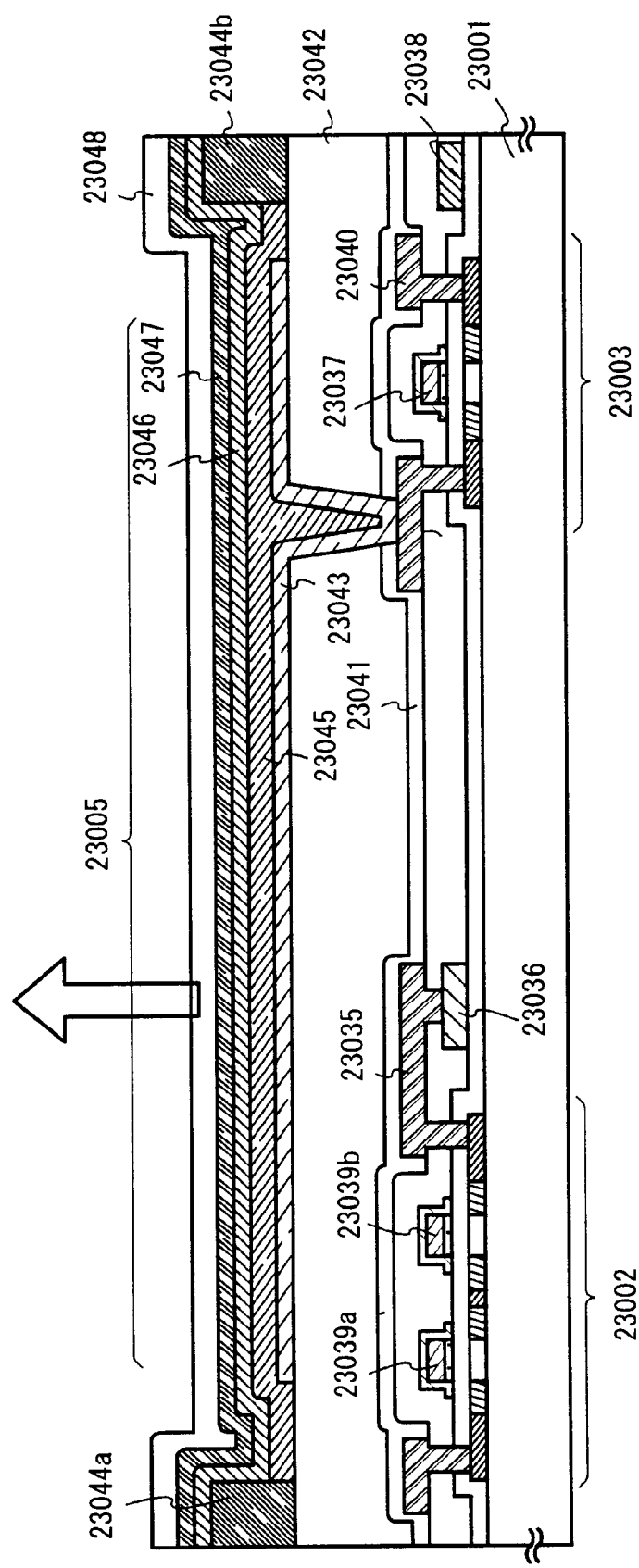
FIG. 38 is a cross sectional diagram showing the structure of the pixel region of the EL display device of embodiment 14 in accordance with the present invention.
Figure 39A:
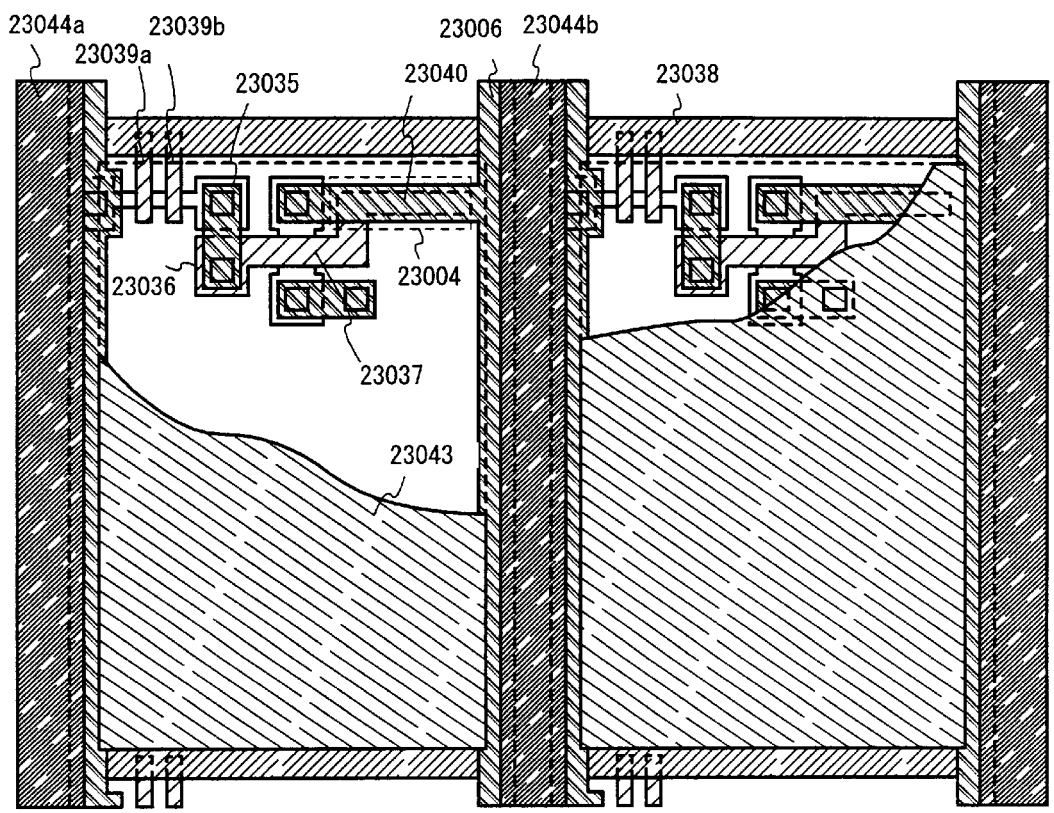
FIGS. 39A and 39B are a top view and a circuit diagram, respectively, showing the structure of the pixel region of the EL display device of embodiment 15 according in accordance with the present invention.
Figure 39B:
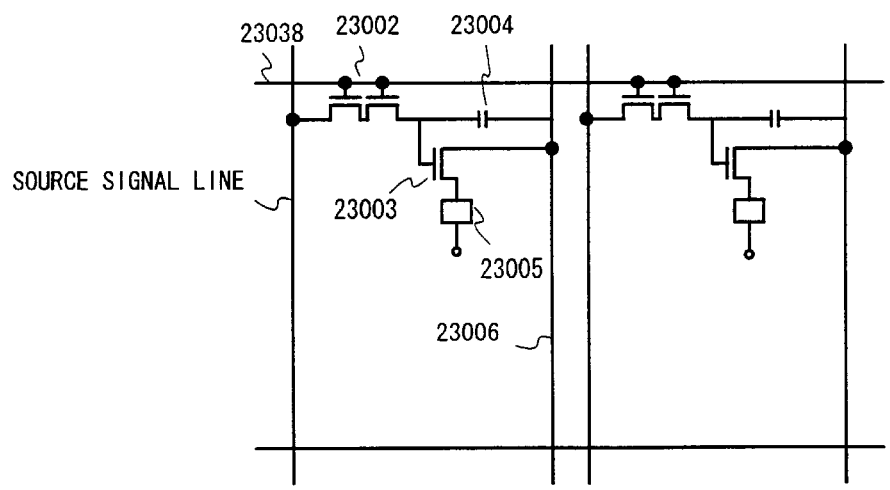

In embodiment 14, a more detailed cross sectional structure of a pixel region in an EL display panel is shown in FIG. 38, a top view structure is shown in FIG. 39A, and a circuit diagram is shown in FIG. 39B. Common reference numerals are used in FIGS. 38, 39A and 39B, and therefore they may, be referred to mutually.

In FIG. 38, a switching TFT 23002 formed on a substrate 23001 may use the TFT structure of embodiment 4, or a known TFT structure may be used. A double gate structure is used in embodiment 14. However, there are no large differences in structure or process of manufacturing, and therefore an explanation of these is omitted. Note that, by using a double gate structure, in essence the structure is two TFTs in series, which has the advantage that the off current value can be lowered. Additionally, although embodiment 14 has a double gate structure, a single gate structure may also be used, as may a triple gate structure or a multiple gate structure having a larger number of gates.

A current control TFT 23003 is formed using an NTFT. At this point, a drain wiring 23035 of the switching TFT 23002 is electrically connected to a gate electrode 23037 of the current control TFT by a wiring 23036. Further, the wiring denoted by the reference numeral 23038 is a gate wiring which electrically connects gate electrodes 23039a and 23039b of the switching TFT 23002.

The current control TFT is an element for controlling the amount of current flowing in the EL element, and therefore it is an element in which there is a great danger of degradation due to heat or due to hot carriers because there is a large current flow. Therefore, the structure of the present invention, in which on the drain side of the current control TFT an LDD region is formed to overlap a gate electrode through a gate insulating film, is extremely effective.

Furthermore, a single gate structure is shown in the figures for the current control TFT 23003 in embodiment 14, but a multiple gate structure, with a plural number of TFTs connected in series, may also be used. In addition, a structure in which a plural number of TFTs are connected in parallel, in essence dividing the channel forming region into a plural number of channel forming regions so as to perform heat radiation with a high efficiency, may also be used. This type of structure is an effective countermeasure to heat degradation.

In addition, the wiring which becomes the gate electrode 23037 of the current control TFT 23003 is the region shown by reference numeral 23004, and overlaps a drain wiring 23040 of the current control TFT 23003 through an insulating film, as shown in FIG. 39A. A capacitor is formed at this point in the region shown by reference numeral 23004. The capacitor 23004 functions as a capacitor for maintaining the voltage applied to the gate of the current control TFT 23003. Note that the drain wiring 23040 is connected to a current supply line (power source line) 23006, and a fixed voltage is applied at all times.

A first passivation film 23041 is formed on the switching TFT 23002 and the current control TFT 23003, and a leveling film 23042 formed of a resin insulating film is formed thereon. It is very important to level the step due to the TFTs using the leveling film 23042. An EL layer formed later is extremely thin, so there are cases in which luminescence is caused to be defective due to the existence of steps. Therefore, to form the EL layer with as level a surface as possible, it is preferable to perform leveling before forming a pixel electrode.

In addition, reference numeral 23043 denotes a pixel electrode (EL element cathode) from a conducting film with high reflectivity, and is electrically connected to the drain of the current control TFT 23003. It is preferable to use a low resistance conducting film for the pixel electrode 23043, such as an aluminum alloy film, a copper alloy film, and a silver alloy film, or a laminate of such films. Of course, a laminate structure with another conducting film, may also be used.

Furthermore, a luminescence layer 23045 is formed in the middle of a groove (corresponding to the pixel) formed by banks 23044a and 23044b, which are formed by insulating films (preferably resins). Note that only one pixel is shown in the figures here, but the luminescence layer may be divided to correspond to each of the colors R (red), G (green), and B (blue). A π conjugate polymer material is used as an organic EL material for the luminescence layer. Polyparaphenylene vinylenes (PPVs), polyvinyl carbazoles (PVKs), and polyfluoranes can be given as typical polymer materials.

Note that there are various types of PPV organic EL materials, and materials disclosed in Shenk, H., Becker, H., Gelsen, O., Kluge. E., Kreuder, W., and Spreitzer, H., "Polymers for Light Emitting Diodes", Euro Display Proceedings, 1999, pp. 33–7, and in Japanese Patent Application Laid-Open No. Hei 10-92567, for example, may be used.

As specific luminescence layers, cyano-polyphenylene vinylene may be used as a red light radiating luminescence-layer, polyphenylene vinylene may be used as a green light radiating luminescence layer, and polyphenylene vinylene or polyalkylphenylene may be used as a blue light radiating luminescence layer. The film thickness may be between 30 nm and 150 nm (preferably between 40 nm and 100 nm).

However, the above example is one example of the organic EL materials that can be used as luminescence layers, and it is not necessary to limit use to these materials. An EL layer (a layer for luminescence and for performing carrier motion for luminescence) may be formed by freely combining luminescence layers, charge carrier layers, and charge injection layers.

For example, embodiment 14 shows an example using polymer materials as luminescence layers, but low molecular weight organic EL materials may also be used. Further, it is possible to use inorganic materials, such as silicon carbide, etc., as charge carrier layers and charge injection layers. Known materials can be used for these organic EL materials and inorganic materials.

A laminar structure EL layer, in which a hole injection layer 23046 from PEDOT (polythiophene) or PAni (polyaniline) is formed on the luminescence layer 23045, is used in embodiment 14. An anode 23047 is then formed on the hole injection layer 23046 from a transparent conducting film. The light generated by the luminescence layer 23045 is radiated toward the upper surface (toward the top of the TFT) in the case of embodiment 14, so the anode must be transparent to light. An indium oxide and tin oxide compound, or an indium oxide and zinc oxide compound can be used for the transparent conducting film. However, because it is formed after forming the low heat resistance luminescence layer and the hole injection layer, it is preferable to use a material that can be deposited at as low a temperature as possible.

At the point where the anode 23047 is formed, an EL element 23005 is complete. Note that what is called the EL element 23005 here indicates the capacitor formed by the pixel electrode (cathode) 23043, the luminescence laver 23045, the hole injection layer 23046, and the anode 23047. As shown in FIG. 39A, the pixel electrode 23043 nearly matches the area of the pixel, and consequently the entire pixel functions as an EL device. Therefore, the luminescence usage efficiency is very high, and a bright image display is possible.

An additional second passivation film 23048 is then formed on the anode 23047 in embodiment 14. It is preferable to use a silicon nitride film or an oxidized silicon nitride film as the second passivation film 23048. The purpose of this is the isolation of the EL element and the outside, and has meaning in preventing degradation due to the oxidation of the organic EL material, and in suppressing gas emitted from the organic EL material. The reliability of the EL display can thus be raised.

The EL display panel of embodiment 14 has a pixel region from pixels structured as in FIG. 38, and has a switching TFT with sufficiently low off current value, and a current control TFT that is strong against hot carrier injection. An EL display panel which has high reliability, and in which good image display is possible, can therefore be obtained.

Embodiment 15

Figure 40:
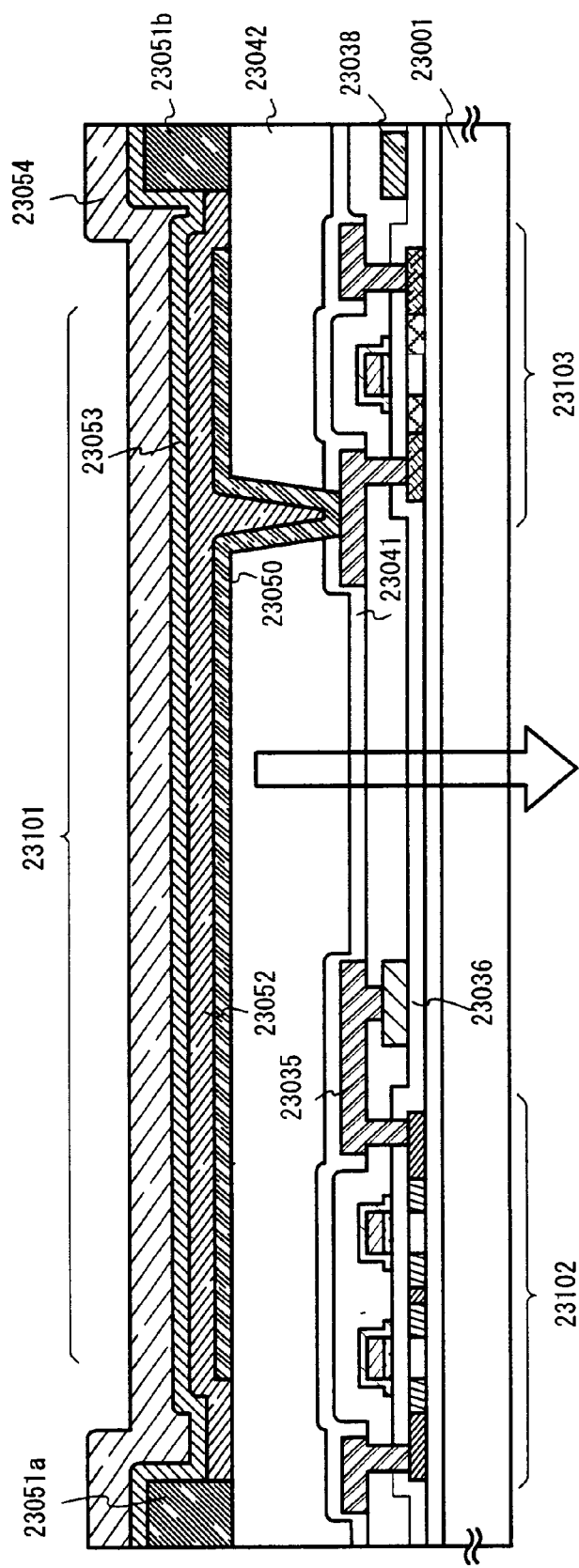
FIG. 40 is a cross sectional diagram showing the structure of the pixel region of the EL display device of embodiment 16 in accordance with the present invention.

In embodiment 15, a structure is explained in which the structure of the EL element 23005 in the pixel region shown in embodiment 14 is inverted. FIG. 40 is used in the explanation. Note that the only points of difference from the structure of FIG. 38 are the EL element portion and the current control TFT, and therefore an explanation of other portions is omitted.

A current control TFT 23103 is formed using a PTFT in FIG. 40.

A transparent conducting film is used as a pixel electrode (anode) 23050 in embodiment 15. Specifically, a conducting film made from a compound of indium oxide and zinc oxide is used. A conducting film made from a compound of indium oxide and tin oxide may, of course, also be used.

After then forming banks 23051a and 23051b from insulating films, a luminescence layer 23052 is formed from polyvinyl carbazole by solution application. An electron injection layer 23053 is formed from potassium acetylacetonate on the luminescence layer 23052, and a cathode 23054 is formed from an aluminum alloy. In this case, the cathode 23054 also functions as a passivation layer. An EL element 23101 is thus formed.

In embodiment 15, the light generated by the luminescence layer 23052 is irradiated toward the substrate on which the TFTs are formed, as shown by the arrow.

Embodiment 16

Figure 41A:
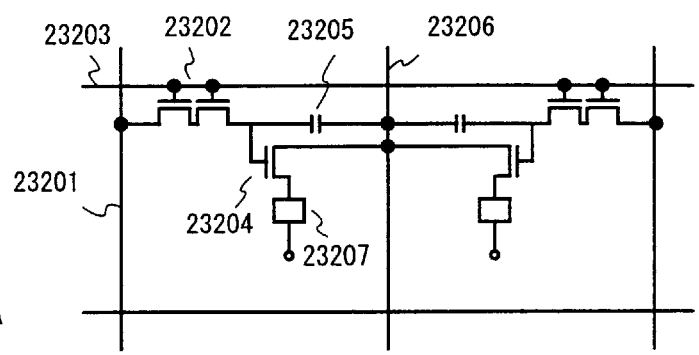
FIG. 41 is a circuit diagram showing the structure of the pixel region of the EL display device of embodiment 17 in accordance with the present invention.
Figure 41B:
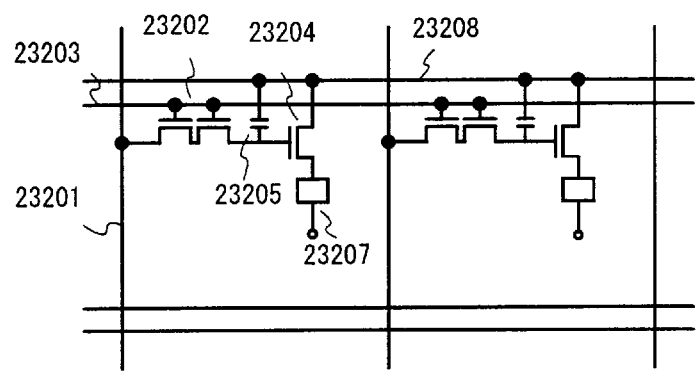
Figure 41C:
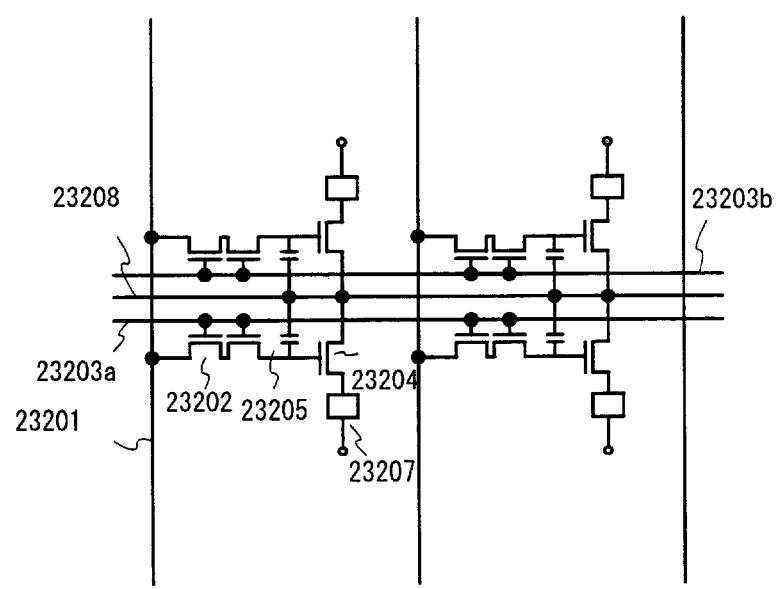

Examples of cases in which the pixel structure differs from that of the circuit diagram shown in FIG. 39 are shown in embodiment 16 by FIGS. 41A to 41C. Note that in embodiment 16, reference numeral 23201 denotes a source wiring of a switching TFT 23202, reference numeral 23203 denotes a gate wiring of the switching TFT 23202, reference numeral 23204 denotes a current control TFT, 23205 denotes a capacitor, 23206 and 23208 denote electric current supply lines, and 23207 denotes an EL element.

FIG. 41A is an example of a case in which the electric current supply line 23206 is common between two pixels. Namely, this is characterized in that the two pixels are formed in a linearly symmetrical manner with the electric current supply line 23206 as a center. In this case, the number of electric current supply lines can be reduced, and therefore the pixel region can be made even more high definition.

Further, FIG. 41B is an example of a case in which the electric current supply line 23208 is formed parallel to the gate wiring 23203. Note that in FIG. 41B, the structure is formed such that the electric current supply line 23208 and the gate wiring 23203 do not overlap, but provided that both are wirings formed on different layers, then they can be formed to overlap through an insulating film. In this case, the exclusive surface area of the electric current supply line 23208 and the gate wiring 23203 can be shared, and the pixel region can be made even more high definition.

Furthermore, FIG. 41C is characterized in that the electric current supply line 23208 and the gate wiring 23203 are formed in parallel, similar to the structure of FIG. 41B, and additionally, in that the two pixels are formed so as to have linear symmetry with the electric current supply line 23208 as a center. In addition, it is effective to form the electric current supply line 23208 so as to overlap with one of the gate wirings 23203. In this case, the number of electric current supply lines can be reduced, and therefore the pixel region can; be made even more high definition.

Embodiment 17

In FIGS. 39A and 39B shown in embodiment 16, there is a structure in which the capacitor 23004 is formed in order to store the voltage applied to the gate of the current control TFT 23003, but it is possible to omit the capacitor 23004. In the case of embodiment 11, a TFT having an LDD region formed so as to overlap with a gate electrode through a gate insulating film is used as the current control TFT 23003. A parasitic capacitance, generally referred to as a gate capacitance, is formed in the overlapping region, and this embodiment is characterized in that this parasitic capacitance is used constructively as a substitute for the capacitor 23004.

The capacitance of this parasitic capacitor changes depending upon the surface area in which the gate electrode and the LDD region overlap, and is determined by the length of the LDD region contained in the overlapping region.

Furthermore, it is also possible to similarly omit the capacitor 23205 in the structures of FIGS. 41A, 41B, and 41C shown in embodiment 16.

In accordance with the active matrix type display device of the present invention, a gradation with capabilities greater than those of the D/A converter circuit inside a digital driver, in an active matrix type display device having the digital driver can be expressed. Moreover, image deterioration such as flicker can be prevented.

What is claimed is:

1. A display device comprising:
   a pixel region having a plural number of pixel TFTs arranged in a matrix shape;
   a source driver circuit and a gate driver circuit for driving the plural number of TFTs; and
   a circuit for converting externally inputted m-bit digital video data into $2^{m-n}$ pieces of n-bit digital video data (where m and n are both positive integers greater than or equal to 2, and m>n), and for supplying the n-bit digital video data to the source driver circuit,
   wherein said $2^{m-n}$ pieces of n-bit digital data is outputted in accordance with a pattern selected randomly from a plural number of output patterns,
   wherein an image for one-frame is formed by displaying $2^{m-n}$ pieces of subframes formed by the n-bit digital data, and
   wherein the display device performs voltage gradation display and time gradation display at the same time.

2. A device according to claim 1, wherein a liquid crystal is used as a display medium.

3. A rear projector having three display devices according to claim 2.

4. A front projector having three display devices according to claim 2.

5. A single stage rear projector having one display device according to claim 2.

6. A device according to claim 1, wherein an EL is used as a display medium.

7. A goggle type display having two display devices according to claim 1.

8. A portable information terminal having a display device according to claim 1.

9. A notebook type personal computer having a display device according to claim 1.

10. A display device comprising:
    a pixel region having a plural number of pixel TFTs arranged in a matrix shape;
    a source driver circuit and a gate driver circuit for driving the plural number of TFTs; and
    a circuit for converting externally inputted m-bit digital video data into $2^{m-n}$ pieces of n-bit digital video data (where m and n are both positive integers greater than or equal to 2, and m>n), and for supplying the n-bit digital video data to the source driver circuit,
    wherein said $2^{m-n}$ pieces of n-bit digital data is outputted in accordance with a pattern selected randomly from a plural number of output patterns;
    wherein an image for one-frame is formed by displaying $2^{m-n}$ pieces of subframes formed by the n-bit digital data,
    wherein $(2^m - (2^{m-n} - 1))$ levels of display gradation can be obtained, and
    wherein the display device performs voltage gradation display and time gradation display at the same time.

11. A device according to claim 10, wherein a liquid crystal is used as a display medium.

12. A rear projector having three display devices according to claim 11.

13. A front projector having three display devices according to claim 11.

14. A single stage rear projector having one display device according to claim 11.

15. A device according to claim 10, wherein an EL is used as a display medium.

16. A goggle type display having two display devices according to claim 10.

17. A portable information terminal having a display device according to claim 10.

18. A notebook type personal computer having a display device according to claim 10.

19. A display device comprising:
- a pixel region having a plural number of pixel TFTs arranged in a matrix shape;
- a source driver circuit and a gate driver circuit for driving the plural number of TFTs; and
- a circuit for converting externally inputted m-bit digital video data into $2^{m-n}$ pieces of n-bit digital video data (where m and n are both positive integers greater than or equal to 2, and m>n), and for supplying the n-bit digital video data to the source driver circuit,
- wherein said $2^{m-n}$ pieces of n-bit digital data is outputted in accordance with a pattern selected randomly from a plural number of output patterns,
- wherein an image for one-frame is formed by displaying $2^{m-n}$ pieces of subframes formed by the n-bit digital data, and
- wherein the display device performs voltage gradation display and time gradation display at the same time.

20. A device according to claim 19, wherein a liquid crystal is used as a display medium.

21. A rear projector having three display devices according to claim 20.

22. A front projector having three display devices according to claim 20.

23. A single stage rear projector having one display device according to claim 20.

24. A device according to claim 19, wherein an EL is used as a display medium.

25. A goggle type display having two display devices according to claim 19.

26. A portable information terminal having a display device according to claim 19.

27. A notebook type personal computer having a display device according to claim 19.

28. A display device comprising:
- a pixel region having a plural number of pixel TFTs arranged in a matrix shape;
- a source driver circuit and a gate driver circuit for driving the plural number of TFTs; and
- a circuit for converting externally inputted m-bit digital video data into $2^{m-n}$ pieces of n-bit digital video data (where m and n are both positive integers greater than or equal to 2, and m>n), and for supplying the n-bit digital video data to the source driver circuit,
- wherein said $2^{m-n}$ pieces of n-bit digital data is outputted in accordance with a pattern selected randomly from a plural number of output patterns,
- wherein an image for one-frame is formed by displaying $2^{m-n}$ pieces of subframes formed by the n-bit digital data,
- wherein $(2^m - (2^{m-n} - 1))$ levels of display gradation can be obtained, and
- wherein the display device performs voltage gradation display and time gradation display at the same time.

29. A device according to claim 28, wherein a liquid crystal is used as a display medium.

30. A rear projector having three display devices according to claim 29.

31. A front projector having three display devices according to claim 29.

32. A single stage rear projector having one display device according to claim 29.

33. A device according to claim 28, wherein an EL is used as a display medium.

34. A goggle type display having two display devices according to claim 28.

35. A portable information terminal having a display device according to claim 28.

36. A notebook type personal computer having a display device according to claim 28.

* * * * *